US012288755B2

(12) United States Patent
Matsuno

(10) Patent No.: US 12,288,755 B2
(45) Date of Patent: Apr. 29, 2025

(54) THREE-DIMENSIONAL MEMORY DEVICE CONTAINING DEFORMATION RESISTANT TRENCH FILL STRUCTURE AND METHODS OF MAKING THE SAME

(71) Applicant: SANDISK TECHNOLOGIES LLC, Addison, TX (US)

(72) Inventor: Koichi Matsuno, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 462 days.

(21) Appl. No.: 17/807,266

(22) Filed: Jun. 16, 2022

(65) Prior Publication Data

US 2023/0411306 A1 Dec. 21, 2023

(51) Int. Cl.

*H01L 23/00* (2006.01)
*H10B 41/27* (2023.01)
*H10B 41/41* (2023.01)
*H10B 43/27* (2023.01)
*H10B 43/40* (2023.01)

(52) U.S. Cl.

CPC ........... *H01L 23/562* (2013.01); *H10B 41/27* (2023.02); *H10B 41/41* (2023.02); *H10B 43/27* (2023.02); *H10B 43/40* (2023.02)

(58) Field of Classification Search

None

See application file for complete search history.

(56) References Cited

U.S. PATENT DOCUMENTS 9,806,093 B2 10/2017 Toyama et al.
9,818,693 B2 11/2017 Toyama et al.
9,818,759 B2 11/2017 Kai et al.
9,985,046 B2 5/2018 Lu et al.
10,038,006 B2 7/2018 Furihata et al.
10,381,371 B2 8/2019 Ogawa et al.
10,840,260 B2 11/2020 Kai et al.
10,872,857 B1 12/2020 Otsu et al.

(Continued)

FOREIGN PATENT DOCUMENTS

WO 2020256786 A1 12/2020

OTHER PUBLICATIONS

U.S. Appl. No. 17/355,883, filed Jun. 23, 2021, SanDisk Technologies LLC.

(Continued)

*Primary Examiner* — Cory W Eskridge

(74) *Attorney, Agent, or Firm* — THE MARBURY LAW GROUP PLLC

(57) ABSTRACT

A semiconductor structure includes an alternating stack of insulating layers and electrically conductive layers, a dielectric moat fill structure that includes a nested structure including, from outside to inside, an outer dielectric liner having a first Young's modulus, an outer material layer having a second Young's modulus greater than the first Young's modulus, a dielectric fill material portion, an inner material layer having the second Young's modulus, and an inner dielectric liner having the first Young's modulus, a vertically alternating sequence of insulating plates and dielectric material plates at least partially laterally surrounded by the dielectric moat fill structure, and an interconnection via structure vertically extending the vertically alternating sequence.

13 Claims, 77 Drawing Sheets

(56) References Cited

U.S. PATENT DOCUMENTS

| | | | | |
|---|---|---|---|---|
| 10,879,264 | B1 | 12/2020 | Otsu et al. | |
| 10,903,237 | B1 | 1/2021 | Hosoda et al. | |
| 11,282,783 | B2 | 3/2022 | Otsu et al. | |
| 11,322,440 | B2 | 5/2022 | Kubo | |
| 11,342,245 | B2 | 5/2022 | Cui et al. | |
| 11,355,506 | B2 | 6/2022 | Tokita et al. | |
| 2016/0049421 | A1* | 2/2016 | Zhang | H10D 30/794 257/314 |
| 2017/0179026 | A1 | 6/2017 | Toyama et al. | |
| 2017/0179151 | A1 | 6/2017 | Kai et al. | |
| 2017/0179152 | A1 | 6/2017 | Toyama et al. | |
| 2017/0179153 | A1 | 6/2017 | Ogawa et al. | |
| 2017/0179154 | A1 | 6/2017 | Furihata et al. | |
| 2017/0358594 | A1 | 12/2017 | Lu et al. | |
| 2019/0229127 | A1* | 7/2019 | Dorhout | H10B 43/10 |
| 2021/0134826 | A1* | 5/2021 | Lu | H01L 24/89 |
| 2021/0210424 | A1 | 7/2021 | Otsu et al. | |
| 2021/0210428 | A1 | 7/2021 | Ohsawa et al. | |
| 2021/0210503 | A1 | 7/2021 | Matsuno et al. | |
| 2021/0210504 | A1 | 7/2021 | Otsuno et al. | |
| 2021/0366808 | A1 | 11/2021 | Cui et al. | |
| 2021/0366920 | A1 | 11/2021 | Tokita et al. | |
| 2021/0366924 | A1 | 11/2021 | Tokita et al. | |
| 2021/0384206 | A1 | 12/2021 | Iwai et al. | |
| 2021/0384207 | A1 | 12/2021 | Iwai et al. | |
| 2021/0391345 | A1 | 12/2021 | Otsu et al. | |
| 2022/0052067 | A1* | 2/2022 | Chun | H10B 43/40 |
| 2022/0059561 | A1* | 2/2022 | Noh | H10B 43/27 |
| 2022/0157724 | A1 | 5/2022 | Takii et al. | |

OTHER PUBLICATIONS

U.S. Appl. No. 17/376,490, filed Jul. 15, 2021, SanDisk Technologies LLC.

U.S. Appl. No. 17/516,588, filed Nov. 1, 2021, SanDisk Technologies LLC.

U.S. Appl. No. 17/806,579, filed Jun. 13, 2022, SanDisk Technologies LLC.

ISR-WO Notification of Transmittal of The International Search Report and Written Opinion of the International Searching Authority for International Patent Application No. PCT/US2023/021546, mailed Sep. 12, 2023, 9 pages.

IPRP-WO Notification Concerning Transmittal of International Preliminary Report and Written Opinion of the International Searching Authority for International Patent Application No. PCT/US2023/021546, mailed Dec. 24, 2024, 7 pages.

* cited by examiner

THREE-DIMENSIONAL MEMORY DEVICE CONTAINING DEFORMATION RESISTANT TRENCH FILL STRUCTURE AND METHODS OF MAKING THE SAME

FIELD

The present disclosure relates generally to the field of semiconductor devices and specifically to a three-dimensional memory device including deformation resistant trench fill structures and methods of making the same.

BACKGROUND

Three-dimensional memory devices may include memory stack structures. The memory stack structures overlie a substrate and extend through an alternating stack of insulating layers and electrically conductive layers. The memory stack structures include vertical stacks of memory elements provided at levels of the electrically conductive layers. Peripheral devices may be provided on the substrate underneath the alternating stack and the memory stack structures.

SUMMARY

According to an aspect of the present disclosure, a semiconductor structure is provided, which comprises: an alternating stack of insulating layers and electrically conductive layers that alternate along a vertical direction; a dielectric moat fill structure at least partially laterally surrounded by the alternating stack and having an outer sidewall that contacts each of the insulating layers within the alternating stack, wherein the dielectric moat fill structure comprises a nested structure including, from outside to inside, an outer dielectric liner having a first Young's modulus, an outer material layer having a second Young's modulus, a dielectric fill material portion, an inner material layer having the second Young's modulus, and an inner dielectric liner having the first Young's modulus, wherein the second Young's modulus is greater than the first Young's modulus; a vertically alternating sequence of insulating plates and dielectric material plates at least partially laterally surrounded by the dielectric moat fill structure, wherein an inner sidewall of the dielectric moat fill structure contacts each of the insulating plates and each of the dielectric material plates within the vertically alternating sequence; and an interconnection via structure vertically extending through each of the insulating plates and each of the dielectric material plates within the vertically alternating sequence.

According to an aspect of the present disclosure, a method of forming a semiconductor structure is provided, which comprises: method of forming a semiconductor structure, comprising: forming an in-process alternating stack of in-process insulating layers and sacrificial material layers comprising a dielectric material that alternate along a vertical direction over a substrate; forming a moat trench through the alternating stack, wherein portions of the in-process alternating stack that is at least partially laterally surrounded by the moat trench comprise a vertically alternating sequence of insulating plates and dielectric material plates including the dielectric material; forming a dielectric moat fill structure within the moat trench, wherein the dielectric moat fill structure comprises a nested structure including, from outside to inside, an outer dielectric liner having a first Young's modulus, an outer material layer having a second Young's modulus, a dielectric fill material portion, an inner material layer having the second Young's modulus, and an inner dielectric liner having the first Young's modulus, wherein the second Young's modulus is greater than the first Young's modulus; replacing portions of the sacrificial material located outside the dielectric moat fill structure with electrically conductive layers to form an alternating stack of insulating layers and electrically conductive layers outside the dielectric moat fill structure; and forming an interconnection via structure through each of the insulating plates and each of the dielectric material plates within the vertically alternating sequence.

DETAILED DESCRIPTION

Figure 1A:
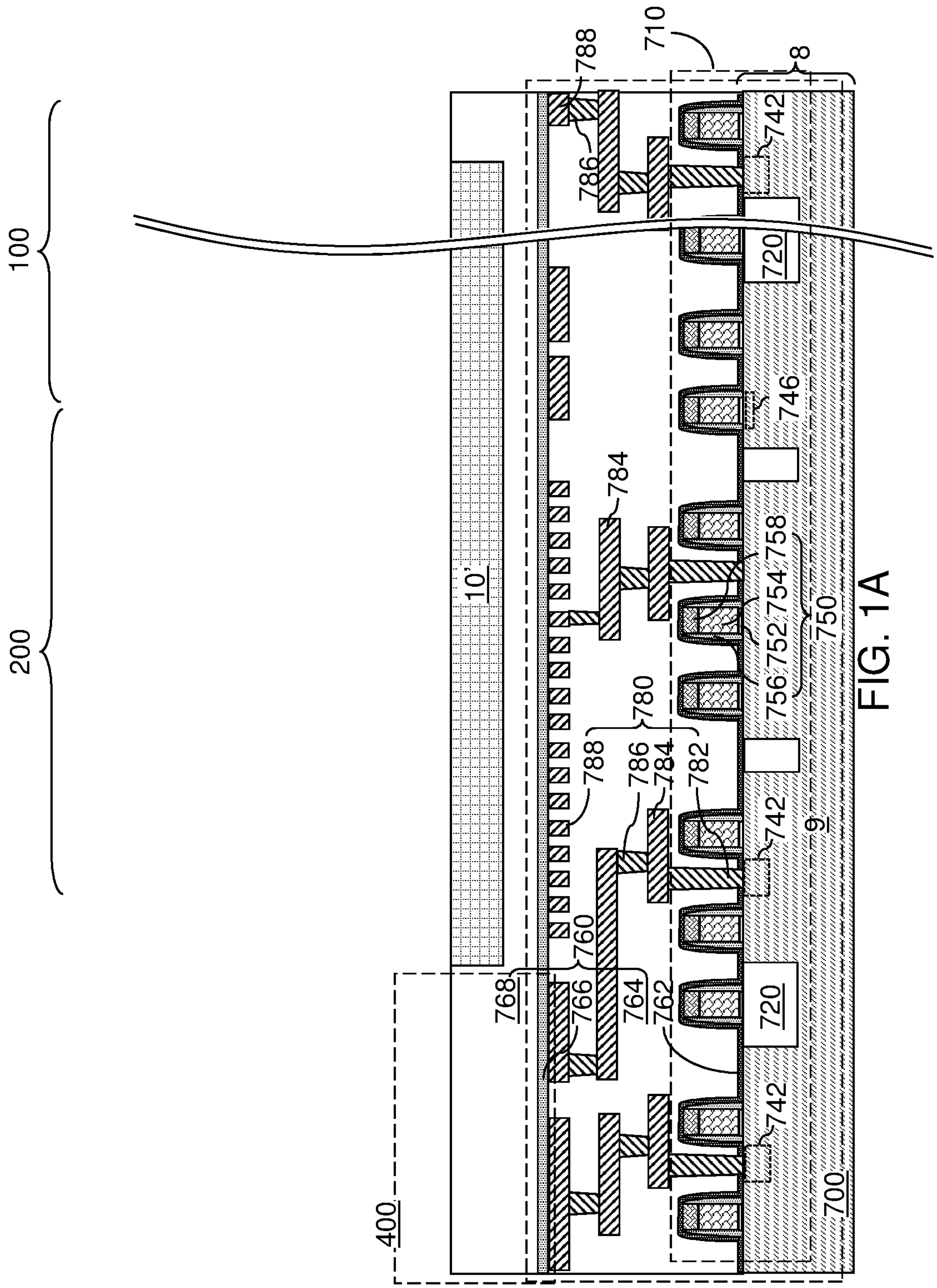
FIG. 1A is a vertical cross-sectional view of an exemplary structure after formation of semiconductor devices, lower level dielectric layers, lower metal interconnect structures, and in-process source-level material layers on a semiconductor substrate according to a first embodiment of the present disclosure.

The embodiments of the present disclosure provide a three-dimensional memory device including deformation resistant trench fill structures and methods of making the same, the various embodiments of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Figure 1B:
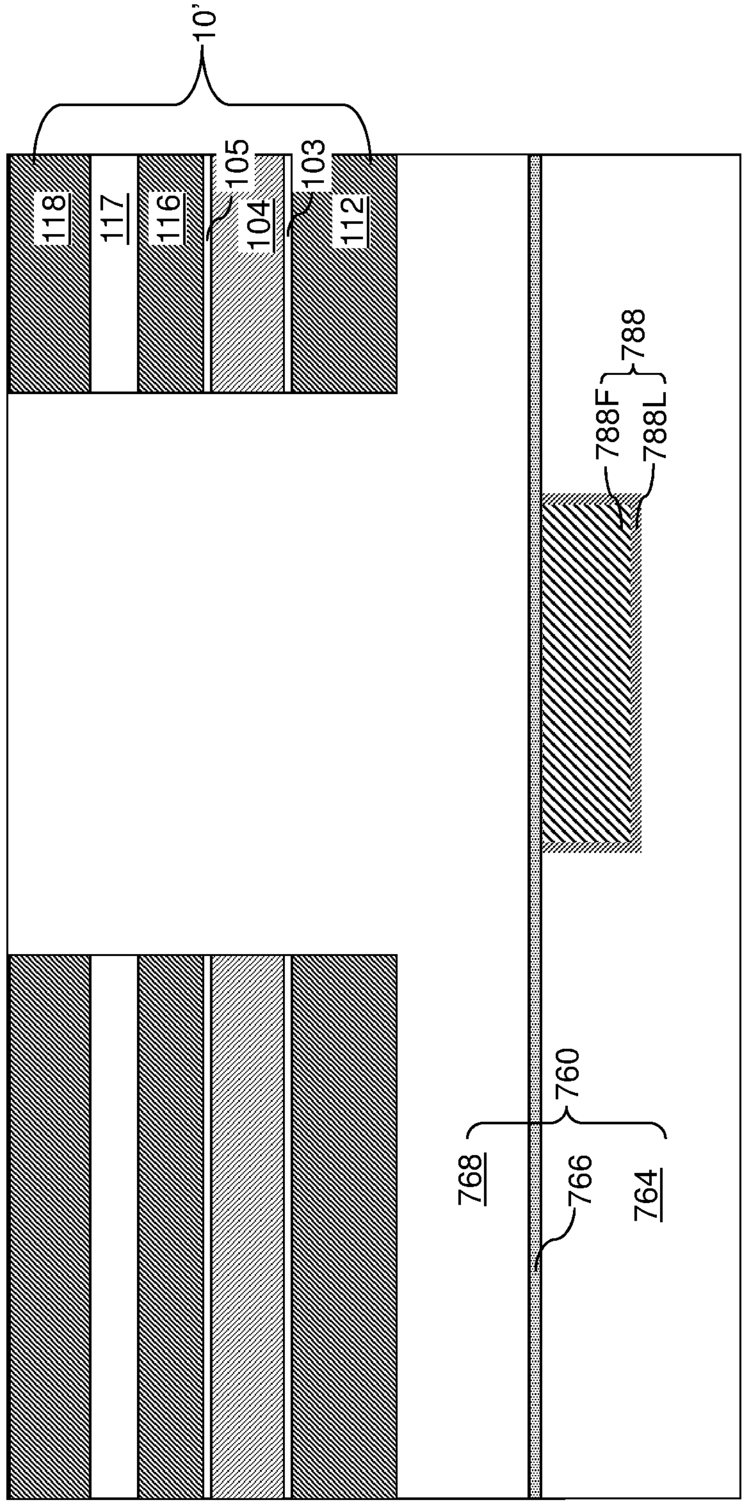
FIG. 1B is a magnified view of the in-process source-level material layers of FIG. 1A.

Referring to FIGS. 1A and 1B, an exemplary structure according to an embodiment of the present disclosure is illustrated. The exemplary structure includes a semiconductor substrate 8 and semiconductor devices 710 formed thereupon. The semiconductor substrate 8 may include a substrate semiconductor layer 9 at least at an upper portion thereof. Shallow trench isolation structures 720 may be formed in an upper portion of the substrate semiconductor layer 9 to provide electrical isolation between the semiconductor devices 710. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers may be formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, an optional planar silicon nitride liner 766 that overlies the first dielectric material layers 764, and at least one second dielectric layer 768. The planar silicon nitride liner 766 preferably has a thickness greater than 2 nm, such as a thickness in a range from 4 nm to 40 nm, such as from 6 nm to 20 nm. The dielectric layer stack including the lower-level dielectric material layers 760 may function as a matrix for lower-level metal interconnect structures 780 that provide electrical wiring to and from the various nodes of the semiconductor devices and landing pads for through-memory-level interconnection via structures to be subsequently formed. The lower-level metal interconnect structures 780 may be formed within the dielectric layer stack of the lower-level dielectric material layers 760 and overlies the field effect transistors. The lower-level metal interconnect structures 780 may comprise a lower-level metal line structure located under and optionally contacting a bottom surface of the planar silicon nitride liner 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and metal pad structures 788 that are configured to function as landing pads for through-memory-level interconnection via structures to be subsequently formed.

The metal pad structures 788 may be formed within a topmost dielectric material layer of the first dielectric material layers 764 (which may be a plurality of dielectric material layers). Each of the lower-level metal interconnect structures 780 may include a metallic nitride liner 788L and a metal fill structure 788F. Top surfaces of the metal pad structures 788 and the topmost surface of the first dielectric material layers 764 may be planarized by a planarization process, such as chemical mechanical planarization. The planar silicon nitride liner 766 (if present) may be formed directly on the top surfaces of the metal pad structures 788 and the topmost surface of the first dielectric material layers 764.

The planar silicon nitride liner 766 can be a silicon nitride liner and can have a uniform thickness throughout between a planar bottom surface and a planar top surface. According to an aspect of the present disclosure, the thickness of the planar silicon nitride liner 766 can be selected such that the planar silicon nitride liner 766 effectively functions as a diffusion barrier layer during a subsequently oxidation process that is performed after formation of a three-dimensional array of memory elements and prior to formation of a through-memory-level contact via structure thereupon. In one embodiment, the planar silicon nitride liner 766 can have a thickness in a range from 4 nm to 100 nm, such as from 8 nm to 50 nm, although lesser and greater thicknesses may also be employed. The planar silicon nitride liner 766 may be deposited by a chemical vapor deposition process.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

Generally, semiconductor devices 710 can be formed on a top surface of the substrate semiconductor layer 9 in a substrate 8. Lower-level metal interconnect structures 780 embedded in lower-level dielectric material layers 760 and electrically connected to the semiconductor devices 710 can be formed over the substrate semiconductor layer 9. The planar silicon nitride liner 766 may be formed directly on top surfaces of a subset of the lower-level metal interconnect structures 780. An entire top surface of each lower-level metal interconnect structure 780 within the subset of the lower-level metal interconnect structures 780 may be contacted by the planar silicon nitride liner 766.

The in-process source-level material layers 10' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 10' may include, from bottom to top, a lower source-level material layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level material layer 112 and the upper source-level semiconductor layer 116 may include a doped semiconductor material such as doped polysilicon or doped amorphous silicon. The conductivity type of the lower source-level material layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level material layer 112 and the upper source-level semiconductor layer 116 have a doping of a second conductivity type that is the opposite of the first conductivity type. The thickness of each of the lower source-level material layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 10' may be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the semiconductor substrate 8. In one embodiment, the in-process source-level material layer 10' may have an opening in each area in which through-memory-level interconnection via structures are to be subsequently formed. For example, the in-process source-level material layer 10' may have openings in the memory array region 100.

The in-process source-level material layers 10' may be patterned to provide openings in areas in which through-memory-level interconnection via structures and through-dielectric contact via structures are to be subsequently formed. Patterned portions of the in-process source-level material layers 10' are present in each memory array region 100 in which three-dimensional memory stack structures are to be subsequently formed.

In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the in-process source-level material layers 10' may be formed within the area of a memory array region 100, in which a three-dimensional memory array including memory stack structures is to be subsequently formed. A peripheral device region 400 that may be subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 may be formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and may be located at the level of the lower-level dielectric material layers 760. Through-memory-level interconnection via structures may be subsequently formed directly on the lower-level metal interconnect structures 780 to provide electrical connection to memory devices that are also to be subsequently formed. In one embodiment, the pattern of the lower-level metal interconnect structures 780 may be selected such that the metal pad structures 788 (which are a subset of the lower-level metal interconnect structures 780 located at the topmost portion of the lower-level metal interconnect structures 780) may provide landing pad structures for the through-memory-level interconnection via structures to be subsequently formed.

Figure 2:
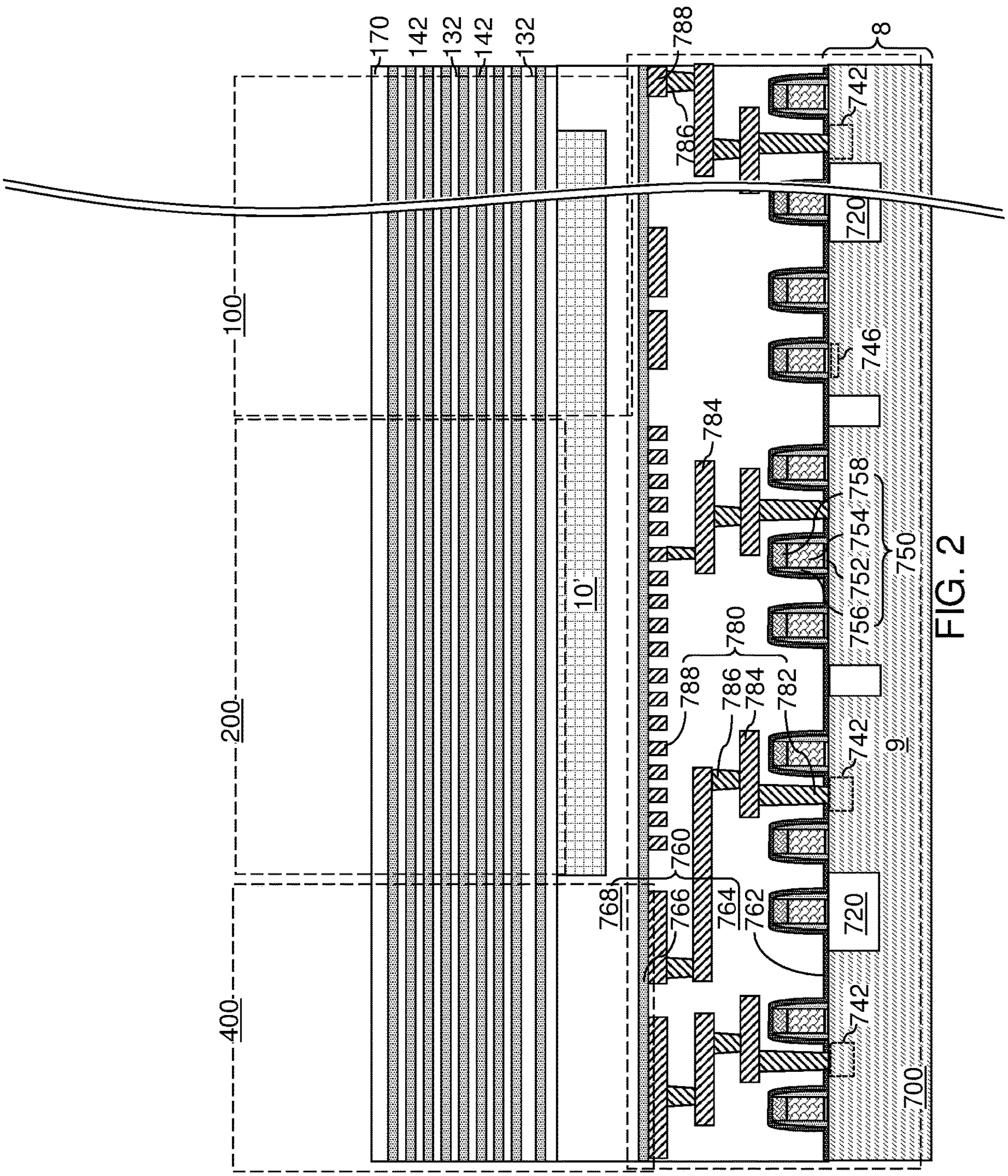
FIG. 2 is a vertical cross-sectional view of the exemplary structure after formation of a first-tier alternating stack of first insulating layers and first sacrificial material layers according to an embodiment of the present disclosure.

Referring to FIG. 2, an alternating stack of first material layers and second material layers may be formed. Each first material layer may include a first material, and each second material layer may include a second material that is different from the first material. In embodiments where at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulating layers 132 as the first material layers, and first sacrificial material layers 142 as the second material layers. In one embodiment, each first insulating layer 132 may include a first insulating material, and each first sacrificial material layer 142 may include a first sacrificial material that is a dielectric material. An alternating plurality of first insulating layers 132 and first sacrificial material layers 142 is formed over the in-process source-level material layers 10'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses.

The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material.

Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The second material of the first sacrificial material layers 142 may be subsequently replaced with electrically conductive electrodes which may function, for example, as control gate electrodes of a vertical NAND device. According to an aspect of the present disclosure, the first sacrificial material layers 142 include a dielectric material. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 may be subsequently formed over the first-tier alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
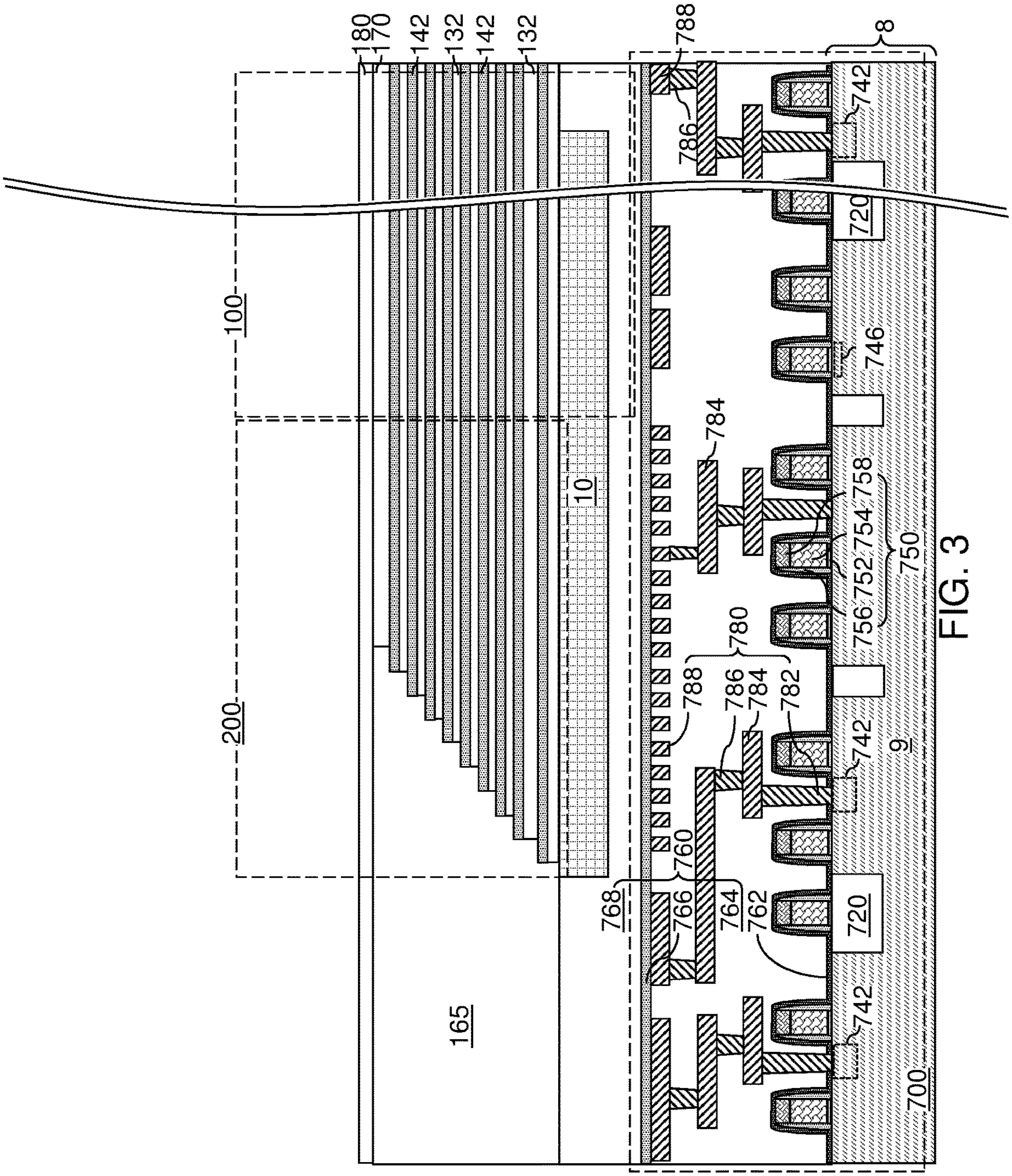
FIG. 3 is a vertical cross-sectional view of the exemplary structure after patterning a first-tier staircase region, a first retro-stepped dielectric material portion, and an inter-tier dielectric layer according to an embodiment of the present disclosure.

Referring to FIG. 3, the first insulating cap layer 170 and the first-tier alternating stack (132, 142) may optionally be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. Alternatively, the stepped surfaces may be omitted if dielectric isolated via structures will be formed in contact with subsequently formed word lines and select gate electrodes will which replace the sacrificial material layers.

The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4:
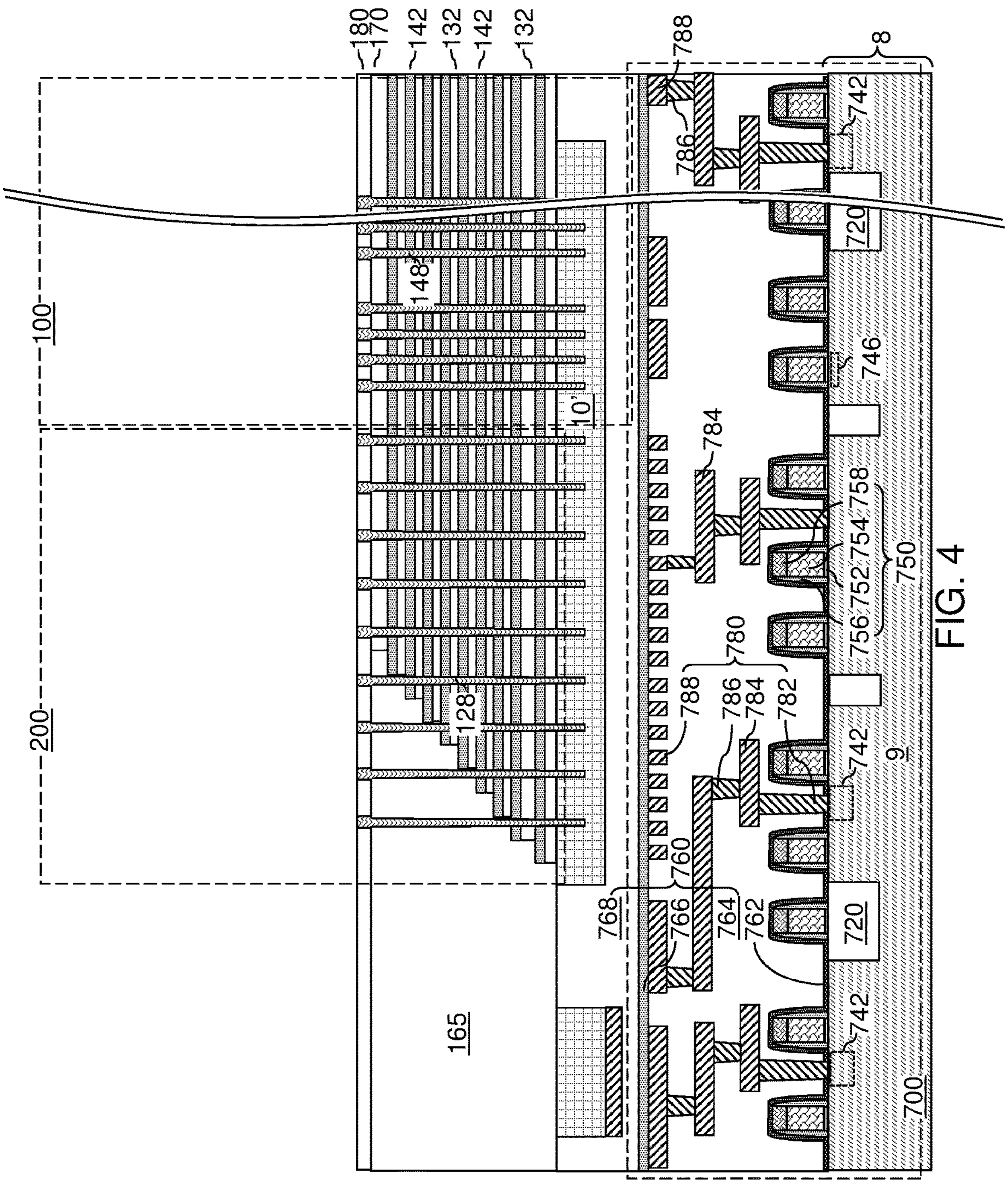
FIG. 4 is a vertical cross-sectional view of the exemplary structure after formation of first-tier memory openings, first-tier support openings, and various sacrificial fill structures according to an embodiment of the present disclosure.

Referring to FIG. 4, various first-tier openings may be formed through the inter-tier dielectric layer 180 and the first-tier structure (132, 142, 170, 165) and into the in-process source-level material layers 10'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 10' by a first anisotropic etch process to form the various first-tier openings concurrently, i.e., during the first isotropic etch process. The various first-tier openings may include first-tier memory openings and first-tier support openings.

The first-tier memory openings are openings that are formed in the memory array region 100 through each layer within the first alternating stack (132, 142) and are subsequently used to form memory stack structures therein. The first-tier memory openings may be formed in clusters of first-tier memory openings. Each cluster of first-tier memory openings may be formed as a two-dimensional array of first-tier memory openings.

The first-tier support openings are openings that are formed in the staircase region 200, and are subsequently employed to form support pillar structures. A subset of the first-tier support openings that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 10'. For example, the terminal portion of the anisotropic etch process may include a step that etches the dielectric material(s) of the at least one second dielectric layer 768 selective to a semiconductor material within a component layer in the in-process source-level material layers 10'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 10'. The photoresist layer may be subsequently removed, for example, by ashing.

Optionally, the portions of the first-tier memory openings and the first-tier support openings at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings at the level of the inter-tier dielectric layer 180. The portions of the first-tier memory openings located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Sacrificial first-tier opening fill portions (148, 128) may be formed in the various first-tier openings. For example, a sacrificial first-tier fill material is deposited concurrently deposited in each of the first-tier openings. The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening constitutes a sacrificial first-tier memory opening fill portion 148. Each remaining portion of the sacrificial material in a first-tier support opening constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 5:
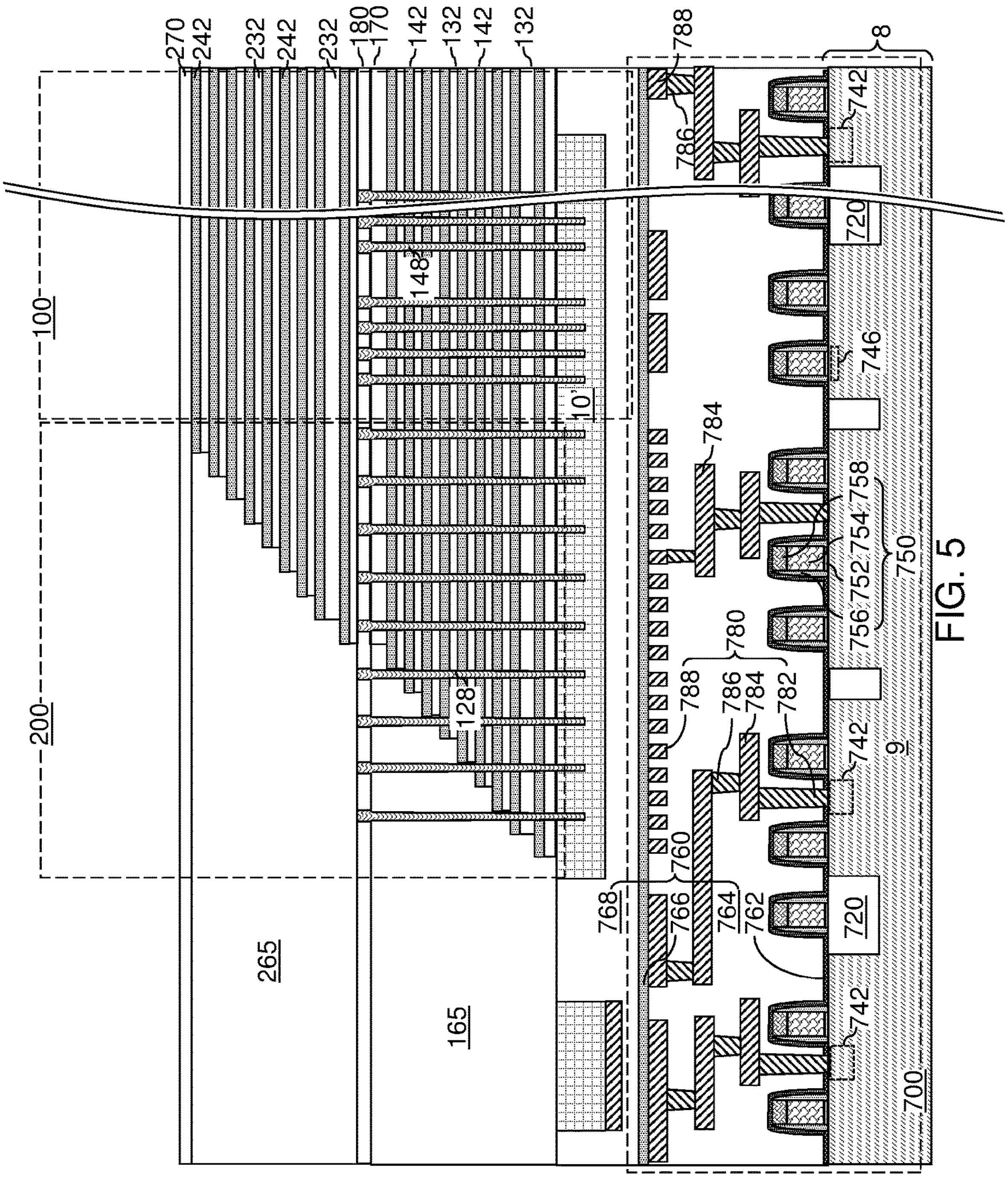
FIG. 5 is a vertical cross-sectional view of the exemplary structure after formation of a second-tier alternating stack of second insulating layers and second sacrificial material layers, second stepped surfaces, and a second retro-stepped dielectric material portion according to an embodiment of the present disclosure.

Referring to FIG. 5, a second-tier structure may be formed over the first-tier structure (132, 142, 170, 148). The second-tier structure may include an additional alternating stack of insulating layers and sacrificial material layers. For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally, at least one alternating stack of insulating layers (132, 232) and sacrificial material layers (142, 242) may be formed over the in-process source-level material layers 10', and at least one retro-stepped dielectric material portion (165, 265) may be formed over the staircase regions on the at least one alternating stack (132, 142, 232, 242). The insulating layers (132, 232) and the sacrificial material layers (142, 242) are subsequently modified by patterning and/or replacement, and thus, are in-process structures, i.e., structures that are subsequently modified either in geometry or in material composition. The at least one alternating stack of insulating layers (132, 232) and sacrificial material layers (142, 242) is also referred to as an in-process alternating stack {(132, 142), (232, 242)} of in-process insulating layers (132, 232) and sacrificial material layers (142, 242). The sacrificial material layers (142, 242) comprise a dielectric material that can be subsequently removed selective to the material of the insulating layers (132, 232). The insulating layers (132, 232) and sacrificial material layers (142, 242) within the in-process alternating stack {(132, 142), (232, 242)} alternate along the vertical direction.

Figure 6:
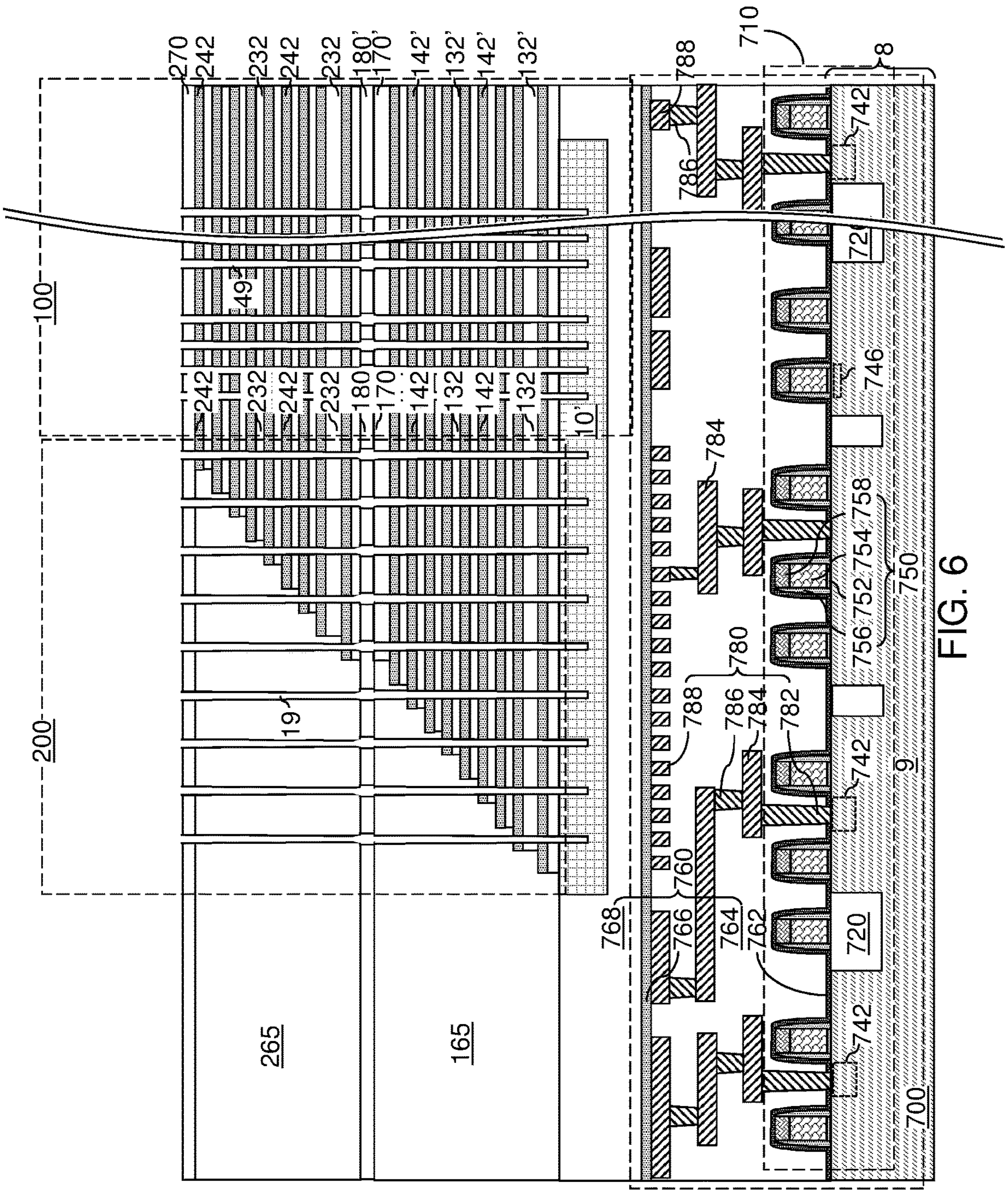
FIG. 6 is a vertical cross-sectional view of the exemplary structure after formation of inter-tier memory openings and inter-tier support openings according to an embodiment of the present disclosure.

Referring to FIG. 6, various second-tier openings) may be formed through the second-tier structure (232, 242, 265, 270). A photoresist layer (not shown) may be applied over the second insulating cap layer 270, and may be lithographically patterned to form various openings therethrough. The pattern of the openings may be the same as the pattern of the various first-tier openings, which is the same as the sacrificial first-tier opening fill portions (148, 128). Thus, the lithographic mask used to pattern the first-tier openings may be used to pattern the photoresist layer.

The pattern of openings in the photoresist layer may be transferred through the second-tier structure (232, 242, 265, 270) by a second anisotropic etch process to form various second-tier openings) concurrently, i.e., during the second anisotropic etch process. The various second-tier openings) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings) may be substantially vertical, or may be tapered. A bottom periphery of each second-tier opening) may be laterally offset, and/or may be located entirely within, a periphery of a top surface of an underlying sacrificial first-tier opening fill portion (148, 128). The photoresist layer may be subsequently removed, for example, by ashing.

The sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 7A-7D provide sequential cross-sectional views of a memory opening 49 during formation of a memory opening fill structure. The same structural change occurs in each of the memory openings 49 and the support openings 19.

Figure 7B:
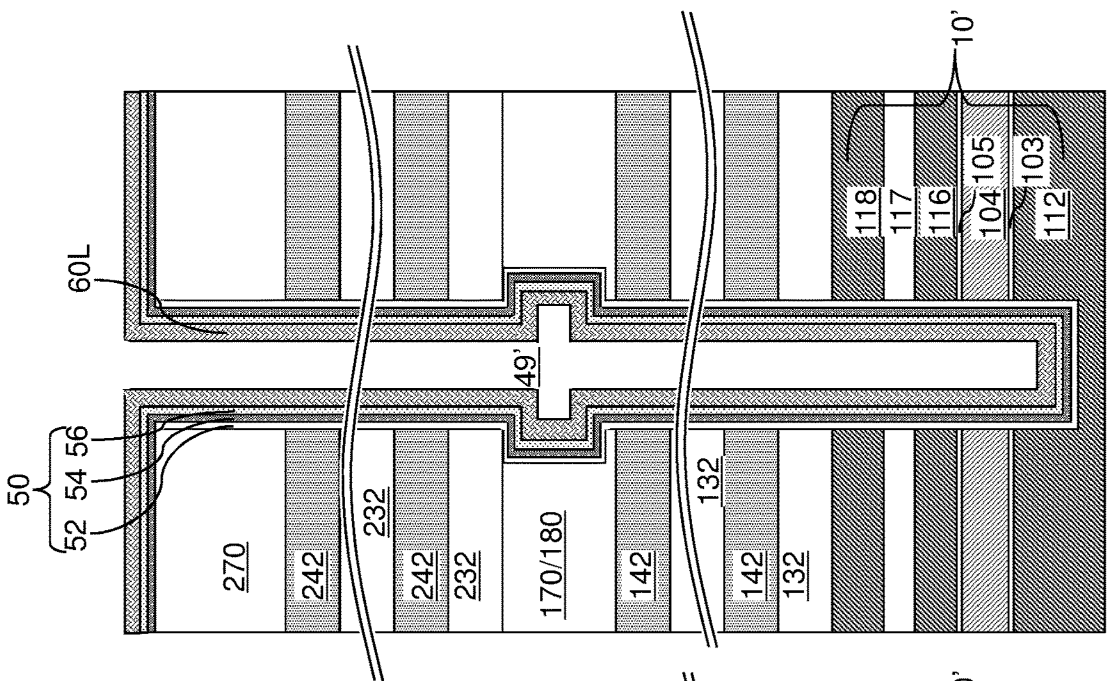
FIGS. 7A-7D illustrate sequential vertical cross-sectional views of a memory opening during formation of a memory opening fill structure according to an embodiment of the present disclosure.
Figure 7A:
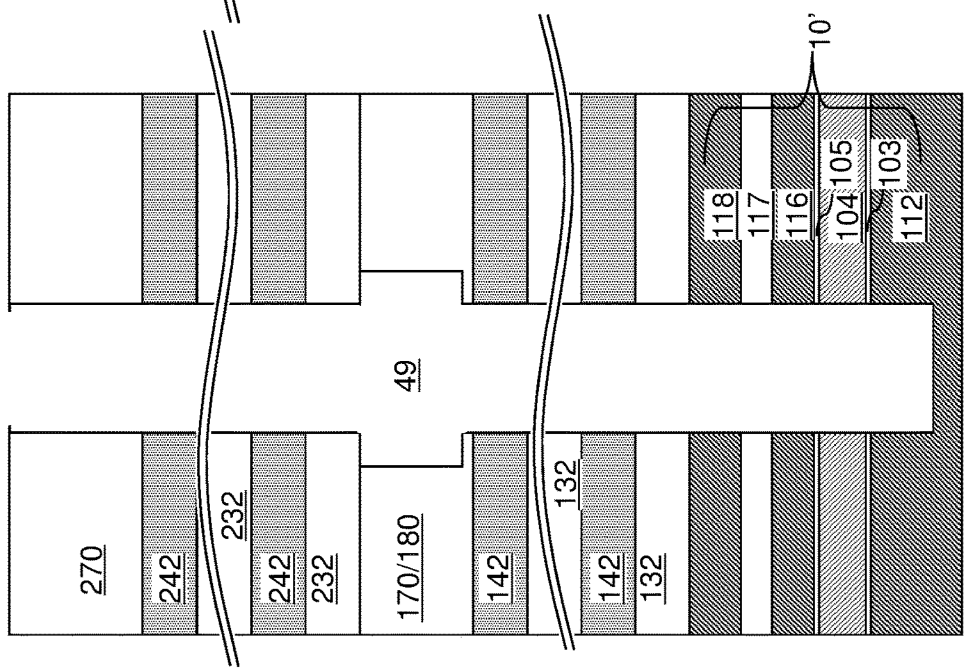

Referring to FIG. 7A, a memory opening 49 in the first exemplary device structure of FIG. 6 is illustrated. The memory opening 49 extends through the first-tier structure and the second-tier structure. The memory openings 49 are formed through the in-process alternating stack {(132, 142), (232, 242)} outside an area in which moat trenches are to be subsequently formed.

Referring to FIG. 7B, a stack of layers including a blocking dielectric layer 52, a memory material layer 54, an optional dielectric liner 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the memory material layer 54 may be formed. Generally, the memory material layer 54 may comprise any memory material that can store data in the form of stored electrical charges, direction of ferroelectric polarization, electrical resistivity of a material, or any other type of physically differentiable material states that can be electrically detected. Each portion of the memory material layer 54 that is formed at a level of the sacrificial material layers (142, 242) constitutes a memory element. Thus, a vertical stack of memory elements comprising portions of the memory material layer 54 located at the levels of the sacrificial material layers (142, 242) can be formed within each memory opening 49. In an illustrative example, the memory material layer 54 may be a continuous layer or patterned discrete portions of a charge trapping material including a dielectric charge trapping material, which may be, for example, silicon nitride. Alternatively, the memory material layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the memory material layer 54 includes a silicon nitride layer. In one embodiment, the sacrificial material layers (142, 242) and the insulating layers (132, 232) may have vertically coincident sidewalls, and the memory material layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the memory material layer 54 as a plurality of memory material portions that are vertically spaced apart. The thickness of the memory material layer 54 may be in a range from 2 nm to 20 nm, although lesser and greater thicknesses may also be used.

The optional dielectric liner 56, if present, includes a suitable dielectric material that can facilitate storage of information of the memory material layer 54. In one embodiment, the dielectric liner 56 comprises a tunneling dielectric layer through which charge tunneling may be performed under suitable electrical bias conditions. In this case, the charge tunneling may be performed through hot-carrier injection or by Fowler-Nordheim tunneling induced charge transfer depending on the mode of operation of the three-dimensional NAND string memory device to be formed. The dielectric liner 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric liner 56 may include a stack of a first silicon oxide layer, a silicon oxynitride layer, and a second silicon oxide layer, which is commonly known as an ONO stack. In one embodiment, the dielectric liner 56 may include a silicon oxide layer that is substantially free of carbon or a silicon oxynitride layer that is substantially free of carbon. The thickness of the dielectric liner 56 may be in a range from 2 nm to 20 nm, although lesser and greater thicknesses may also be used. The stack of the blocking dielectric layer 52, the memory material layer 54, and the dielectric liner 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Figure 7C:
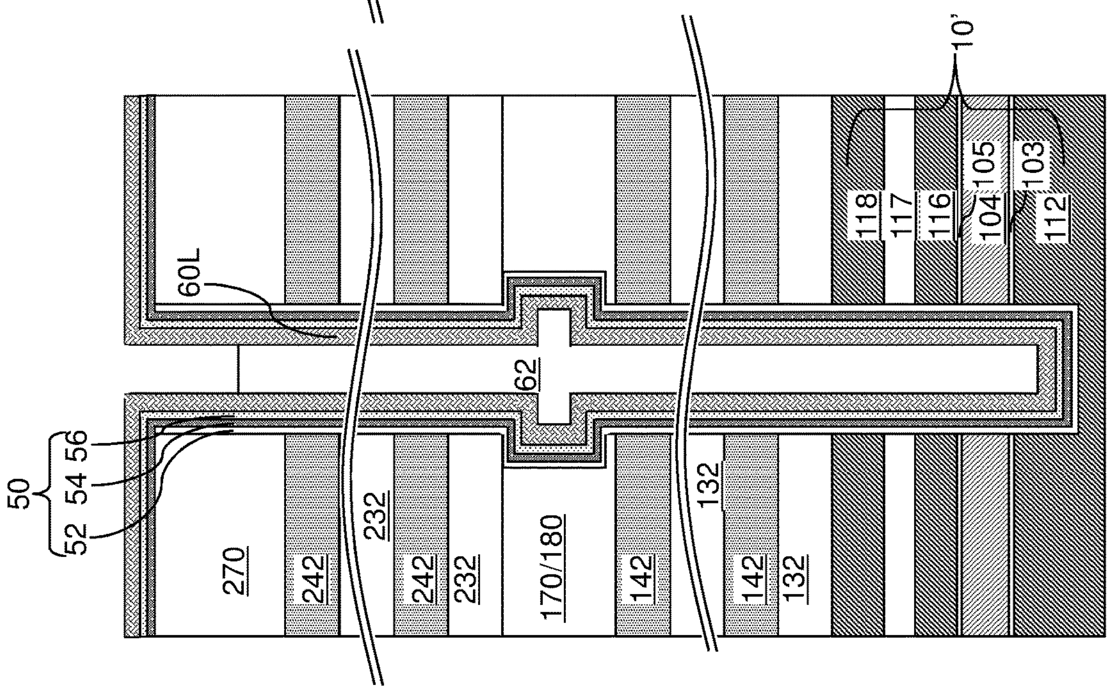

Referring to FIG. 7C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Figure 7D:
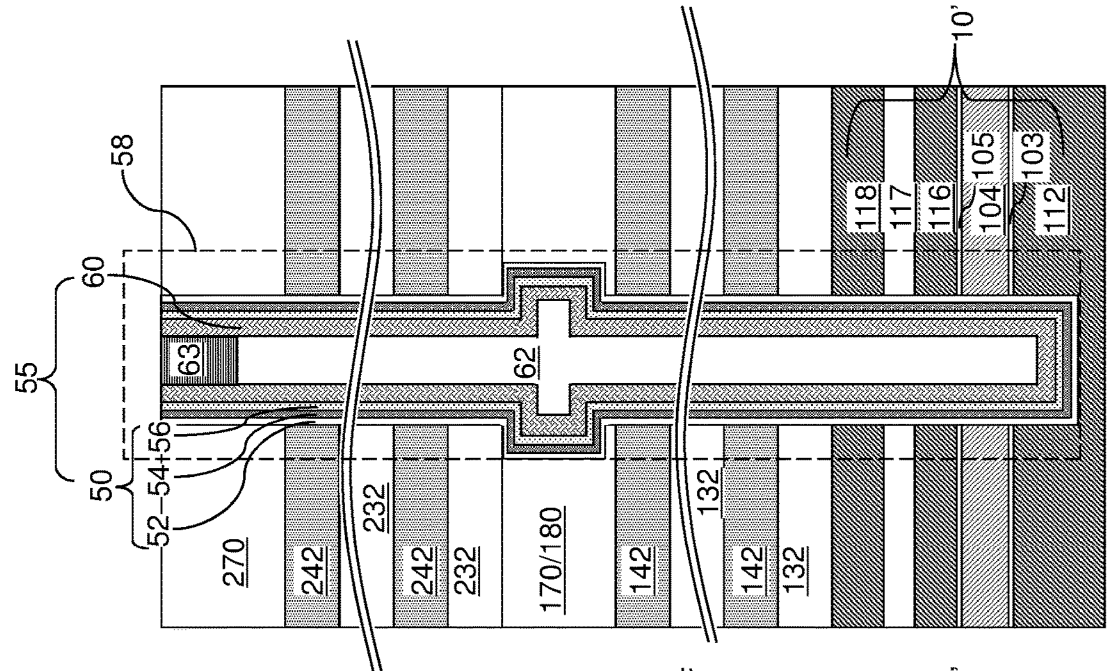
Figure 8A:
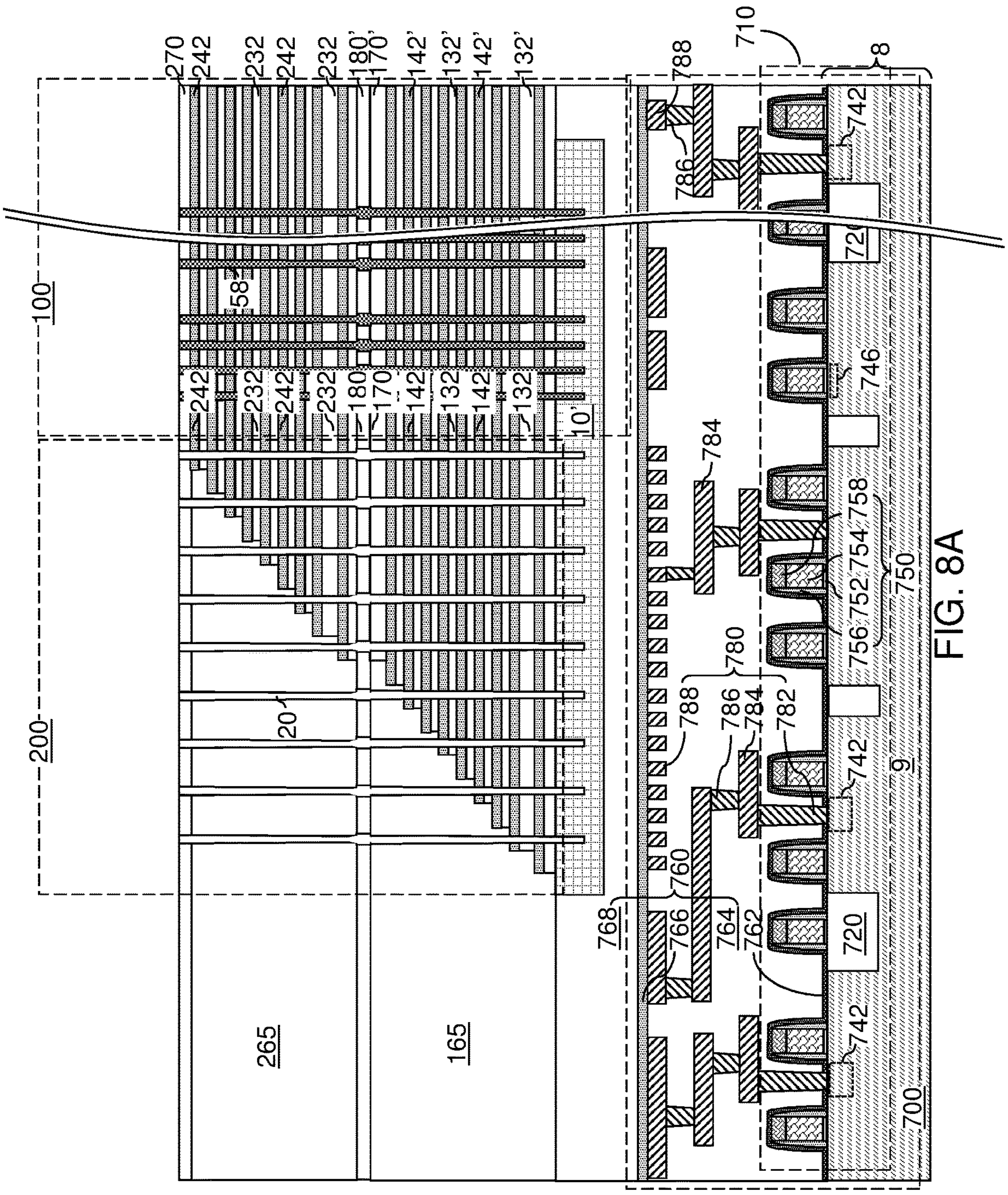
FIG. 8A is a vertical cross-sectional view of the exemplary structure after formation of memory opening fill structures and support pillar structures according to an embodiment of the present disclosure.
Figure 8B:
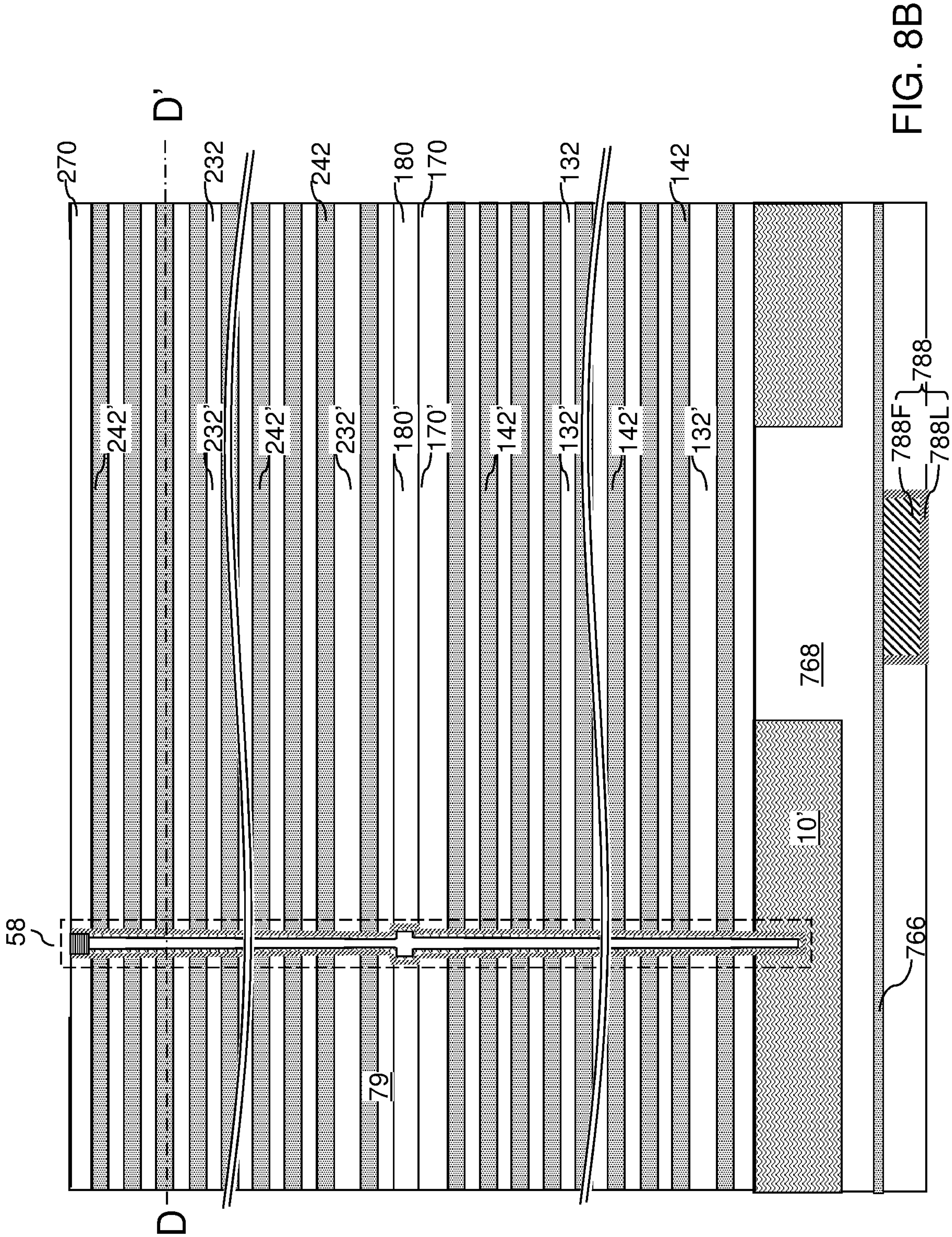
FIG. 8B is another vertical cross-sectional view of the exemplary structure of FIG. 8A.
Figure 8C:
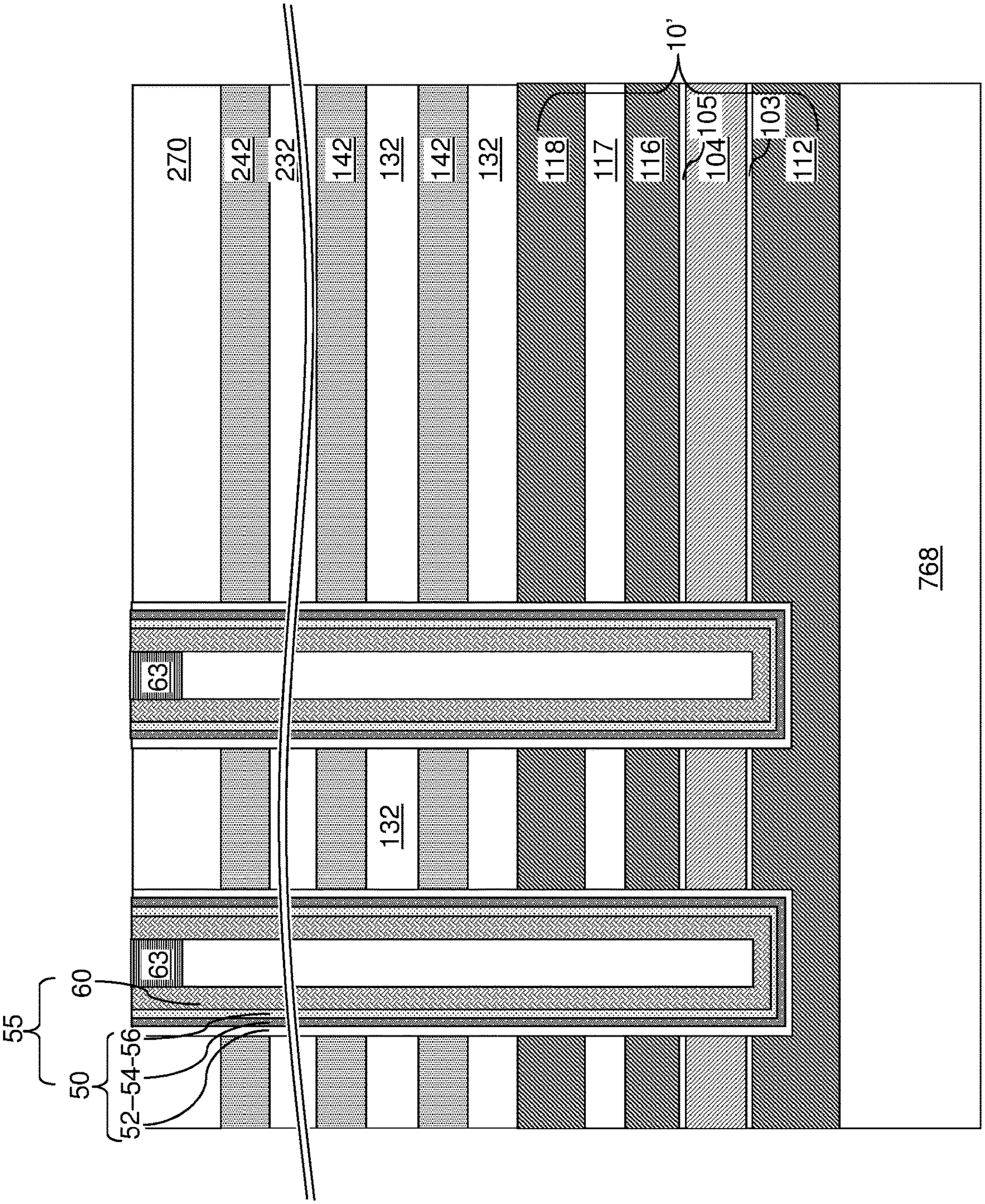
FIG. 8C is yet another vertical cross-sectional view of the exemplary structure of FIGS. 8A and 8B.
Figure 8D:
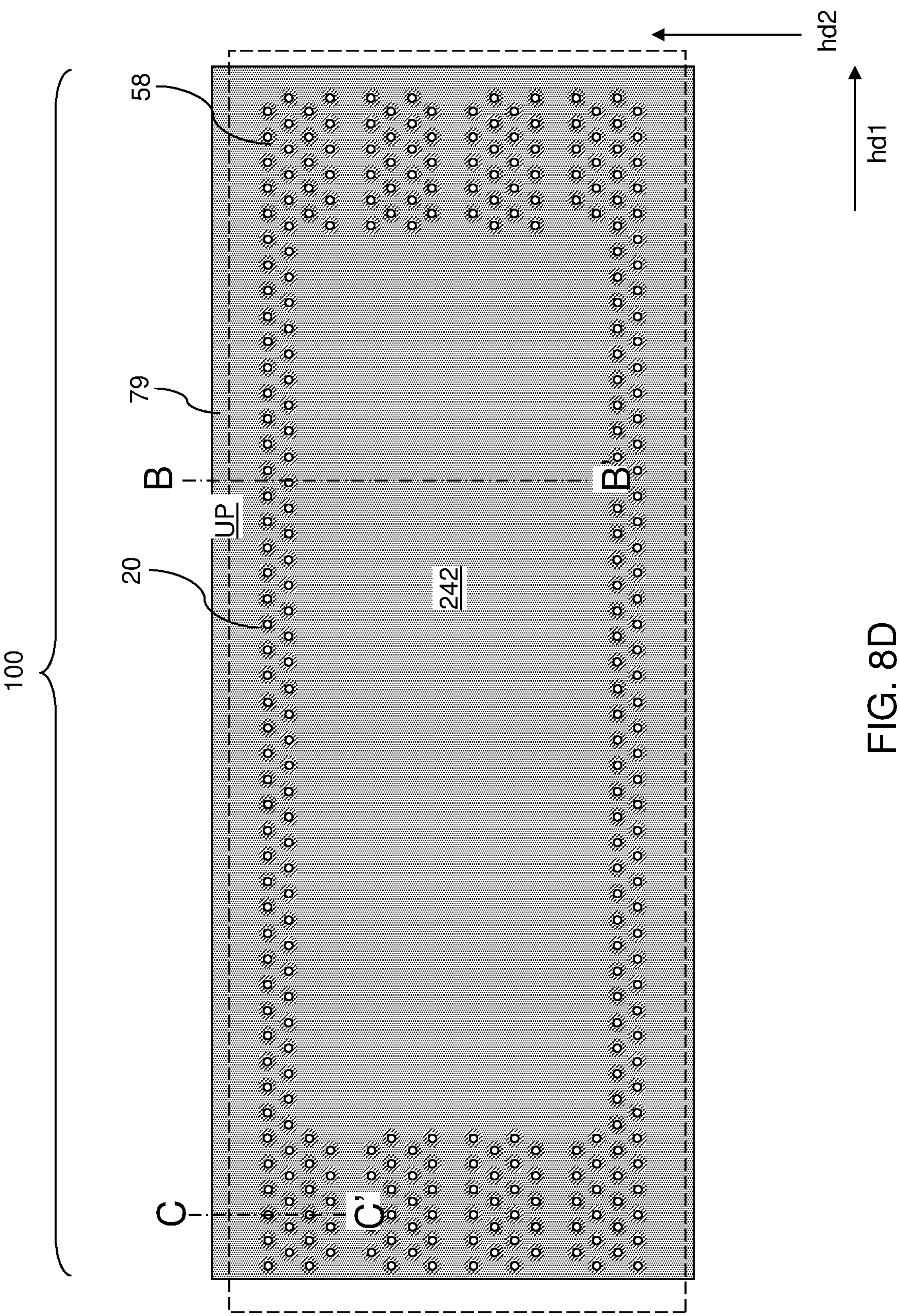
FIG. 8D is a horizontal cross-sectional view along the horizontal plane D-D' of FIG. 8B. The vertical cross-sectional plane B-B' is the plane of the vertical cross-section of FIG. 8B. The vertical cross-sectional plane C-C' is the plane of the vertical cross-section of FIG. 8C.

Referring to FIG. 7D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the dielectric liner 56, the memory material layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0\times10^{18}/cm^3$ to $2.0\times10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A dielectric liner 56 is surrounded by a memory material layer 54, and laterally surrounds a vertical semiconductor channel 60. Each adjoining set of a blocking dielectric layer 52, a memory material layer 54, and a dielectric liner 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a dielectric liner 56, a plurality of memory elements comprising portions of the memory material layer 54, and an optional blocking dielectric layer 52. Each combination of a memory stack structure 55, a dielectric core 62, and a drain region 63 within a memory opening 49 constitutes a memory opening fill structure 58. The in-process source-level material layers 10', the first-tier structure (132, 142, 170, 165), the second-tier structure (232, 242, 270, 265), the inter-tier dielectric layer 180, and the memory opening fill structures 58 collectively constitute a memory-level assembly.

Referring to FIGS. 8A-8D, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58. In one embodiment, clusters of memory opening fill structures 58 can laterally extend along a first horizontal direction (e.g., word line direction) hd1, and can be laterally spaced apart along a second horizontal direction (e.g., bit line direction) hd2 that is perpendicular to the first horizontal direction hd1. Groups of clusters of memory opening fill structures 58 may be laterally spaced apart along the second horizontal direction hd2. A region that is free of memory opening fill structures 58 and support pillar structures 20 may be provided between a pair of groups of memory opening fill structures 58 that are laterally spaced apart. In one embodiment, a unit pattern UP may be repeated with a periodicity along the second horizontal direction hd2. Generally, each of the memory opening fill structures 58 is formed within a respective memory opening 49, and comprises a respective vertical semiconductor channel 60 and a respective vertical stack of memory elements.

Referring to FIGS. 9A-9E, a contact-level dielectric layer 280 may be formed over the in-process alternating stack {(132, 142), (232, 242)} and the optional retro-stepped dielectric material portions (165, 265). The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

Figure 9A:
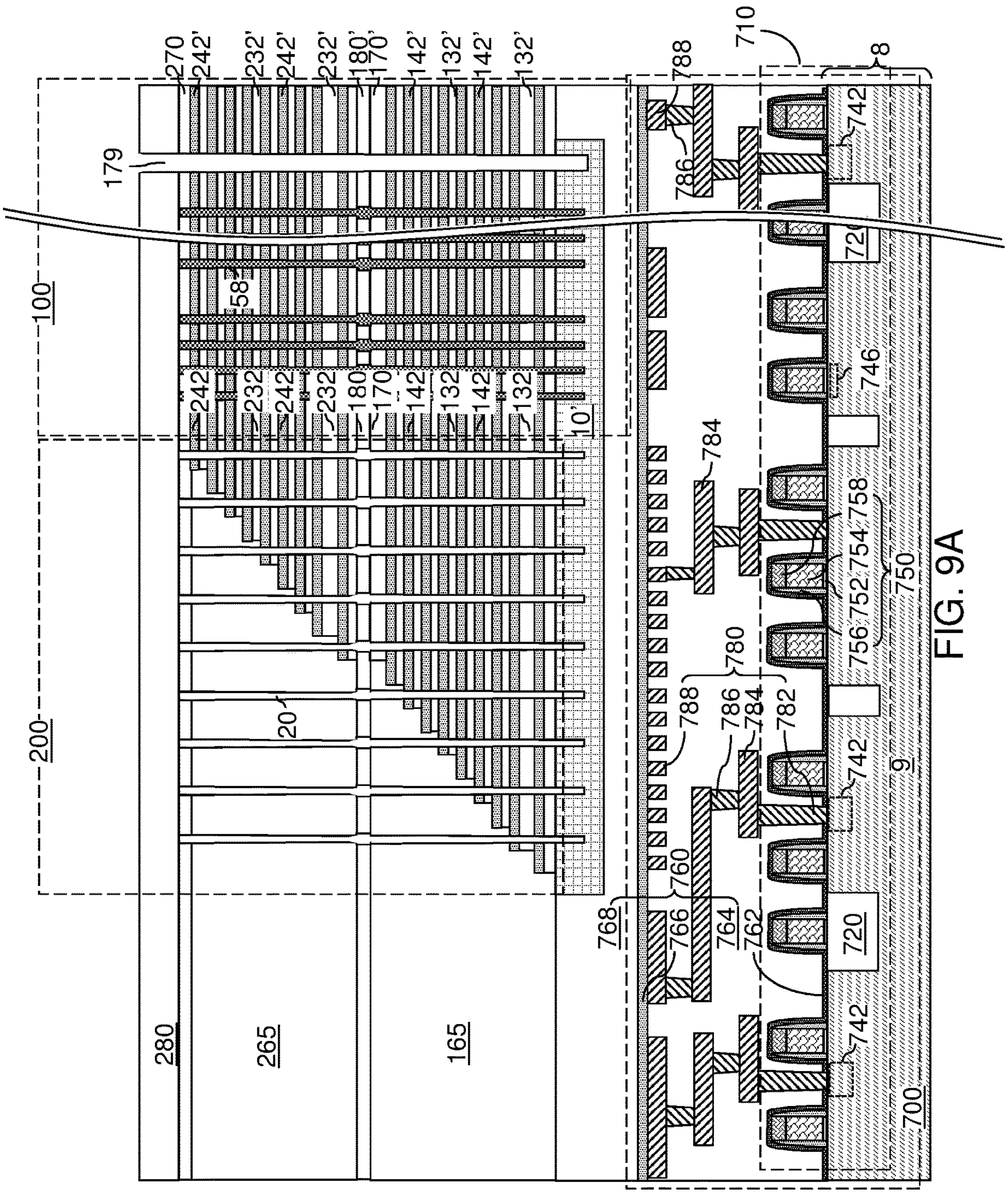
FIG. 9A is a vertical cross-sectional view of the exemplary structure after formation of a moat trench according to an embodiment of the present disclosure.
Figure 9B:
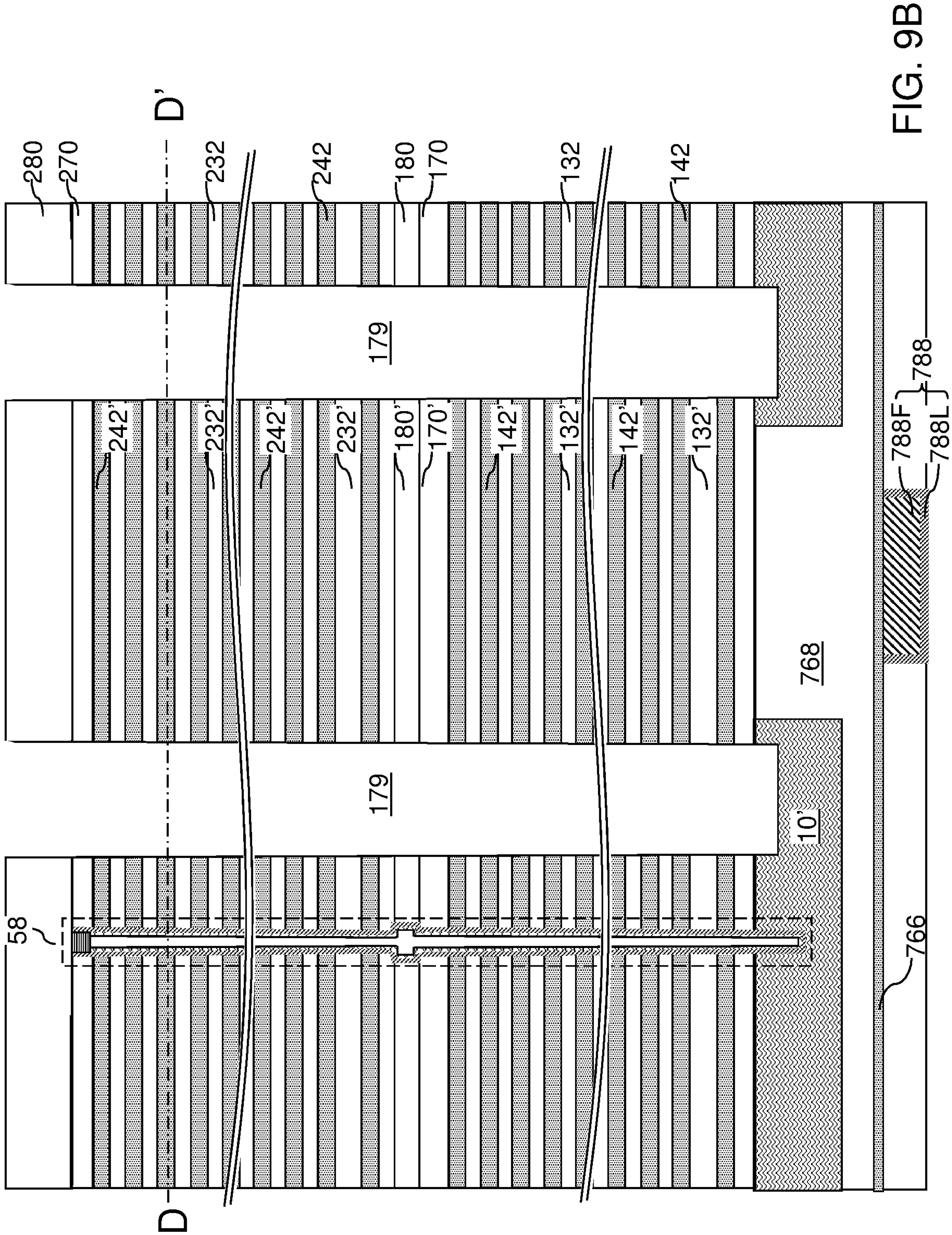
FIG. 9B is another vertical cross-sectional view of the exemplary structure of FIG. 9A.
Figure 9C:
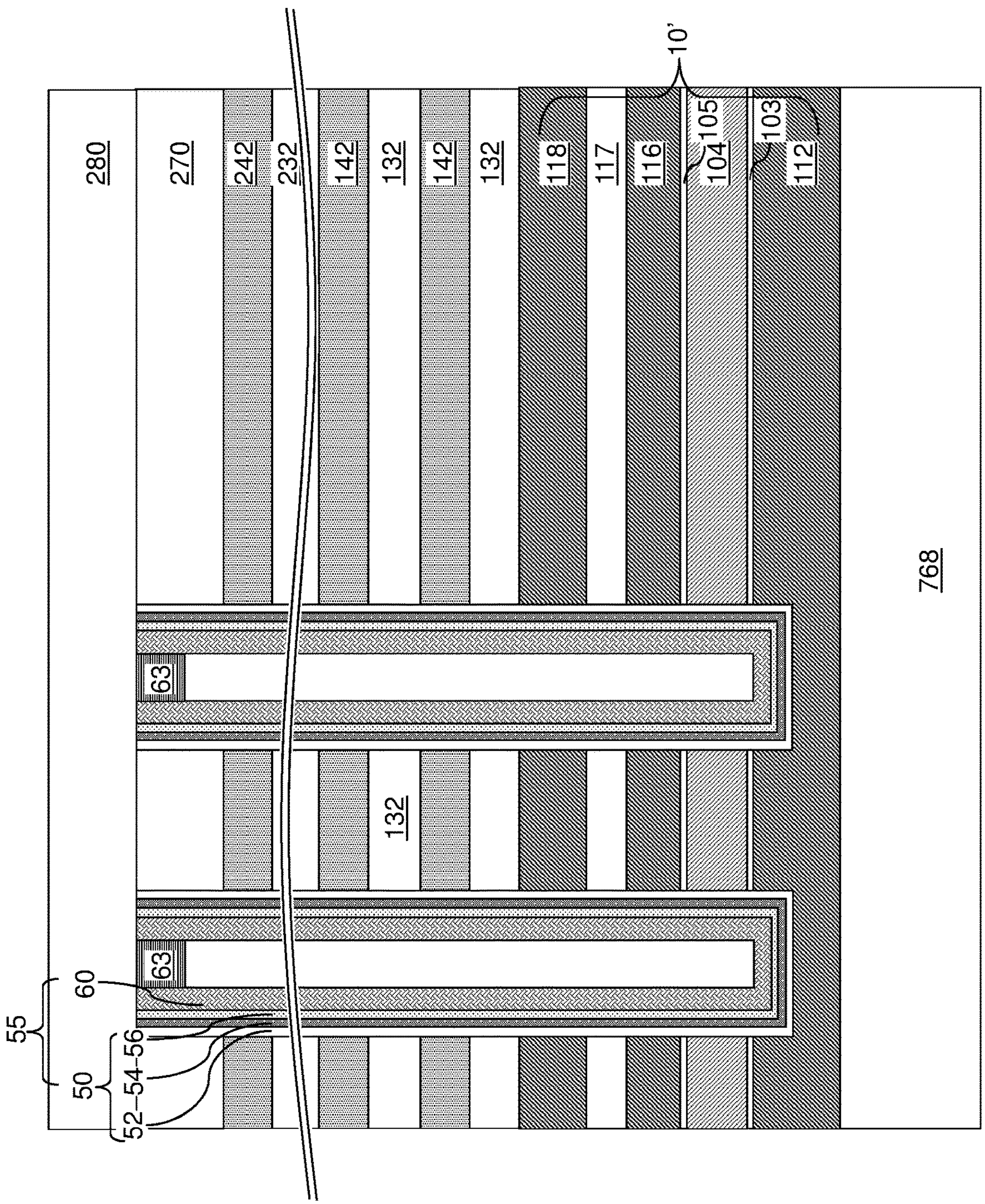
FIG. 9C is yet another vertical cross-sectional view of the exemplary structure of FIGS. 9A and 9B.
Figure 9D:
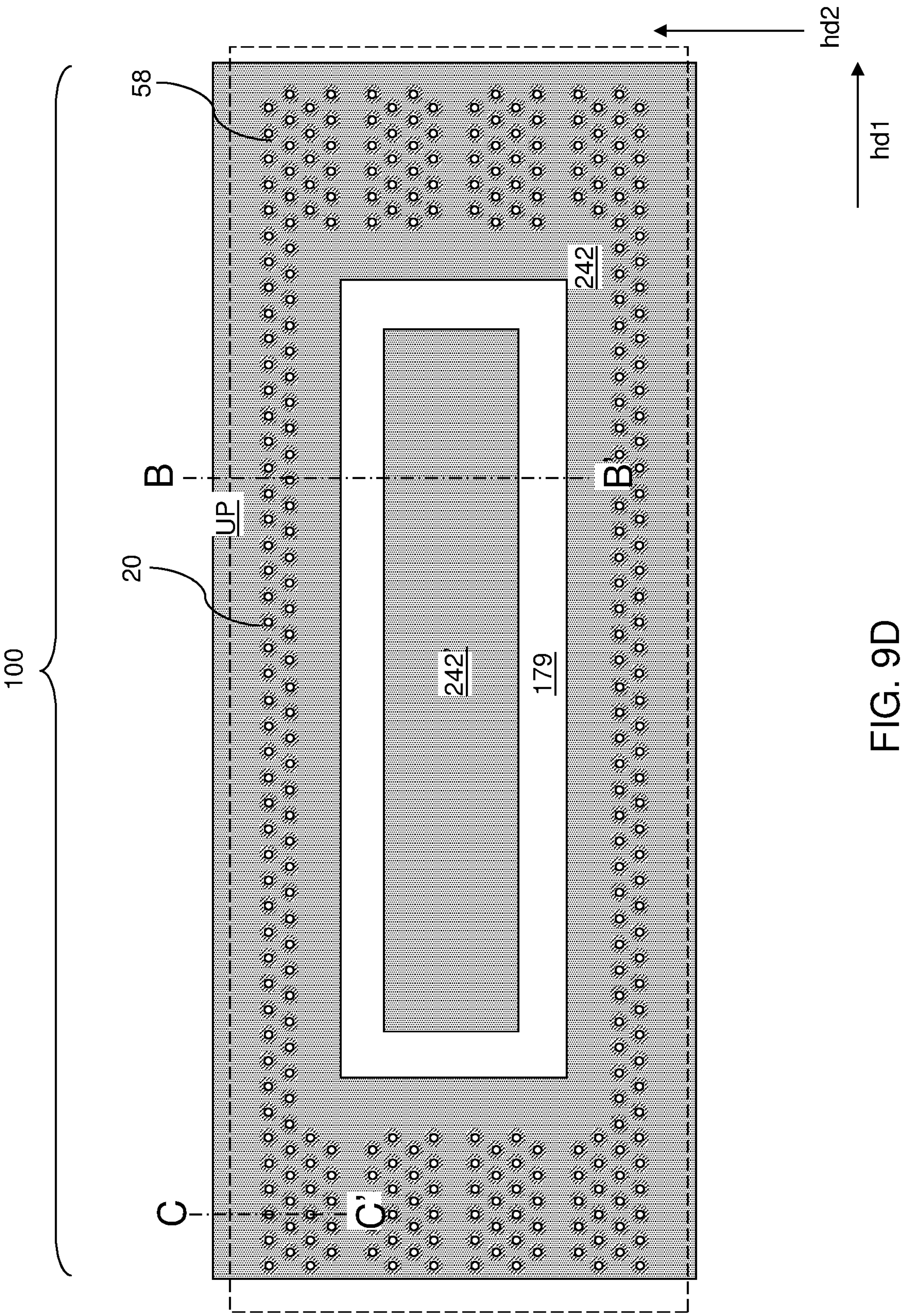
FIGS. 9D and 9E are alternative horizontal cross-sectional views along the horizontal plane D-D' of FIG. 9B. The vertical cross-sectional plane B-B' is the plane of the vertical cross-section of FIG. 9B. The vertical cross-sectional plane C-C' is the plane of the vertical cross-section of FIG. 9C.
Figure 9E:
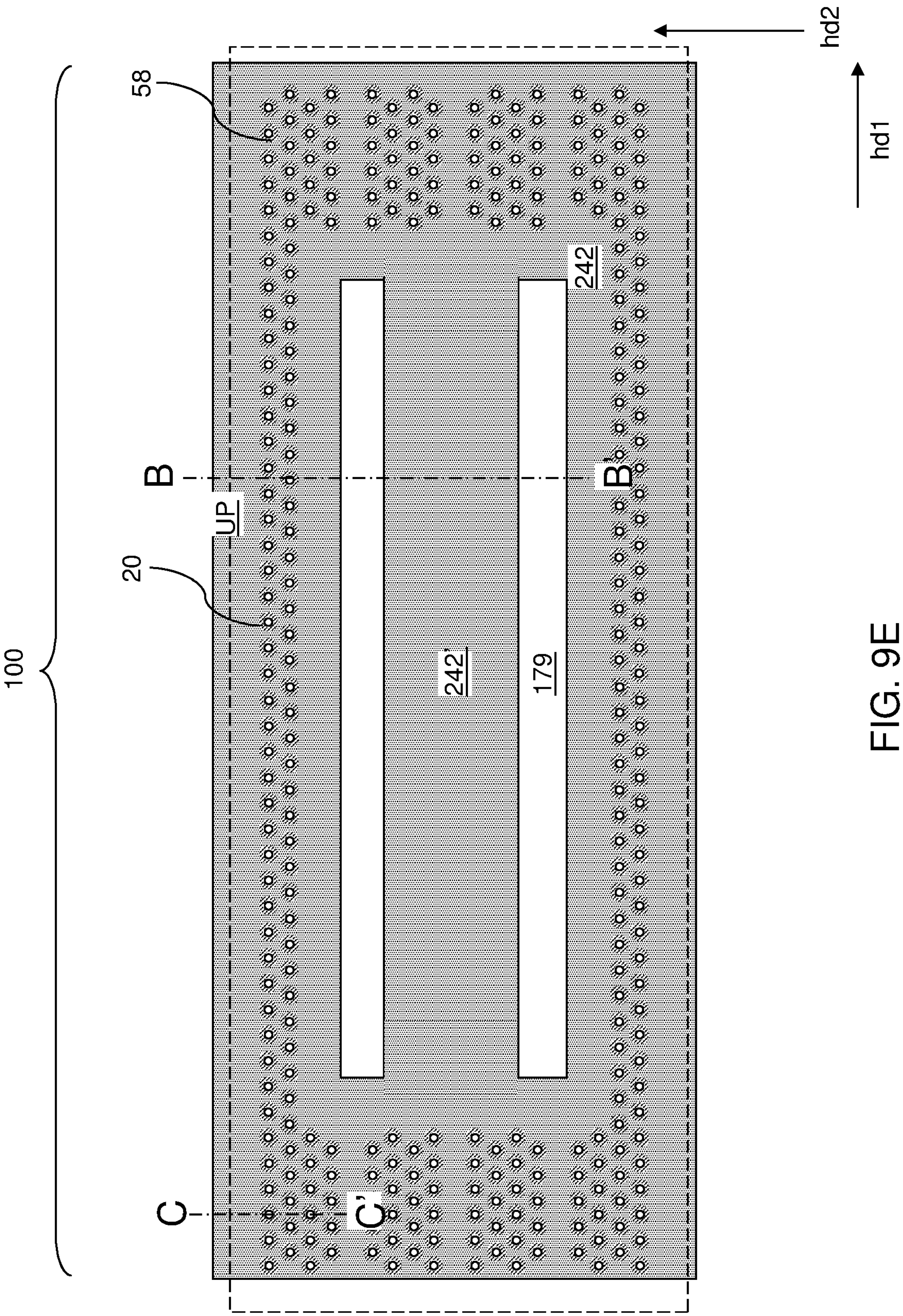

A photoresist layer (not shown) may be applied over the contact-level dielectric layer 280, and may be lithographically patterned to form moat-shaped within the area of the memory array region 100 in which memory opening fill structures 58 are not present. An anisotropic etch may be performed to form moat trenches 179 having substantially vertical sidewalls that extend through the contact-level dielectric layer 280, the second-tier structure (232, 242, 270, 265), and the first-tier structure (132, 142, 170, 165) underneath the moat-shaped openings in the photoresist layer. Each moat trench may vertically extend into the in-process source-level material layers 10', and at least partially laterally surround a periphery of a respective opening through the in-process source-level material layers 10'. The photoresist layer may be removed, for example, by ashing. In one embodiment shown in FIG. 9D, the moat trench 179 may be a closed structure which completely laterally surrounds a portion of the in-process alternating stack {(132, 142), (232, 242)}. In an alternative embodiment shown in FIG. 9E, the moat trench 179 may be an open structure which only partially surrounds the portion of the in-process alternating stack {(132, 142), (232, 242)}. For example, as shown in FIG. 9E, the moat trench surrounds the portion of the in-process alternating stack {(132, 142), (232, 242)} on two sides. Other configurations of the moat trench 179 may be used.

Generally, each moat trench 179 can be formed through the contact-level dielectric layer 280 and through the in-process alternating stack {(132, 142), (232, 242)}. Each set of contiguous material portions of the first-tier alternating stack (132, 142) and the second-tier alternating stack (232, 242) that are completely or partially laterally surrounded by the moat trench 179 comprise a vertically alternating sequence of first insulating plates 132', first dielectric material plates 142', second insulating plates 232', and second dielectric material plates 142'. Patterned portions of the first insulating layers 132 at least partially laterally surrounded by the moat trench comprise first insulating plates 132'. Patterned portions of the first sacrificial material layers 142 at least partially laterally surrounded by a moat trench—comprise first dielectric material plates 142'. A patterned portion of the first insulating cap layer 170 at least partially laterally surrounded by a first-tier moat trench comprises a first insulating cap plate 170'. A patterned portion of the inter-tier dielectric layer 180 at least partially laterally surrounded by a moat trench comprises an inter-tier dielectric plate 180'. Patterned portions of the first insulating layers 132 and the first sacrificial material layers 142 within each first-tier moat trench 179 comprise a first vertically alternating sequence of first insulating plates 132' and first dielectric material plates 142'. The first sacrificial material layers 142 and the first dielectric material plates 142' comprise a first dielectric material, such as silicon nitride.

Patterned portions of the second insulating layers 232 at least partially laterally surrounded by a moat trench comprise second insulating plates 232'. Patterned portions of the second sacrificial material layers 242 at least partially laterally surrounded by a moat trench comprise second dielectric material plates 242'. A patterned portion of the second insulating cap layer 270 at least partially laterally surrounded by a second-tier moat trench comprises a second insulating cap plate 270'. Patterned portions of the second insulating layers 232 and the second sacrificial material layers 242 within each second-tier moat trench comprise a second vertically alternating sequence of second insulating plates 232' and second dielectric material plates 242'. The second sacrificial material layers 242 and the second dielectric material plates 242' comprise a second dielectric material, such as silicon nitride. The second dielectric material may be the same as the first dielectric material. Each vertically alternating sequence of insulating plates (132', 232') and dielectric material plates (142', 242') is laterally surrounded by alternating stack of insulating layers (132, 232) and sacrificial material layers (142, 242).

FIGS. 10A-10E are sequential vertical cross-sectional views of a region of the exemplary structure during formation of a dielectric moat fill structure 176 within each moat trench 179 according to an embodiment of the present disclosure.

Figure 10A:
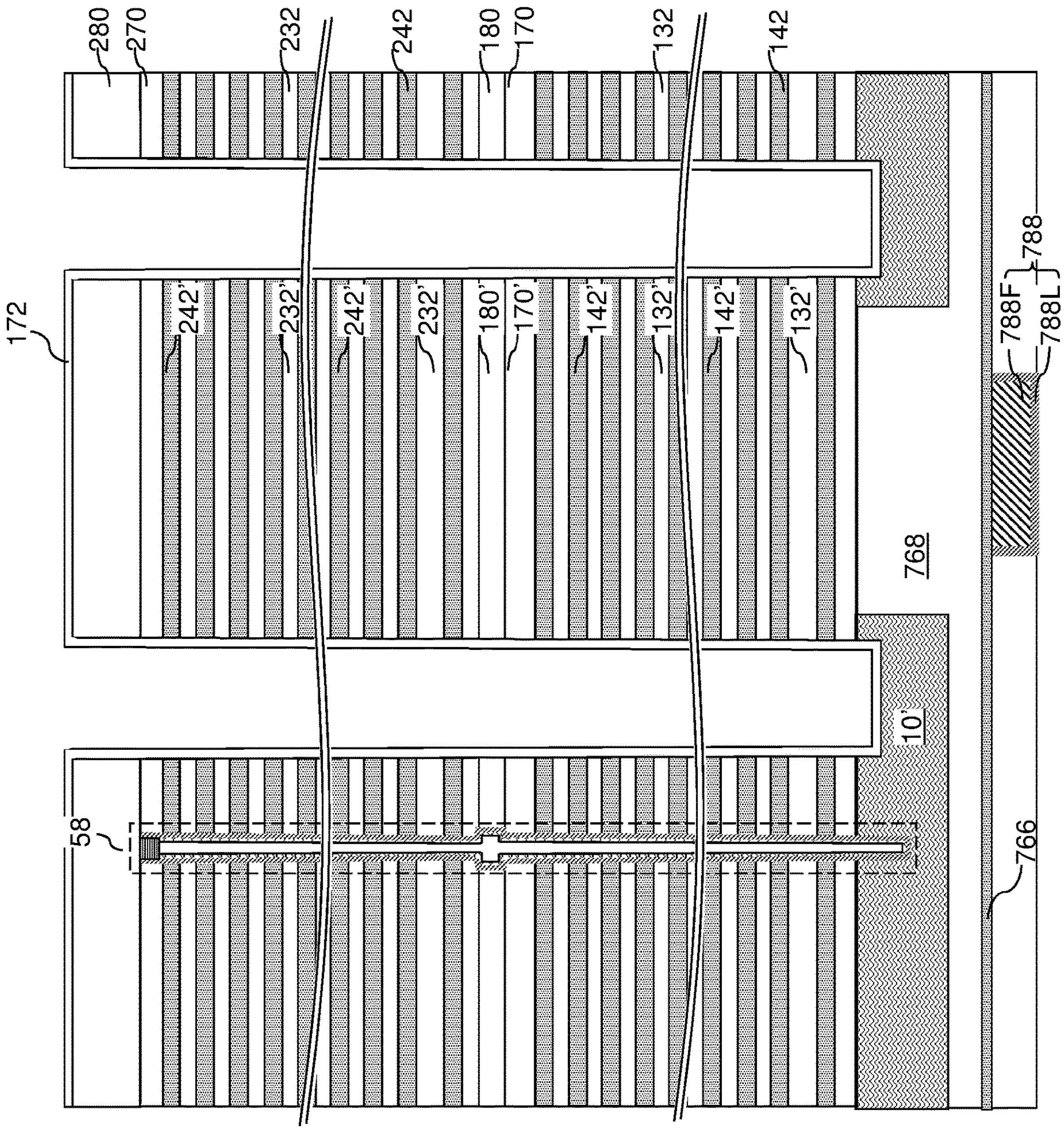
FIGS. 10A-10E are sequential vertical cross-sectional views of a region of the exemplary structure during formation of a dielectric moat fill structure according to an embodiment of the present disclosure.

Referring to FIG. 10A, a conformal dielectric liner 172 can be deposited on sidewalls of the moat trench 179, on physically exposed surfaces of the in-process source-level material layers 10', and over the top surface of the contact-level dielectric layer 280. The conformal dielectric liner 172 includes a first dielectric material that is different from the dielectric material of the sacrificial material layers (142, 242). The conformal dielectric liner 172 may comprise any dielectric material that protects the moat trench 179 during subsequent replacement of the sacrificial material layers (142, 242) with electrically conductive layers (146, 246) as will be described below with respect to FIGS. 18A to 19C. The Young's modulus of the first dielectric material of the conformal dielectric liner 172 is herein referred to as a first Young's modulus. For example, the conformal dielectric liner 172 may comprise, and/or may consist essentially of, a silicon oxide material. In this case, the first Young's modulus may be in a range from 55 GPa to 85 GPa, such as 65 GPa to 75 GPa, and is affected by the processing parameters of the deposition method. The conformal dielectric liner 172 can be formed by a conformal deposition process such as a chemical vapor deposition process or an atomic layer deposition process. The thickness of the conformal dielectric liner 172 may be in a range from 3 nm to 50 nm, such as from 6 nm to 30 nm, although lesser and greater thicknesses may also be employed. In one embodiment, each vertically-extending portion of the conformal dielectric liner 172 may have a uniform lateral thickness, which is herein referred to as first uniform lateral thickness.

Figure 10B:
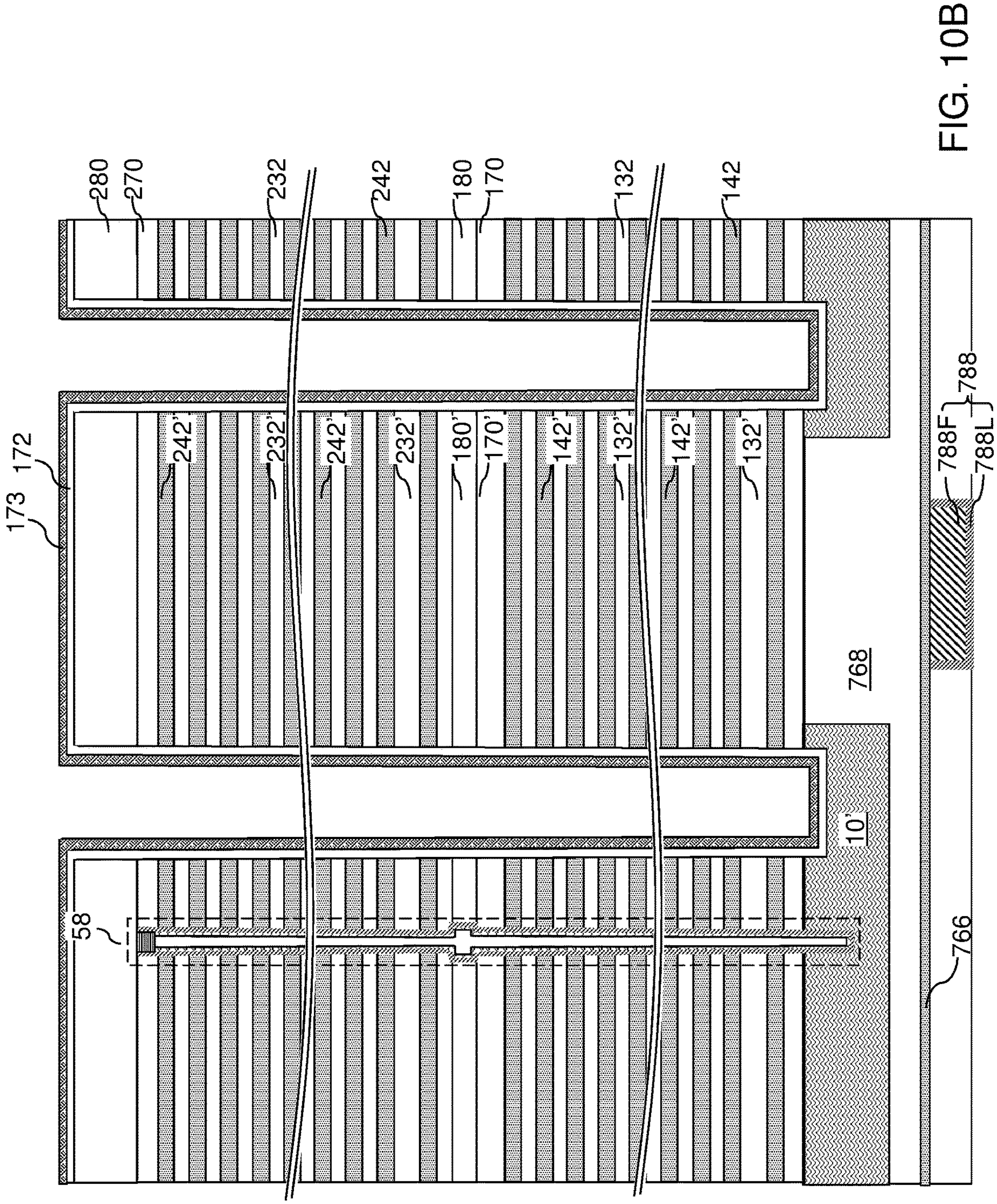

Referring to FIG. 10B, a second liner 173 can be deposited over the conformal dielectric liner 172. The second liner 173 includes a second material that has a higher Young's modulus than the first Young's modulus of the conformal dielectric liner 172. The Young's modulus of the second material of the second liner 173 is herein referred to as a second Young's modulus. According to an aspect of the present disclosure, the second material and the first dielectric material are selected such that the second Young's modulus is at least twice the first Young's modulus. In one embodiment, the second material of the second liner 173 may comprise, and/or may consist essentially of a second dielectric material having a higher Young's modulus than silicon oxide. The second dielectric material may comprise silicon nitride, silicon oxynitride or dielectric metal oxide, such as aluminum oxide, hafnium oxide, tantalum oxide, titanium oxide, zirconium oxide, lanthanum oxide, yttrium oxide, or alloys or stacks thereof. For example, Young's modulus of silicon nitride may be in a range from 140 GPa to 310 GPa depending on the deposition methods and process parameters employed in the deposition process. Alternatively, the second material of the second liner 173 may comprise a semiconducting or conductive material, such as for example, polysilicon. For example, Young's modulus of silicon may be in a range from 125 GPa to 200 GPa depending on the deposition methods and process parameters employed in the deposition process.

The second liner 173 can be formed by a conformal deposition process such as a chemical vapor deposition process or atomic layer deposition. The thickness of the second liner 173 may be in a range from 10 nm to 50 nm, such as from 20 nm to 30 nm, although lesser and greater thicknesses may also be employed. Each vertically-extending portion of the second liner 173 may have a uniform lateral thickness, which is herein referred to as a second uniform lateral thickness. In one embodiment, the thickness of the second liner 173 may be in a range from 3% to 25% of the width of a moat trench 179. According to an embodiment of the present disclosure, the thickness of the second liner 173 may be selected such that the second liner 173 provides sufficient mechanical strength to the in-process alternating stack {(132, 142), (232, 242)} and the vertically alternating sequences of insulating plates (132', 232') and dielectric material plates (142', 242').

Figure 10C:
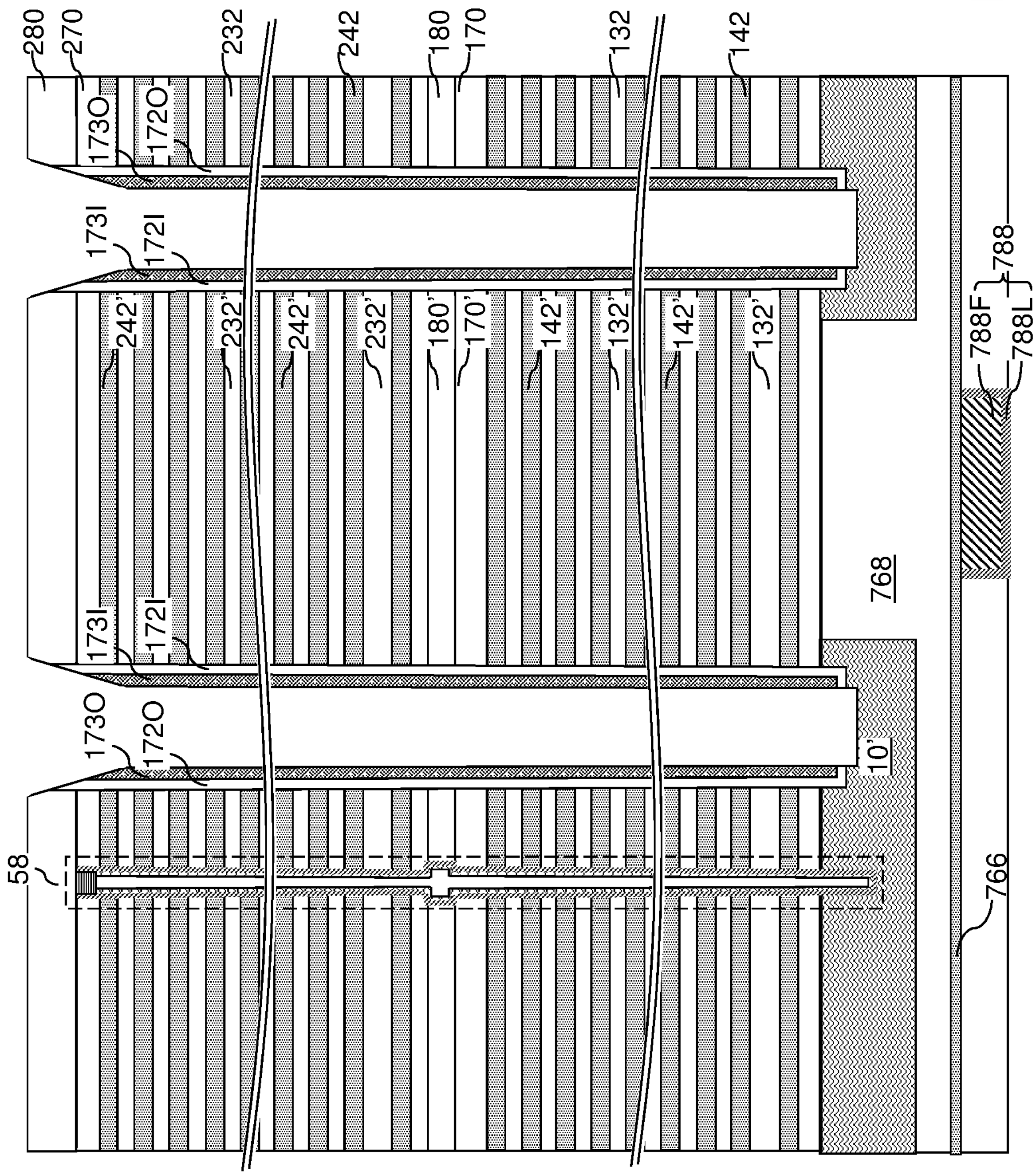
Figure 10D:
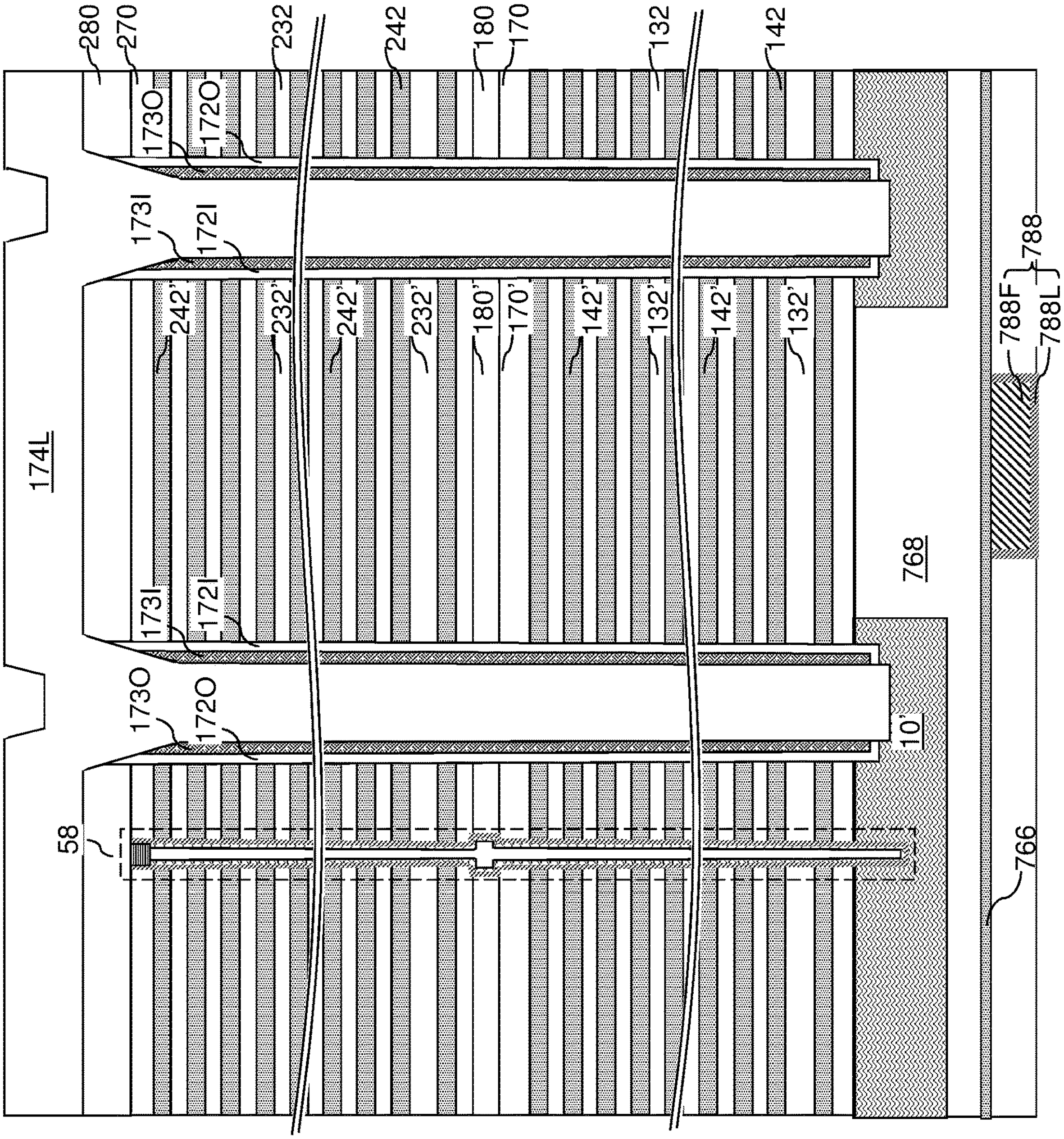

Referring to FIG. 10C, an etch process can be performed to remove horizontally-extending portions of the first dielectric material of the conformal dielectric liner 172 and the second liner 173. The etch process may comprise a taper etch process which provides a combination of a vertical direction etch mechanism and an isotropic lateral etch mechanism so that the etch rate along the vertical direction is greater than a non-zero etch rate along the horizontal direction (i.e., a collateral horizontal etch rate).

Remaining portions of the conformal dielectric liner 172 that remain in each moat trench 179 may comprise an outer dielectric liner 172O and an inner dielectric liner 172I. The outer dielectric liner 172O and the inner dielectric liner 172I comprise, and/or consist essentially of, the first dielectric material having the first Young's modulus.

Remaining portions of the second liner 173 that remain in each moat trench 179 may comprise an outer material layer 173O and an inner material layer 173I. The outer material layer 173O and the inner material layer 172I comprise, and/or consist essentially of, the second material having the second Young's modulus, as described above.

In one embodiment, the etch process collaterally etches (e.g., taper etches) portions of the contact-level dielectric layer 280 that is proximal to the conformal dielectric liner 172. In this case, the second etch process can remove portions of the conformal dielectric liner 172 in an upper region of each moat trench 179, and widens a portion of the moat trench 179 in the upper region of the contact-level dielectric layer 280 over the outer material layer 173O, the inner material layer 173I, the outer dielectric liner 172O, and the inner dielectric liner 172I. In this case, each moat trench 179 may comprise a tapered flare region at an upper level of the contact-level dielectric layer 280. The flare region can overlie an annular top surface of the inner dielectric liner 172I and an annular top surface of the outer dielectric liner 172O. As used herein, a flare region refers to a tapered region having gradual widening of a lateral dimension. Each of the outer dielectric liner 172O and the inner material layer 172I may have the first uniform lateral thickness throughout. Each of the outer dielectric liner 172O and the inner material layer 172I may have a respective tubular configuration. In one embodiment, the top portions of the outer material layer 173O and the inner material layer 173I in each moat trench 179 may also have a respective tapered top surface segment. In this case, each of the outer material layer 173O and the inner material layer 173I may have an upper region having a variable thickness that increases with a distance from the horizontal plane including the top surface of the contact-level dielectric layer 280. A predominant portion of each of the outer material layer 173O and the inner material layer 173I that includes a lower region having a uniform lateral thickness throughout. Each of the outer material layer 173O and the inner material layer 173I may have a respective tubular configuration.

Figure 10E:
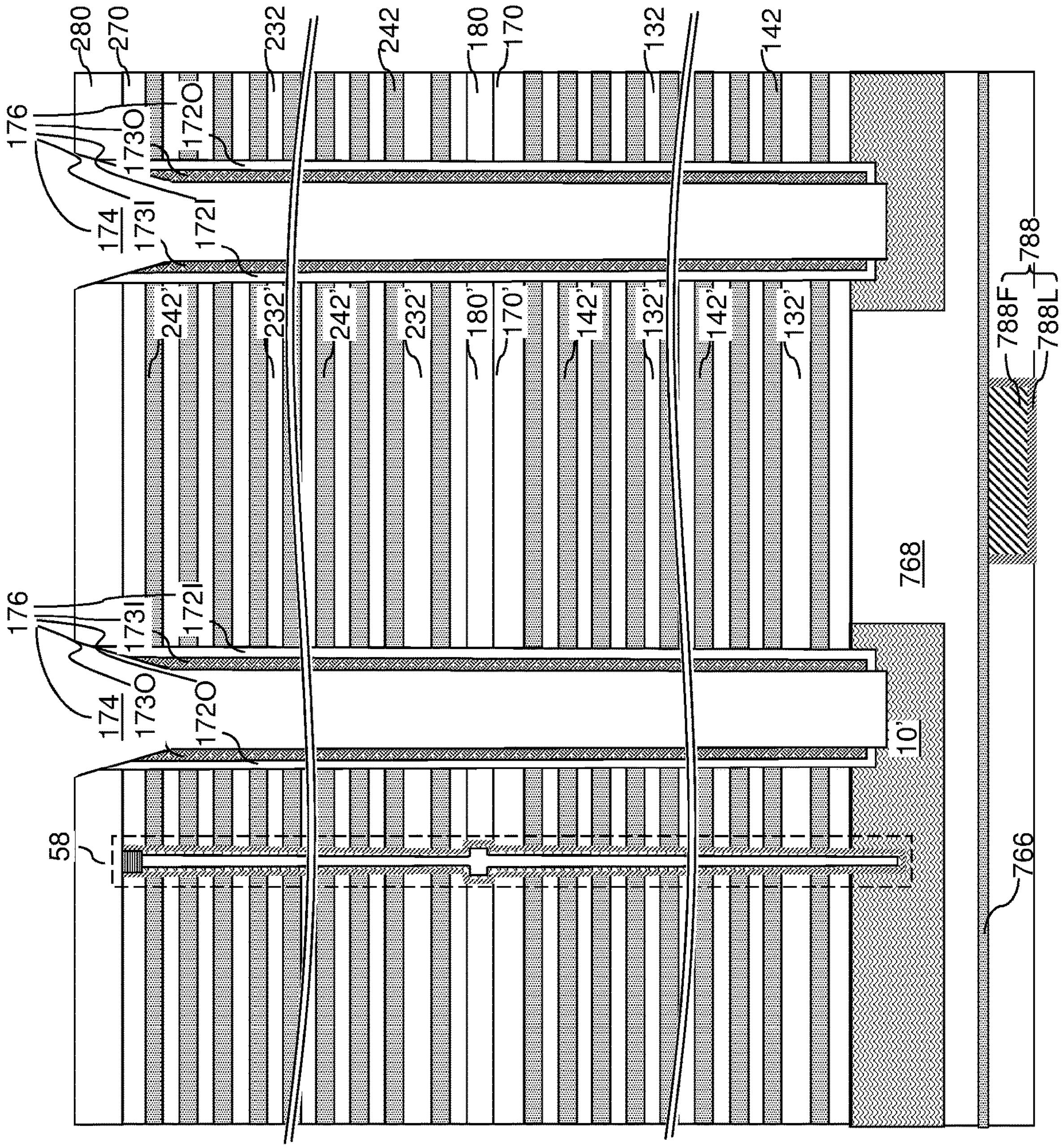

Referring to FIG. 10E, a dielectric fill material (which is herein referred to as a third dielectric material) can be deposited in remaining volumes of the moat trenches 179 and over the contact-level dielectric layer 280 by a conformal deposition process (such as low pressure chemical vapor deposition) or a self-planarizing deposition process (such as spin coating) to form a dielectric fill material layer 174L. The third dielectric material may comprise a dielectric material that provides good gap fill characteristic. The Young's modulus of the third dielectric material of the dielectric fill material layer 174L is herein referred to as a third Young's modulus. In one embodiment, the third dielectric material may comprise silicon oxide. In this case, the third Young's modulus may be in a range from 55 GPa to 85 GPa, such as 65 GPa to 75 GPa, and is affected by the processing parameters of the deposition method. Thus, the second Young's modulus is preferably higher than both the first and the third Young's modulus. The first Young's modulus may have the same value or a different value from the third Young's modulus. The second material of the outer material layer 173O is sandwiched between the outer dielectric liner 172O and dielectric fill material layer 174L. The inner material layer 173I is sandwiched between the inner dielectric liner 172I and the dielectric fill material layer 174L. Therefore, the second material does not contact the sacrificial material layers (142, 242) which will be replaced with electrically conductive layers. Therefore, the second material may be a dielectric, semiconducting or conductive material without creating short circuits with the to be formed electrically conductive layers.

Referring to FIGS. 10E and 11A-11E, excess portions of the third dielectric material may be removed from above the top surface of the contact-level dielectric layer 280 by a planarization process. The planarization process may comprise a chemical mechanical polishing (CMP) process and/or a recess etch process. Each remaining portions of the dielectric material in the moat trenches constitute a dielectric fill material portion 174. The dielectric fill material portion 174 has a tubular configuration, i.e., is topologically homeomorphic to a torus.

Each set of dielectric material portions that fills a moat trench 179 is herein referred to as a dielectric moat fill structure 176. According to an aspect of the present disclosure, each dielectric moat fill structure 176 comprises a nested structure including, from outside to inside, an outer dielectric liner 172O having a first Young's modulus, an outer material layer 173O having a second Young's modulus, a dielectric fill material portion 174 having a third Young's modulus, an inner material layer 173I having the second Young's modulus, and an inner dielectric liner 172I having the first Young's modulus. Each of the outer dielectric liner 172O, the outer material layer 173O, the dielectric fill material portion 174, the inner material layer 173I, and the inner dielectric liner 172I has a respective tubular configuration having a respective contiguous set of at least one inner sidewall and a respective contiguous set of at least one outer sidewall.

A vertically alternating sequence {(132', 142'), (232', 242')} of insulating plates (132', 232') and dielectric material plates (142', 242') is at least partially laterally surrounded by each dielectric moat fill structure 176. An inner sidewall of the dielectric moat fill structure 176 contacts each of the insulating plates (132', 232') and each of the dielectric material plates (142', 242') within the vertically alternating sequence {(132', 142'), (232', 242')}. Each dielectric moat fill structure 176 is laterally surrounded by the in-process alternating stack {(132, 142), (232, 242)}, and has at least one outer sidewall that contacts each of the insulating layers (132, 232) within the in-process alternating stack {(132, 142), (232, 242)}.

In one embodiment, the second Young's modulus is greater than twice the first Young's modulus. In one embodiment, the inner dielectric liner 172I and the outer dielectric liner 172O consist essentially of a first dielectric material, and the inner material layer 173I and the outer material layer 173O consist essentially of a second material different from the first dielectric material. In one embodiment, the first dielectric material consists essentially of a silicon oxide material, and the second material consists essentially of a material selected from silicon, silicon nitride or a dielectric metal oxide.

In one embodiment, each of the inner dielectric liner 172I and the outer dielectric liner 172O has a first lateral thickness throughout, and each of the inner material layer 173I and the outer material layer 173O comprises a respective uniform thickness region having a second lateral thickness and extending vertically. In one embodiment, each of the inner material layer 173I and the outer material layer 173O comprises a respective tapered region adjoined to a top end of the respective uniform thickness region and having an increasing thickness that increases from top to bottom.

The contact-level dielectric layer 280 overlies the in-process alternating stack {(132, 142), (232, 242)} and has a top surface that is located within a same horizontal plane as a top surface of the dielectric moat fill structure 176. In one embodiment, the dielectric fill material portion 174 comprises a tapered flare region in contact with the contact-level dielectric layer 280 and contacting an annular top surface of the inner dielectric liner 172I and contacting an annular top surface of the outer dielectric liner 172O. In one embodiment, a top portion of the dielectric fill material portion 174 vertically extends above topmost surfaces of the inner dielectric liner 172I, the inner material layer 173I, the outer material layer 173O, and the outer dielectric liner 172O. In one embodiment, a bottom portion of the dielectric fill material portion 174 vertically extends below bottommost surfaces of the inner dielectric liner 172I, the inner material layer 173I, the outer material layer 173O, and the outer dielectric liner 172O.

Figure 11A:
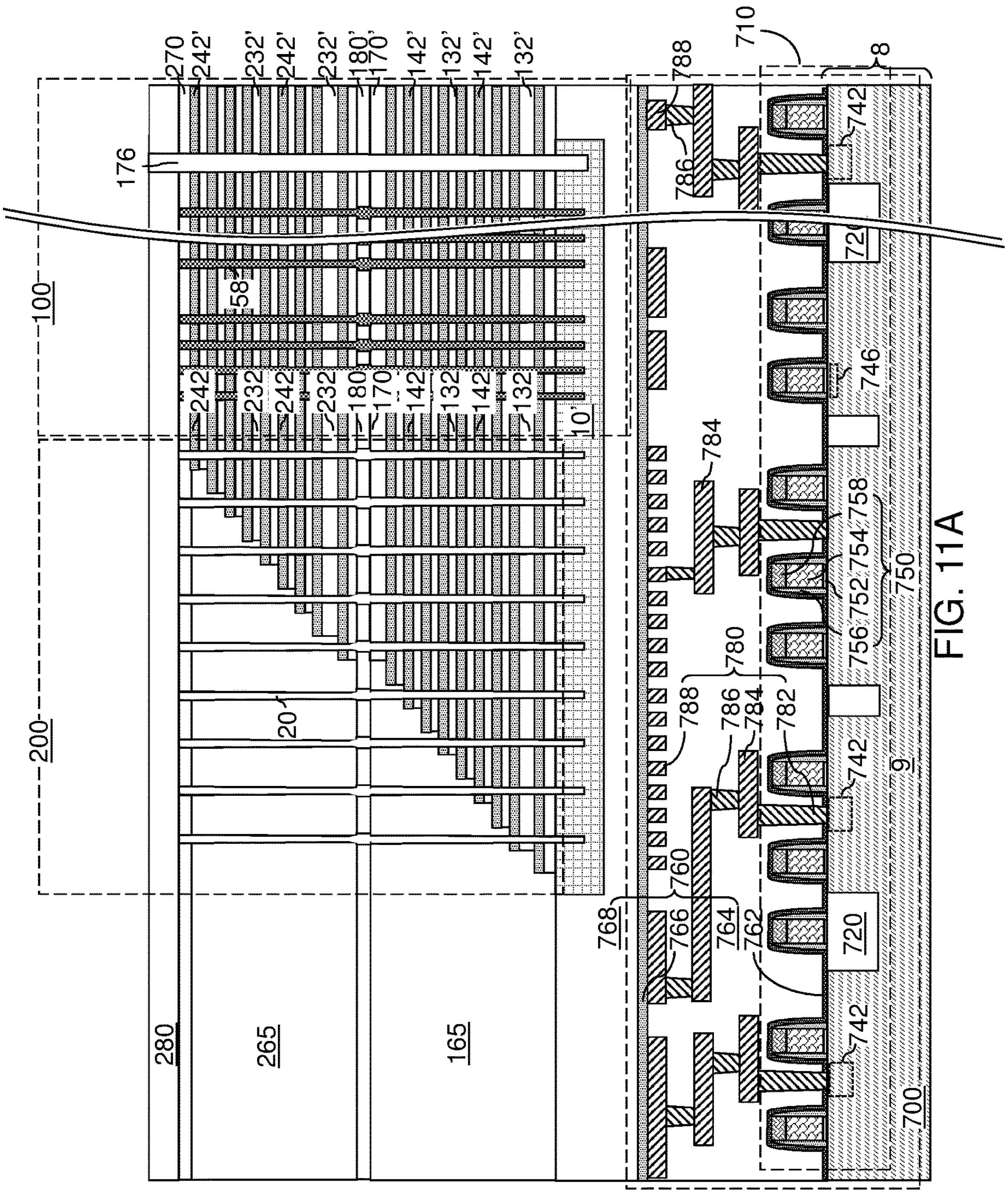
FIG. 11A is a vertical cross-sectional view of the exemplary structure after formation of the dielectric moat fill structure according to an embodiment of the present disclosure.
Figure 11B:
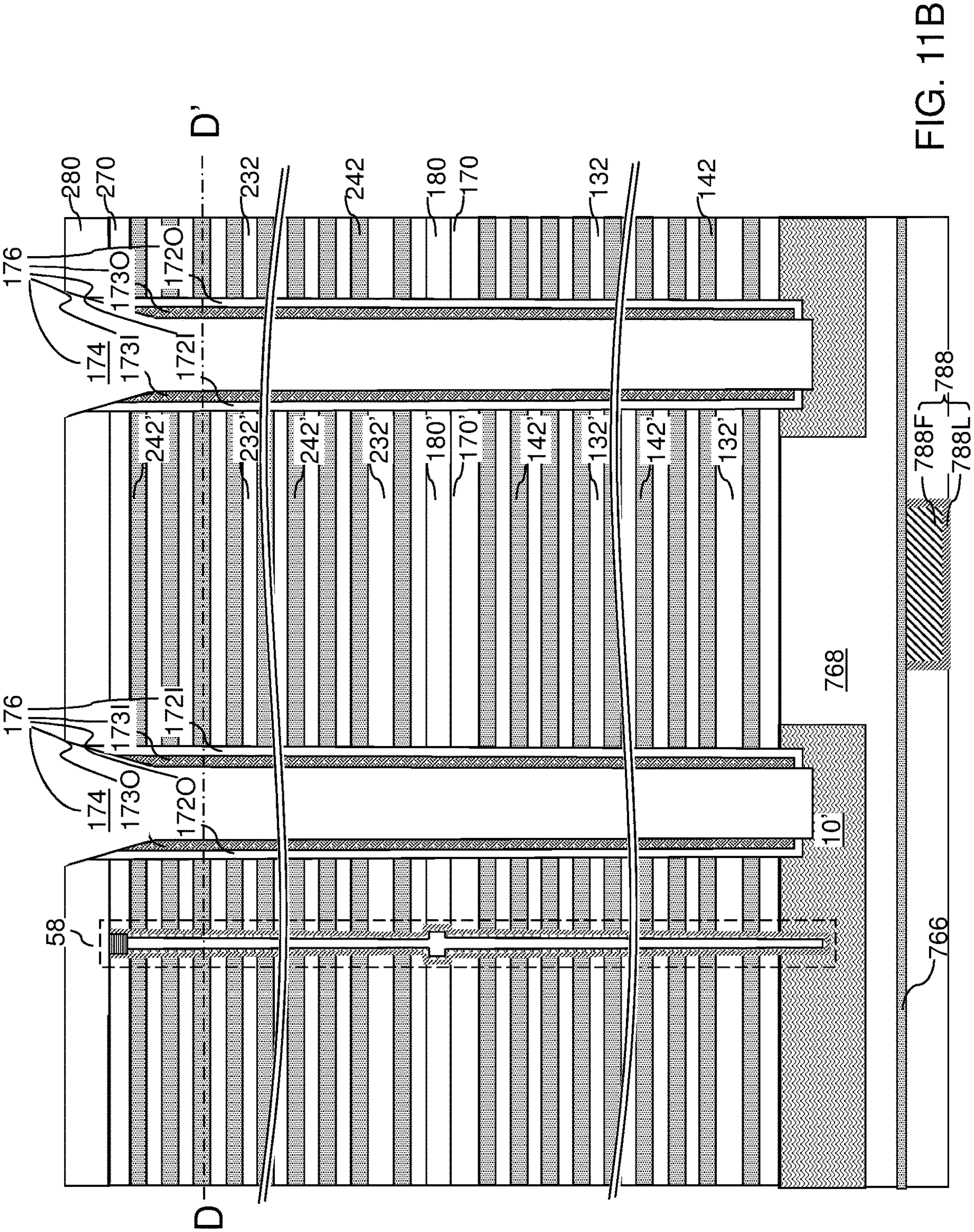
FIG. 11B is another vertical cross-sectional view of the exemplary structure of FIG. 11A.
Figure 11C:
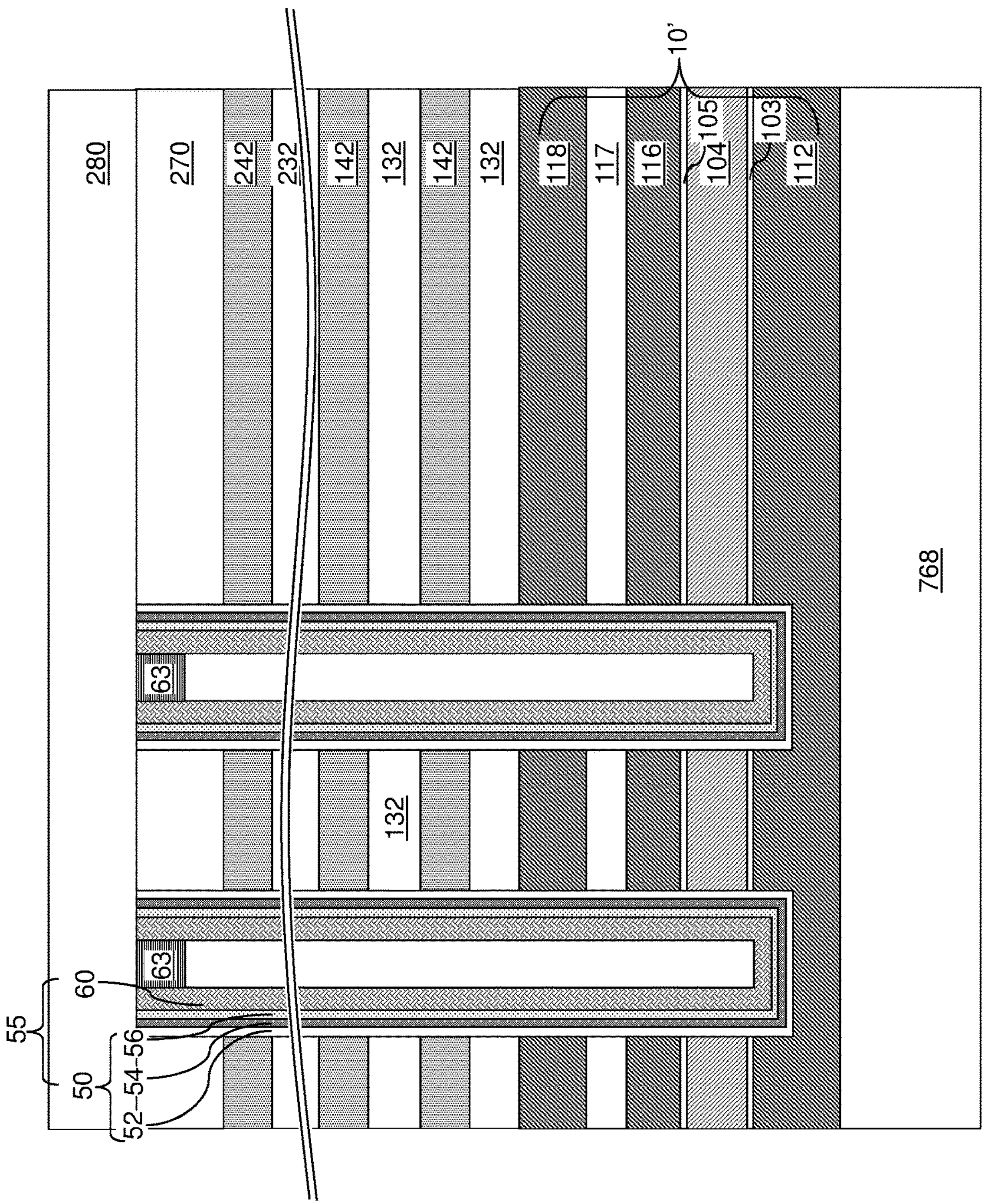
FIG. 11C is yet another vertical cross-sectional view of the exemplary structure of FIGS. 11A and 11B.
Figure 11D:
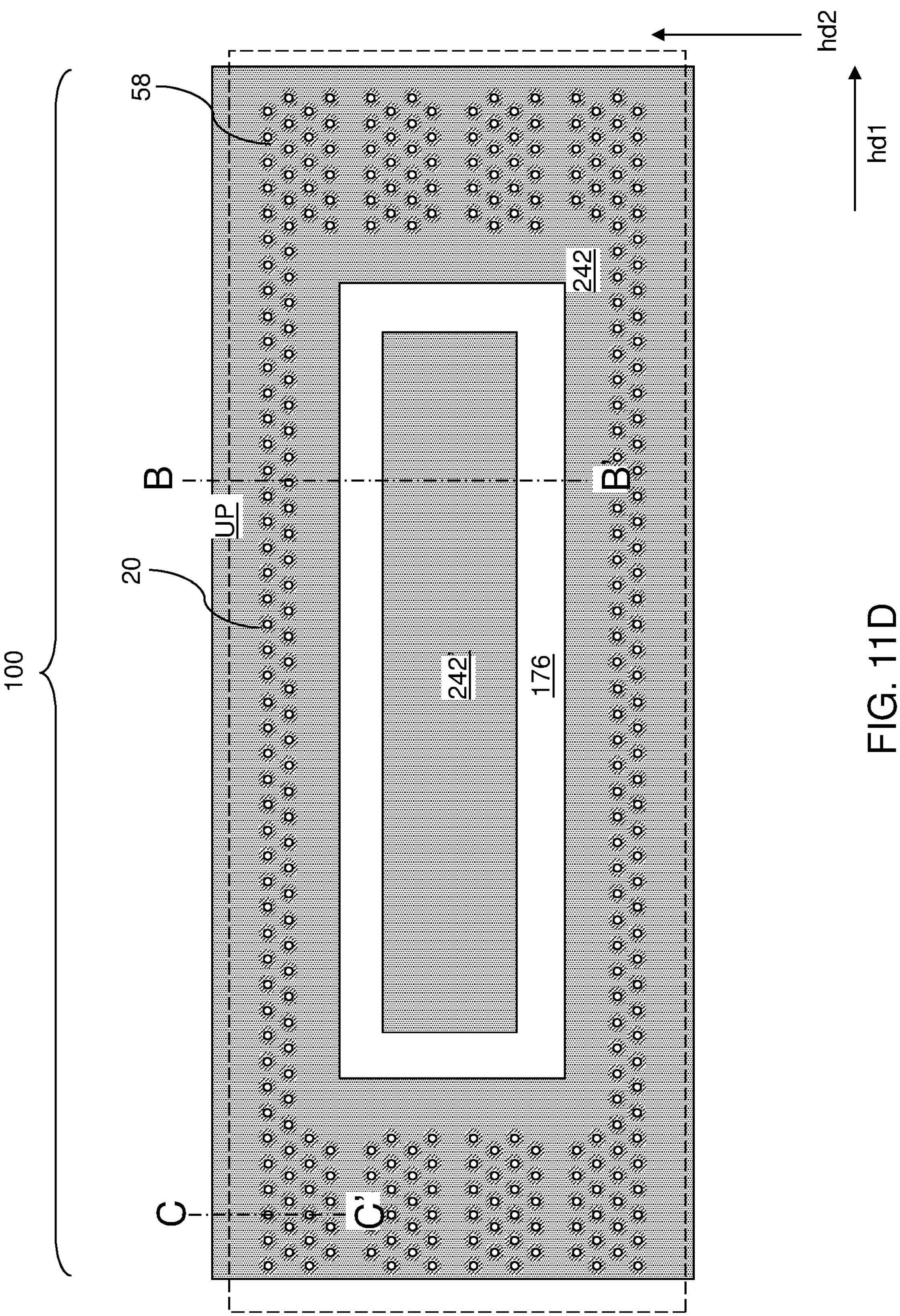
FIGS. 11D and 11E are alternative horizontal cross-sectional views along the horizontal plane D-D' of FIG. 11B. The vertical cross-sectional plane B-B' is the plane of the vertical cross-section of FIG. 11B. The vertical cross-sectional plane C-C' is the plane of the vertical cross-section of FIG. 11C.
Figure 11E:
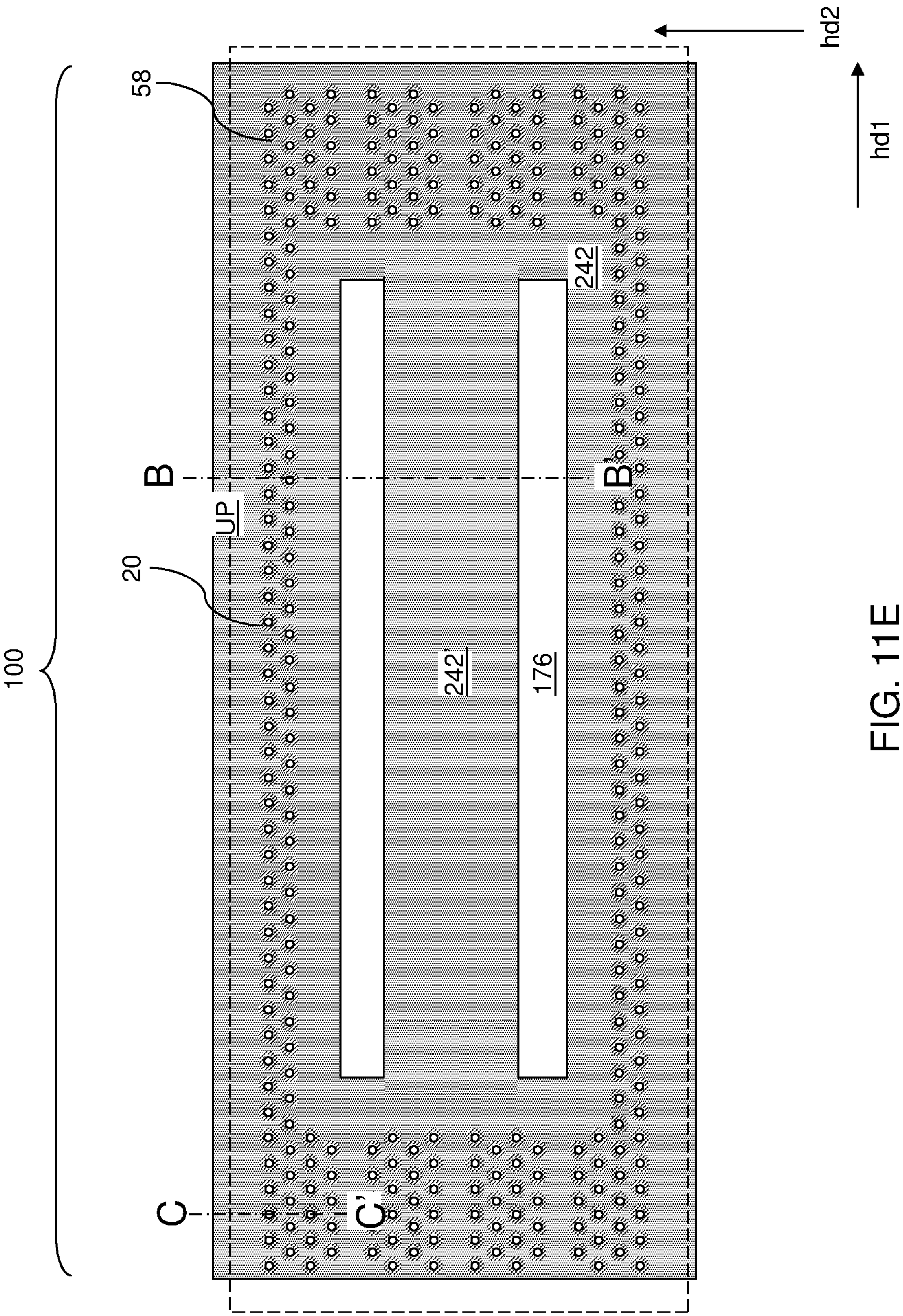
Figure 12A:
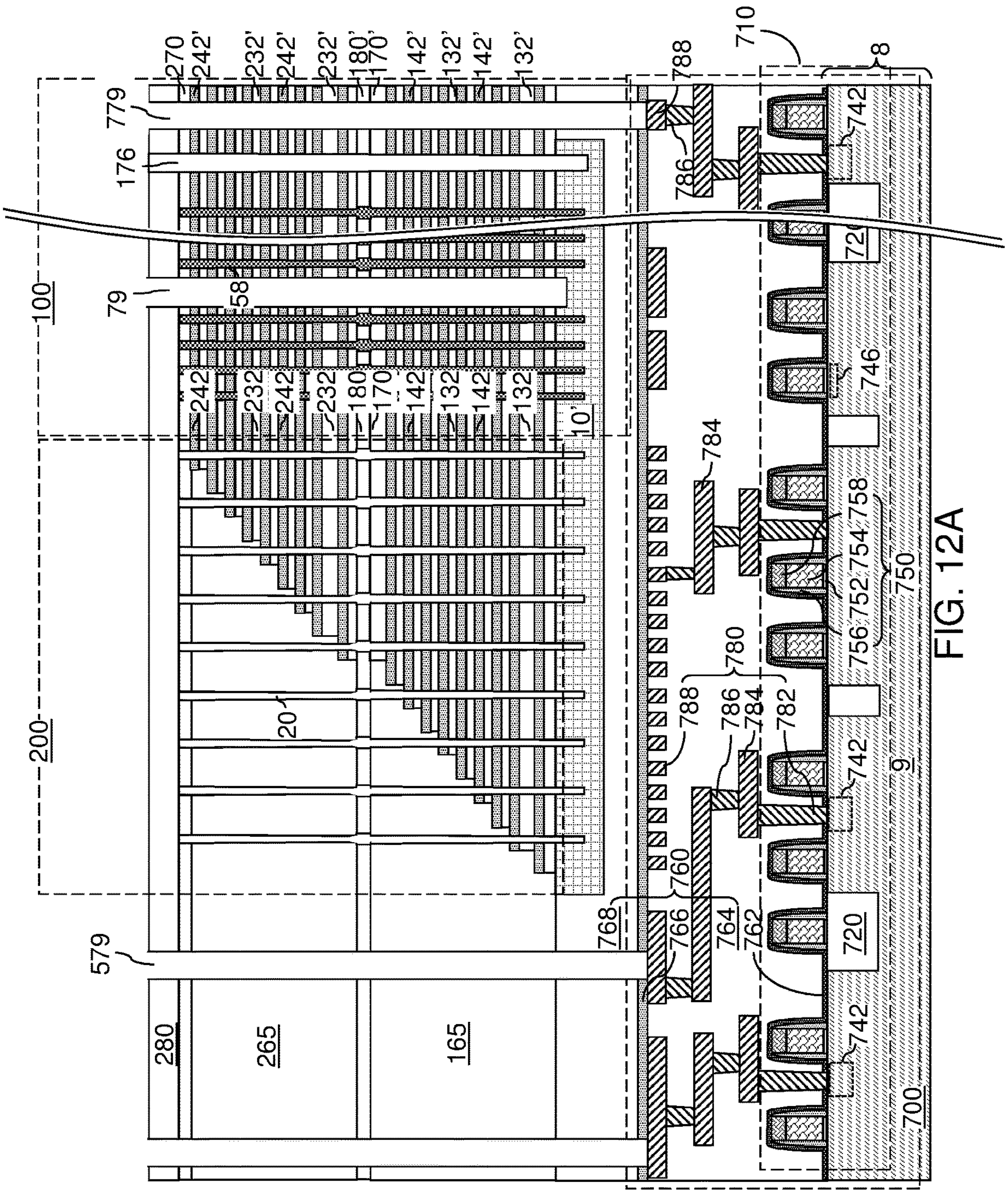
FIG. 12A is a vertical cross-sectional view of the exemplary structure after formation of backside trenches and through-memory-level via cavities according to an embodiment of the present disclosure.
Figure 12B:
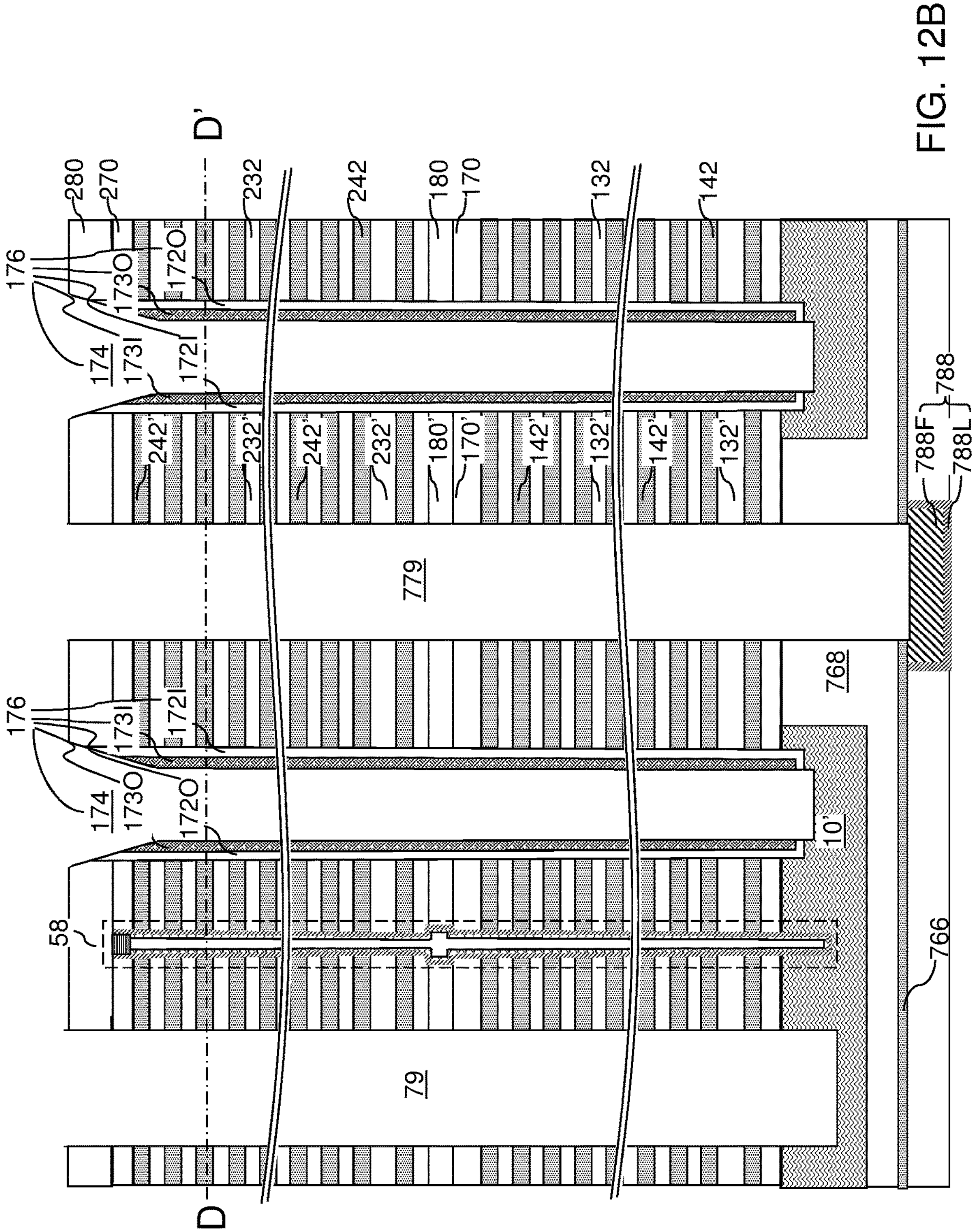
FIG. 12B is another vertical cross-sectional view of the exemplary structure of FIG. 11A.
Figure 12C:
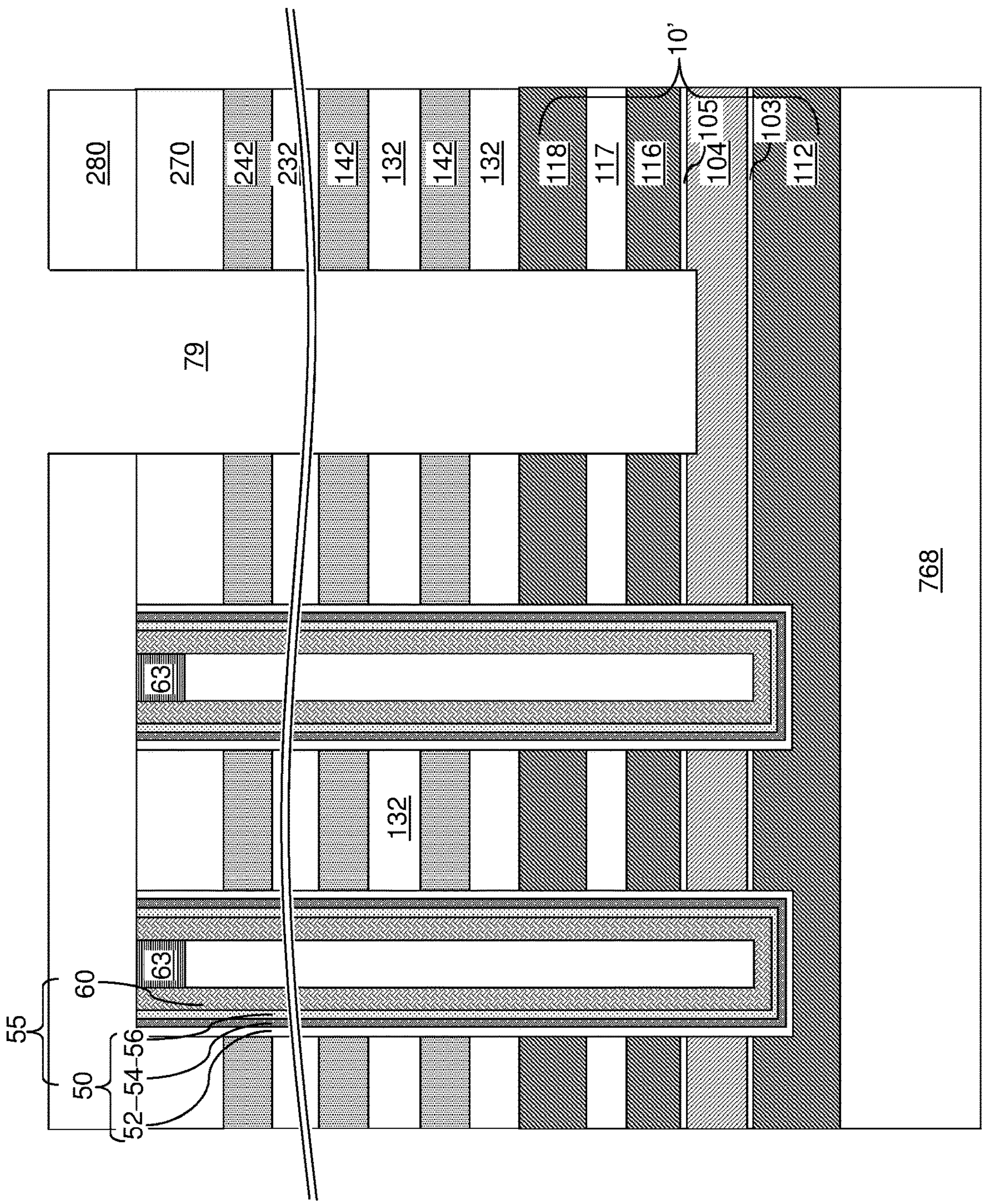
FIG. 12C is yet another vertical cross-sectional view of the exemplary structure of FIGS. 12A and 12B.
Figure 12D:
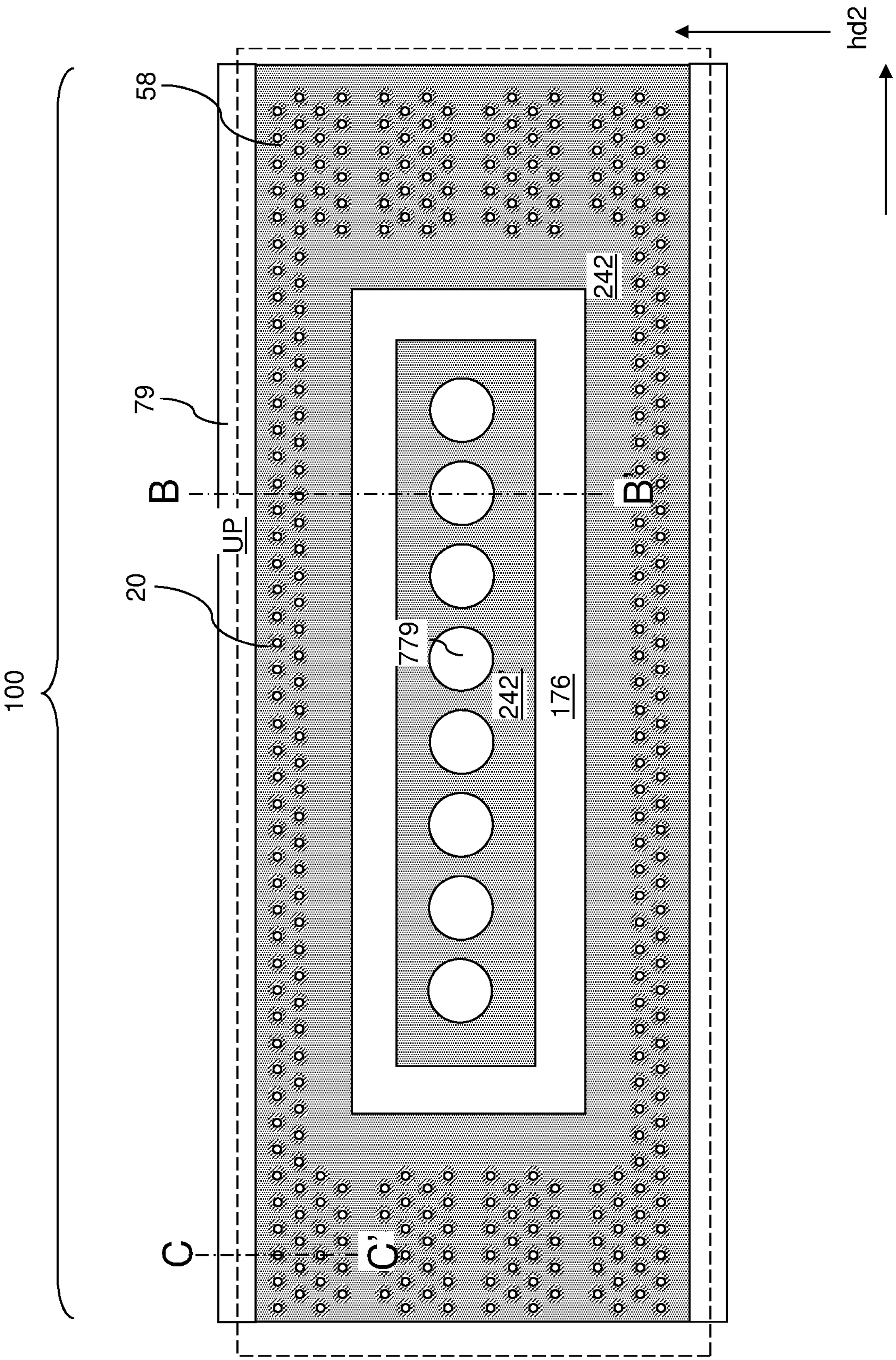
FIGS. 12D and 12E are alternative is a horizontal cross-sectional views along the horizontal plane D-D' of FIG. 12B. The vertical cross-sectional plane B-B' is the plane of the vertical cross-section of FIG. 12B. The vertical cross-sectional plane C-C' is the plane of the vertical cross-section of FIG. 12C.
Figure 12E:
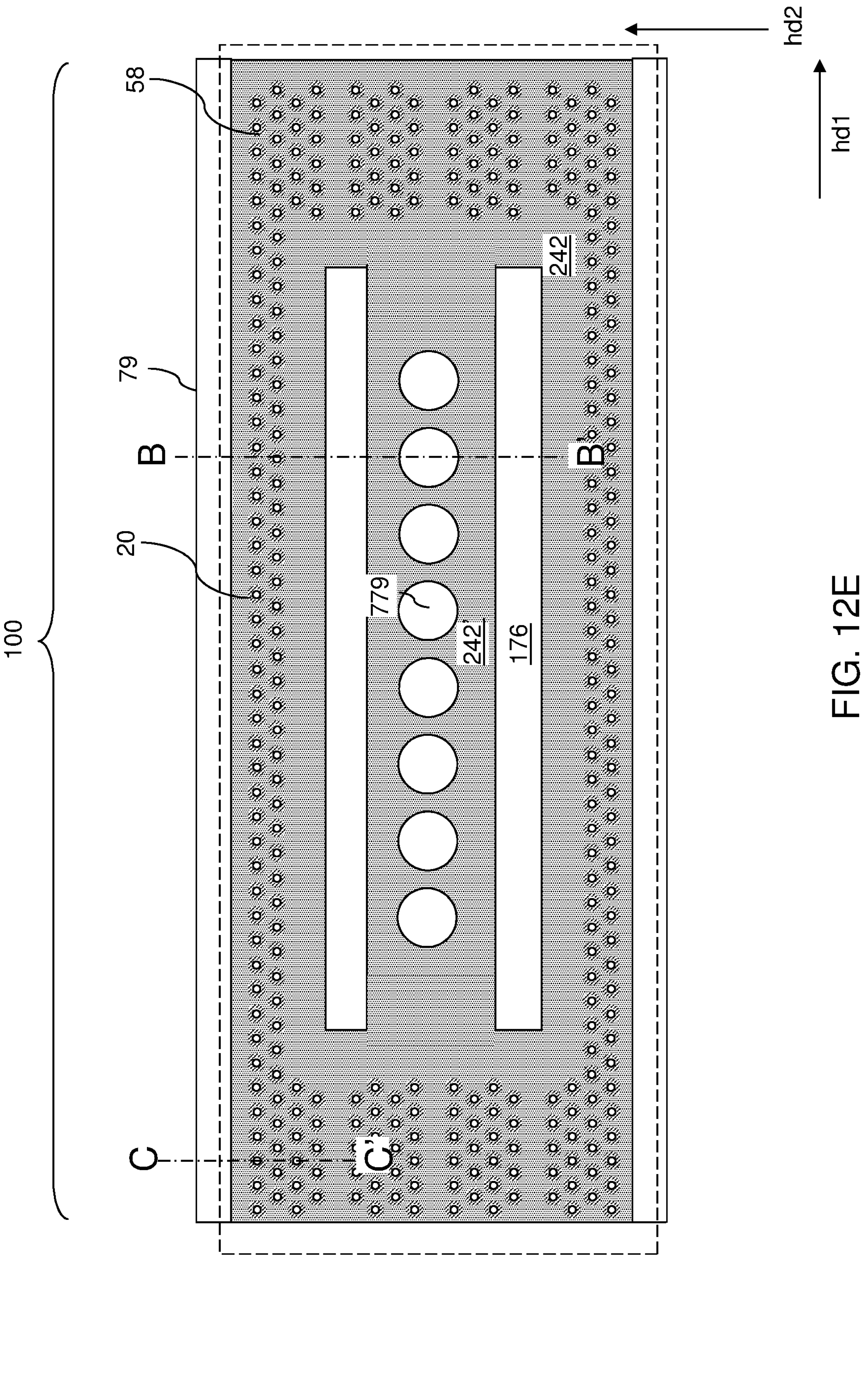

In one embodiment shown in FIG. 11D, each dielectric moat fill structures 176 can have a horizontal cross-sectional shape of a rectangular frame. In this case, the outer sidewalls of each dielectric moat fill structures 176 can include a pair of lengthwise sidewalls that laterally extend along the first horizontal direction hd1 and a pair of widthwise sidewalls that laterally extend along the second horizontal direction hd2. The inner sidewalls of each dielectric moat fill structures 176 can include a pair of lengthwise sidewalls that laterally extend along the first horizontal direction hd1 and a pair of widthwise sidewalls that laterally extend along the second horizontal direction hd2. In another embodiment shown in FIG. 11E, each dielectric moat fill structures 176 can have a horizontal cross-sectional shape of a pair of lengthwise sidewalls that laterally extend along the first horizontal direction hd1.

Each of the first insulating plates 132' can be vertically spaced from the top surface of the in-process source-level material layers 10' by a same vertical distance as a respective first insulating layer 132 in the first-tier alternating stack is from the top surface of the in-process source-level material layers 10'. Each of the first dielectric material plates 142' can be vertically spaced from the top surface of the in-process source-level material layers 10' by a same vertical distance as a respective first sacrificial material layer 142 in the first-tier alternating stack is from the top surface of the in-process source-level material layers 10'. Each of the second insulating plates 232' can be vertically spaced from the top surface of the in-process source-level material layers 10' by a same vertical distance as a respective second insulating layer 232 in the second-tier alternating stack is from the top surface of the in-process source-level material layers 10'. Each of the second dielectric material plates 242' can be vertically spaced from the top surface of the in-process source-level material layers 10' by a same vertical distance as a respective second sacrificial material layer 242 in the second-tier alternating stack is from the top surface of the in-process source-level material layers 10'.

Referring to FIGS. 12A-12E, a photoresist layer (not shown) can be applied over the contact-level dielectric layer 280, and can be lithographically patterned to form line-shaped openings and discrete openings. The line-shaped openings laterally extend along the first horizontal direction hd1 with a respective uniform width, and may be repeated along the second horizontal direction hd2 with a periodicity that is equal to the width of the unit pattern UP along the second horizontal direction hd2. A first subset of the discrete openings in the photoresist layer may be formed over a respective vertically alternating sequence of insulating plates (132', 232') and dielectric material plates (142', 242'). A second subset of the discrete openings in the photoresist layer may be formed over the retro-stepped dielectric material portions (165, 265). Each of the discrete openings in the photoresist layer may be formed entirely within an area of a respective one of the metal pad structures 788.

An anisotropic etch process can be performed to etch unmasked portions of the contact-level dielectric layer 280, the alternating stacks {(132, 142), (232, 242)} and intervening material layers (170, 180) therebetween, and upper regions of the in-process source-level material layers 10'. A terminal step of the anisotropic etch process may be selective to the metallic material of the metal pad structures 788 and/or selective to the semiconductor material of the source-level sacrificial layer 104.

Backside trenches 79 may be formed underneath the line-shaped openings in the photoresist layer through the contact-level dielectric layer 280, the second-tier structure (232, 242, 270, 265), and the first-tier structure (132, 142, 170, 165), and into the in-process source-level material layers 10'. Portions of the contact-level dielectric layer 280, the second-tier structure (232, 242, 270, 265), the first-tier structure (132, 142, 170, 165), and the in-process source-level material layers 10' that underlie the line-shaped openings in the photoresist layer may be removed to form the backside trenches 79. In one embodiment, the backside trenches 79 may be formed between groups of memory opening fill structures 58 that are laterally spaced apart along the second horizontal direction hd2. A top surface of a source-level sacrificial layer 104 may be physically exposed at the bottom of each backside trench 79. The backside trenches 79 are laterally spaced from the dielectric moat fill structures 176.

First through-memory-level via cavities 779 can be formed through a respective one of the vertical alternating sequences of insulating plates (132', 232') and dielectric material plates (142', 242'). Each first through-memory-level via cavity 779 can vertically extend through each plate within a respective vertically alternating sequence of insulating plates (132', 232') and dielectric material plates (142', 242'). A top surface a metal pad structure 788 can be physically exposed at the bottom of each first through-memory-level via cavity 779.

Second through-memory-level via cavities 579 can be formed through the retro-stepped dielectric material portions (165, 265). Each second through-memory-level via cavity 579 can vertically extend through each of the retro-stepped dielectric material portions (165, 265). A top surface a metal pad structure 788 can be physically exposed at the bottom of each second through-memory-level via cavity 579.

Generally, backside trenches 79 can be formed concurrently with formation of the first through-memory-level via cavities 779 and the second through-memory-level via cavities 579 by performing an anisotropic etch process. Portions of the planar silicon nitride liner 766 that underlie the through-memory-level via cavities (779, 579) are removed by the anisotropic etch process. A center portion of a top surface of a respective one of the lower-level metal interconnect structures 760 can be physically exposed through an opening in the planar silicon nitride liner 766 upon formation of the through-memory-level via cavities (779, 579).

Figure 13A:
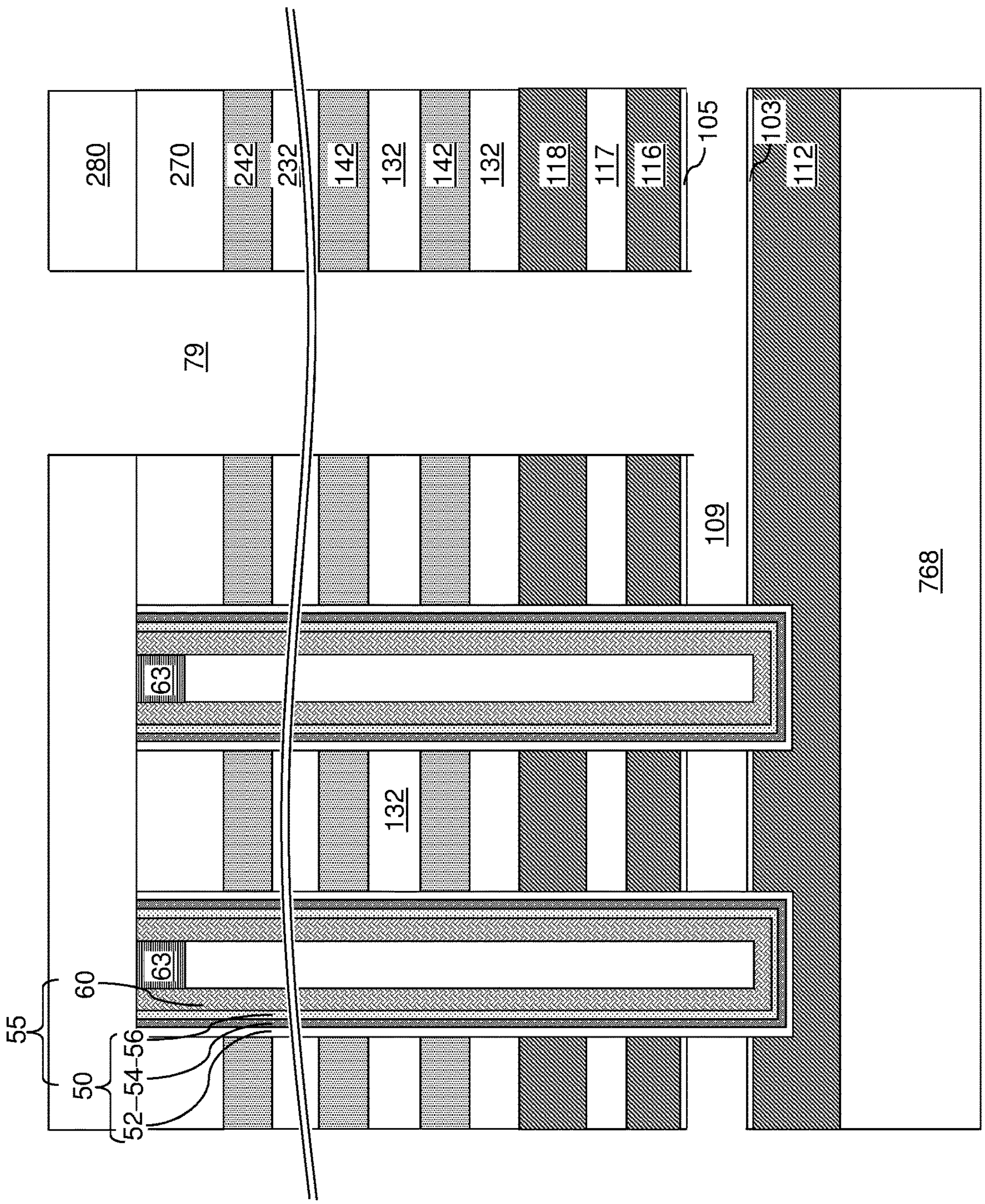
FIGS. 13A-13C illustrate sequential vertical cross-sectional views of memory opening fill structures and a backside trench during formation of source-level material layers according to an embodiment of the present disclosure.

Referring to FIG. 13A, an etchant that etches the material of the source-level sacrificial layer 104 selective to the materials of the first-tier alternating stack (132, 142), the second-tier alternating stack (232, 242), the first and second insulating cap layers (170, 270), the contact-level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy and if the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the upper and lower sacrificial liners (105, 103). A source cavity 109 may be formed in the volume from which the source-level sacrificial layer 104 is removed.

Wet etch chemicals such as hot TMY and TMAH are selective to the doped semiconductor materials of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, in embodiments in which sidewalls of the upper source-level semiconductor layer 116 are physically exposed or in other embodiments in which a surface of the lower source-level semiconductor layer 112 is physically exposed upon formation of the source cavity 109, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 may be physically exposed to the source cavity 109. Specifically, each of the memory opening fill structures 58 may include a sidewall and a bottom surface that are physically exposed to the source cavity 109.

Figure 13B:
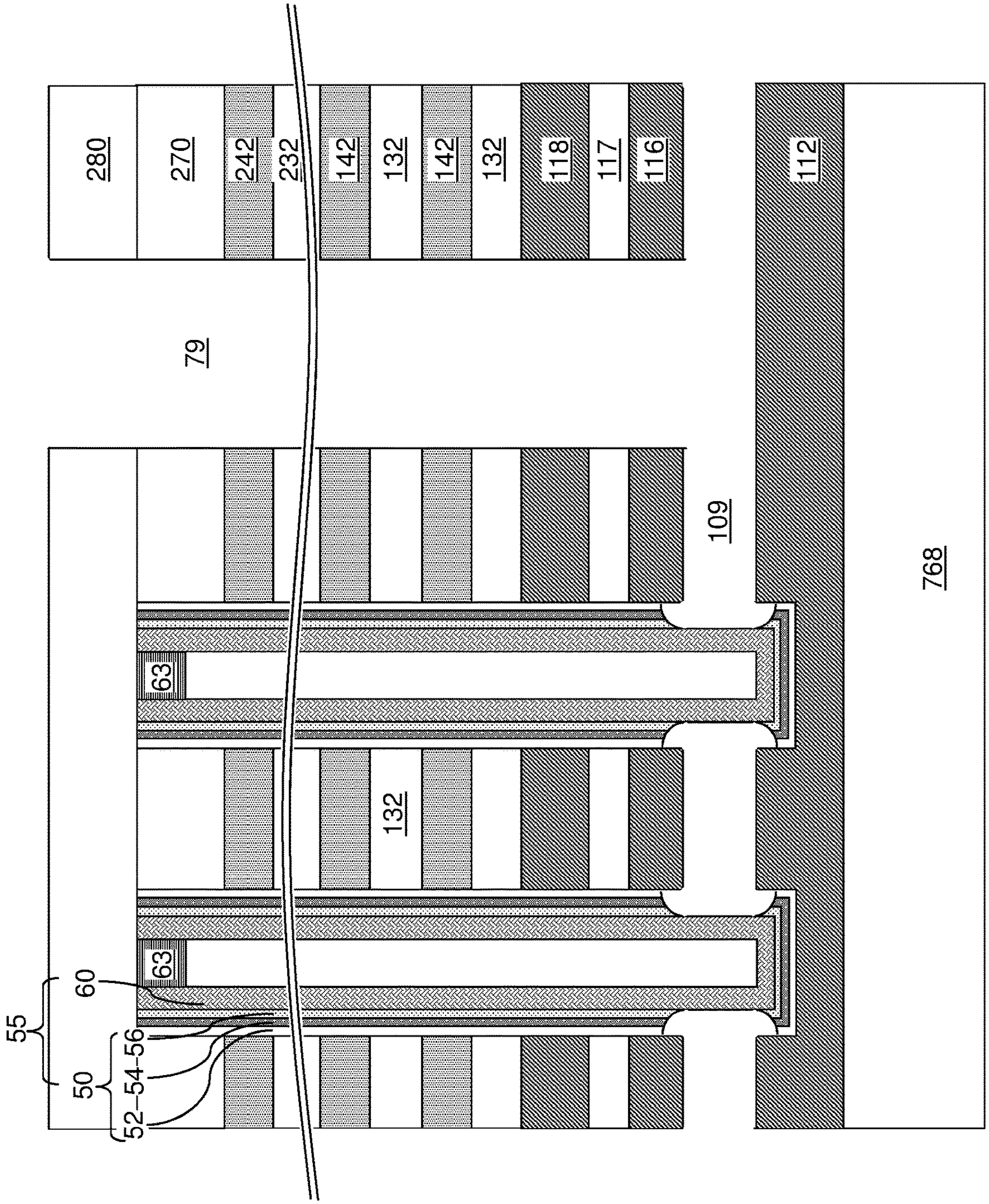

Referring to FIG. 13B, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 may be formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 13C:
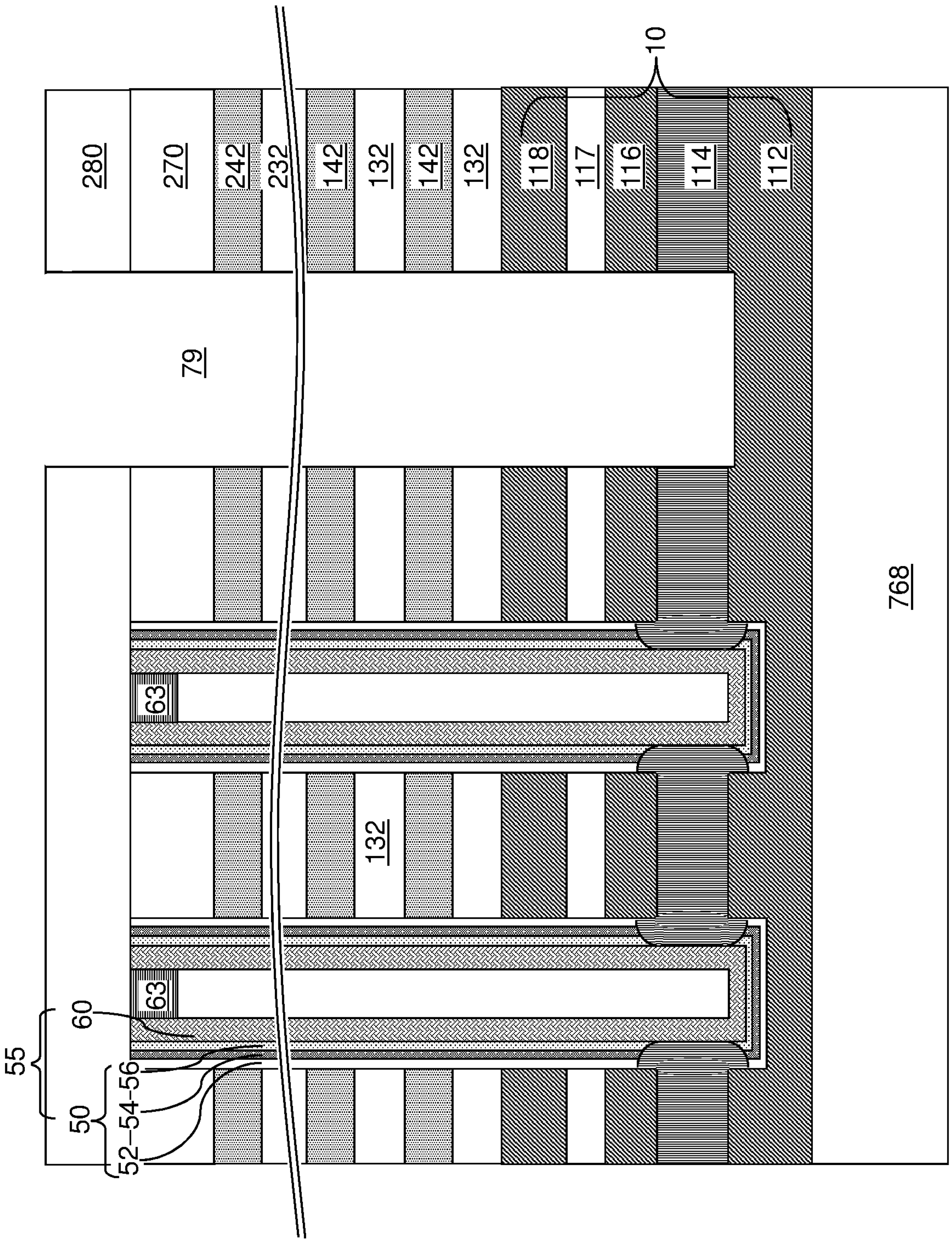

Referring to FIG. 13C, a doped semiconductor material having a doping of the second conductivity type may be deposited on the physically exposed semiconductor surfaces around the source cavity 109. The second conductivity type is the opposite of the first conductivity type, which is the conductivity type of the doping of the vertical semiconductor channels 60. The physically exposed semiconductor surfaces include bottom portions of outer sidewalls of the vertical semiconductor channels 60 and horizontal surfaces of the at least one source-level semiconductor layer (112, 116). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and an n-type dopant precursor gas may flow concurrently into a process chamber including the exemplary structure during the selective semiconductor deposition process. For example, the semiconductor precursor gas may include silane, disilane, or dichlorosilane, the etchant gas may include gaseous hydrogen chloride, and the n-type dopant precursor gas such as phosphine, arsine, or stibine. In this case, the selective semiconductor deposition process grows an in-situ doped semiconductor material from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0\times10^{20}/cm^3$ to $2.0\times10^{21}/cm^3$, such as from $2.0\times10^{20}/cm^3$ to $8.0\times10^{20}/cm^3$. The source contact layer 114 as initially formed may consist essentially of semiconductor atoms and the dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114. In one embodiment, the source contact layer 114 may be formed by selectively depositing a doped semiconductor material from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a source layer (112, 114, 116). The source layer (112, 114, 116) is electrically connected to a first end (such as a bottom end) of each of the vertical semiconductor channels 60. The set of layers including the source layer (112, 114, 116), the source-level insulating layer 117, and the source-select-level conductive layer 118 constitutes source-level material layers 10, which replaces the in-process source-level material layers 10'. Generally, the source-level material layers 10 comprise a source contact layer 114 comprising a doped semiconductor material and contacting each of the vertical semiconductor channels 60. The source contact layer 114 underlies the in-process alternating stack {(132, 142), (232, 242)}, and contacts cylindrical surface segments of the vertical semiconductor channels 60.

Figure 14A:
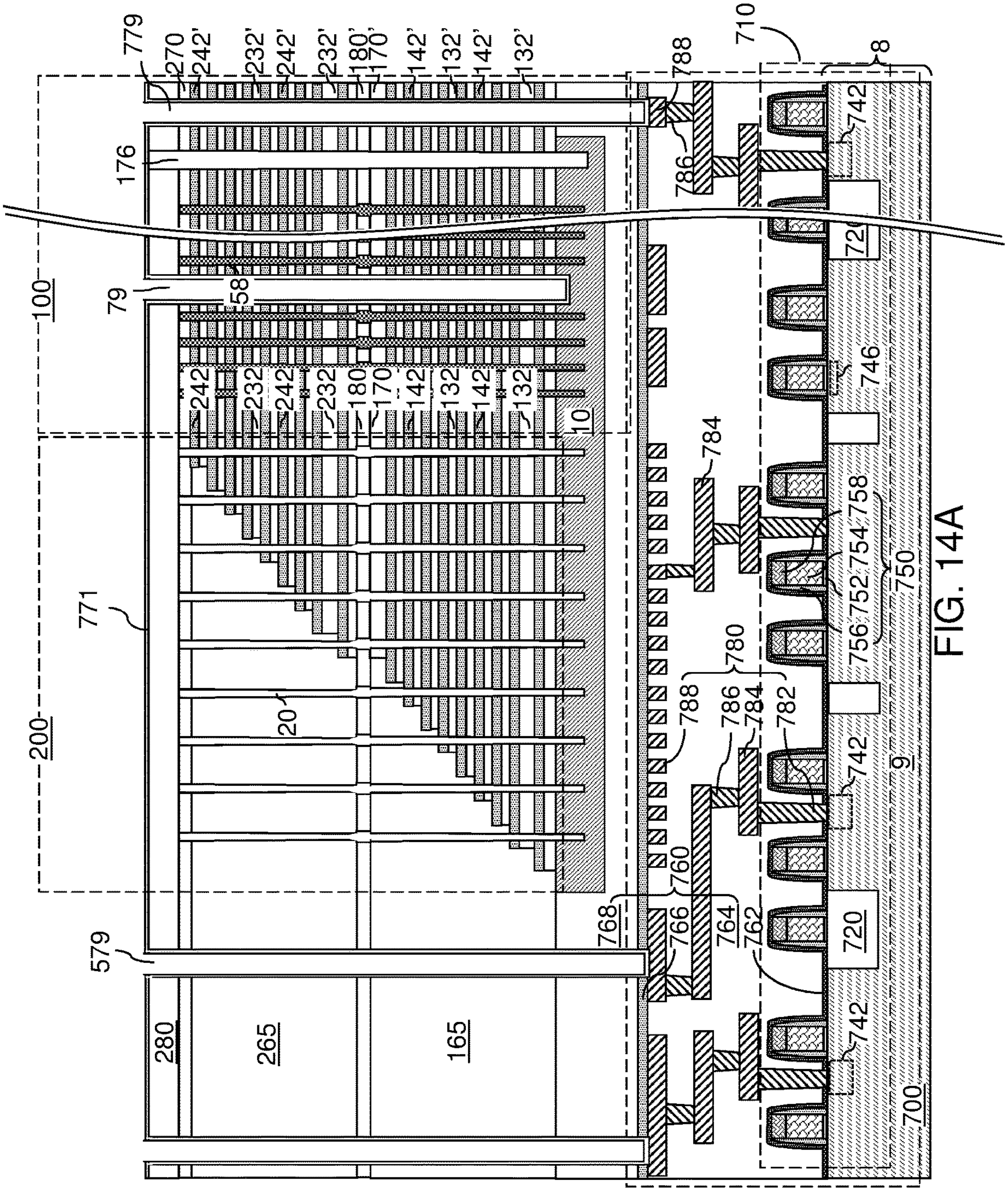
FIG. 14A is a vertical cross-sectional view of the exemplary structure after deposition of a conformal silicon nitride liner according to an embodiment of the present disclosure.
Figure 14B:
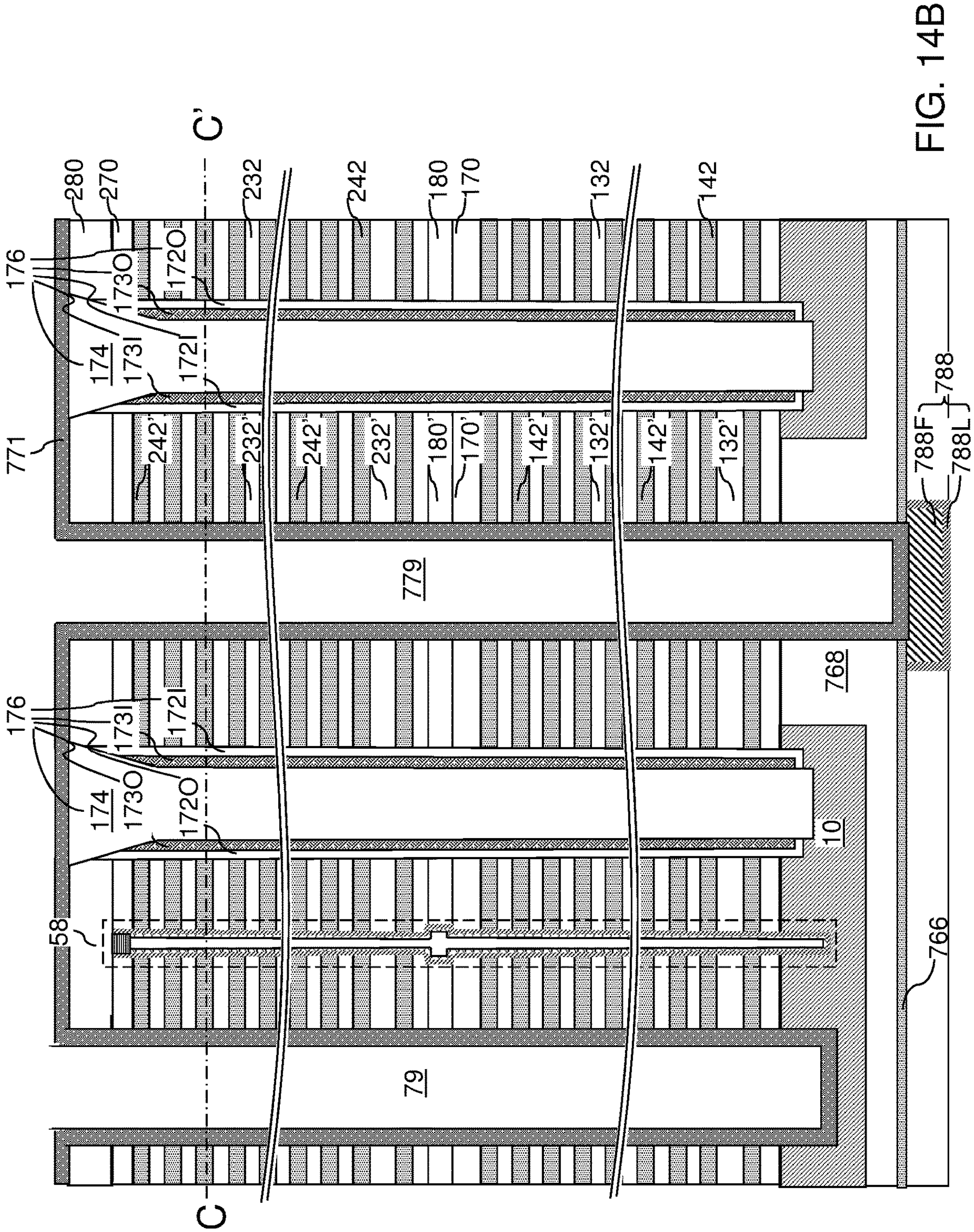
FIG. 14B is another vertical cross-sectional view of the exemplary structure of FIG. 14A.
Figure 14C:
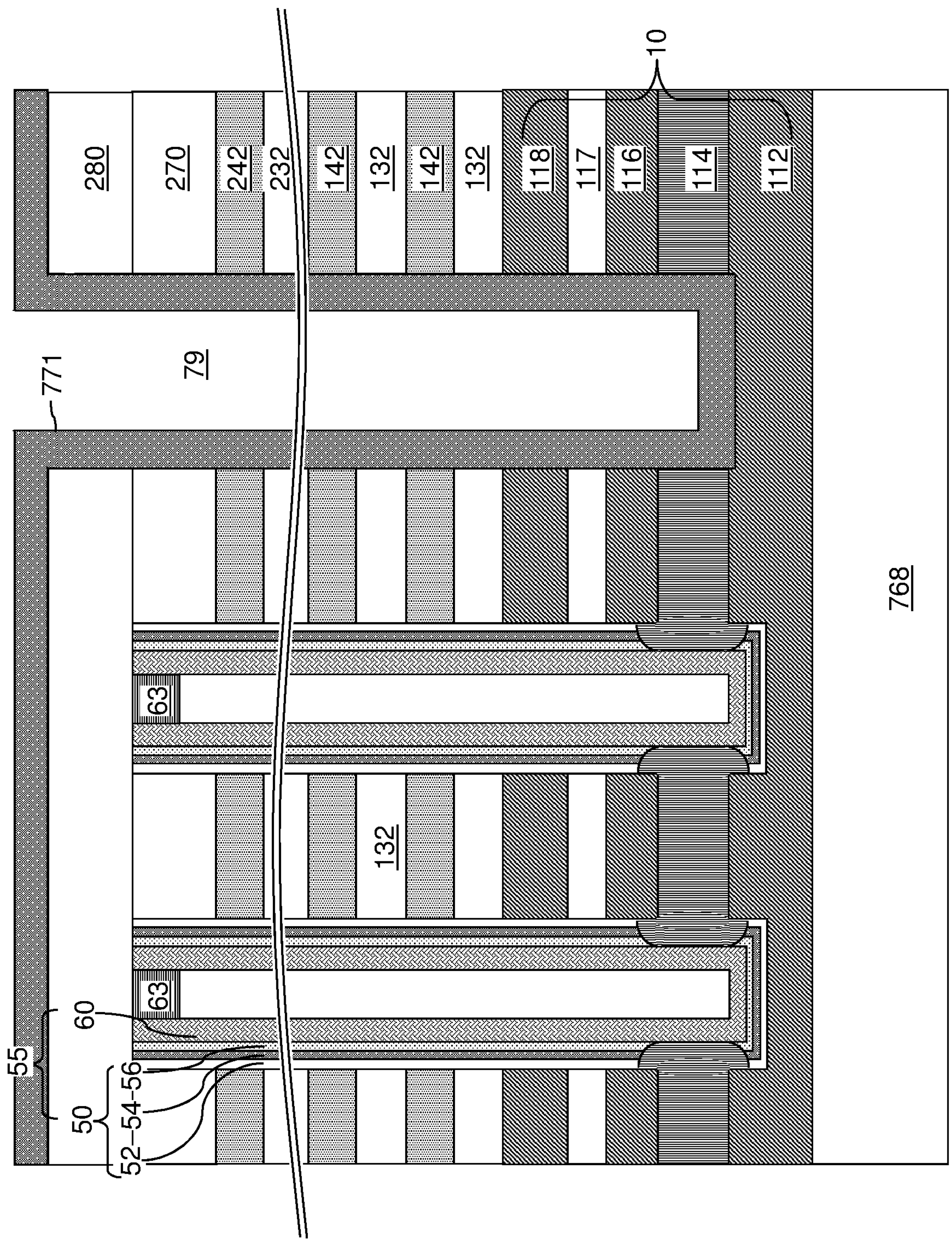
FIG. 14C is yet another vertical cross-sectional view of the exemplary structure of FIGS. 14A and 14B.

Referring to FIGS. 14A-14C, a silicon nitride liner can be deposited by a conformal deposition process, such as a chemical vapor deposition process. The silicon nitride liner is herein referred to as a conformal silicon nitride liner 771 or a first conformal silicon nitride liner. The conformal silicon nitride liner 771 can be formed by conformal deposition of silicon nitride directly on sidewalls of each through-memory-level via cavity (779, 579) and each backside trench 79. In one embodiment, the conformal silicon nitride liner 771 contacts each plate within each vertically alternating sequence of insulating plates (132', 232') and dielectric material plates (142', 242'). The conformal silicon nitride liner 771 can consist essentially of silicon nitride and can have a thickness greater than 2 nm, such as a thickness in a range from 4 nm to 40 nm, such as from 6 nm to 20 nm, although lesser and greater thicknesses may also be employed. The conformal silicon nitride liner 771 can be a conformal layer that continuously extends over the entire lateral extent of the exemplary structure.

Figure 15A:
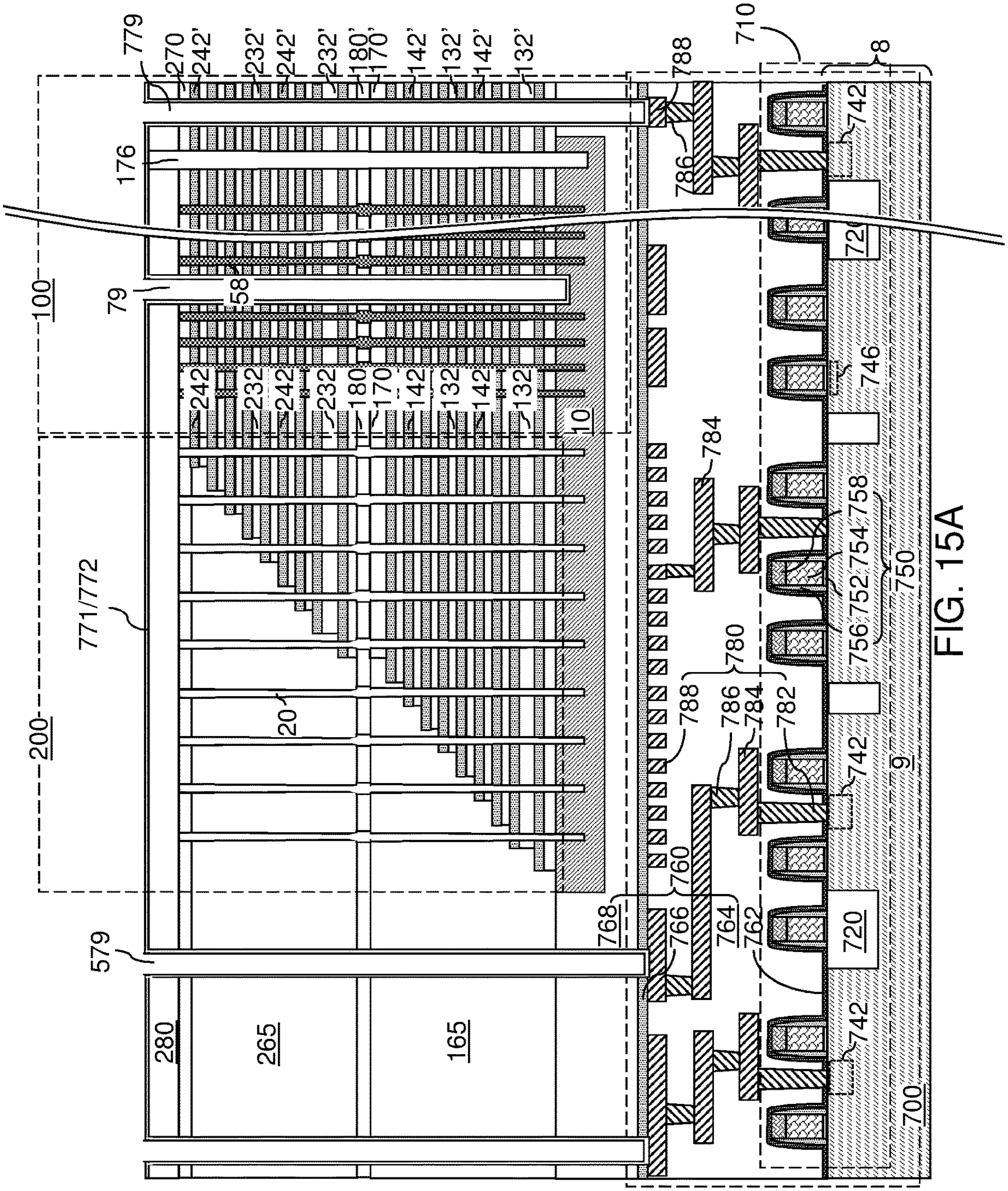
FIG. 15A is a vertical cross-sectional view of the exemplary structure after formation of a conformal silicon oxide liner according to an embodiment of the present disclosure.
Figure 15B:
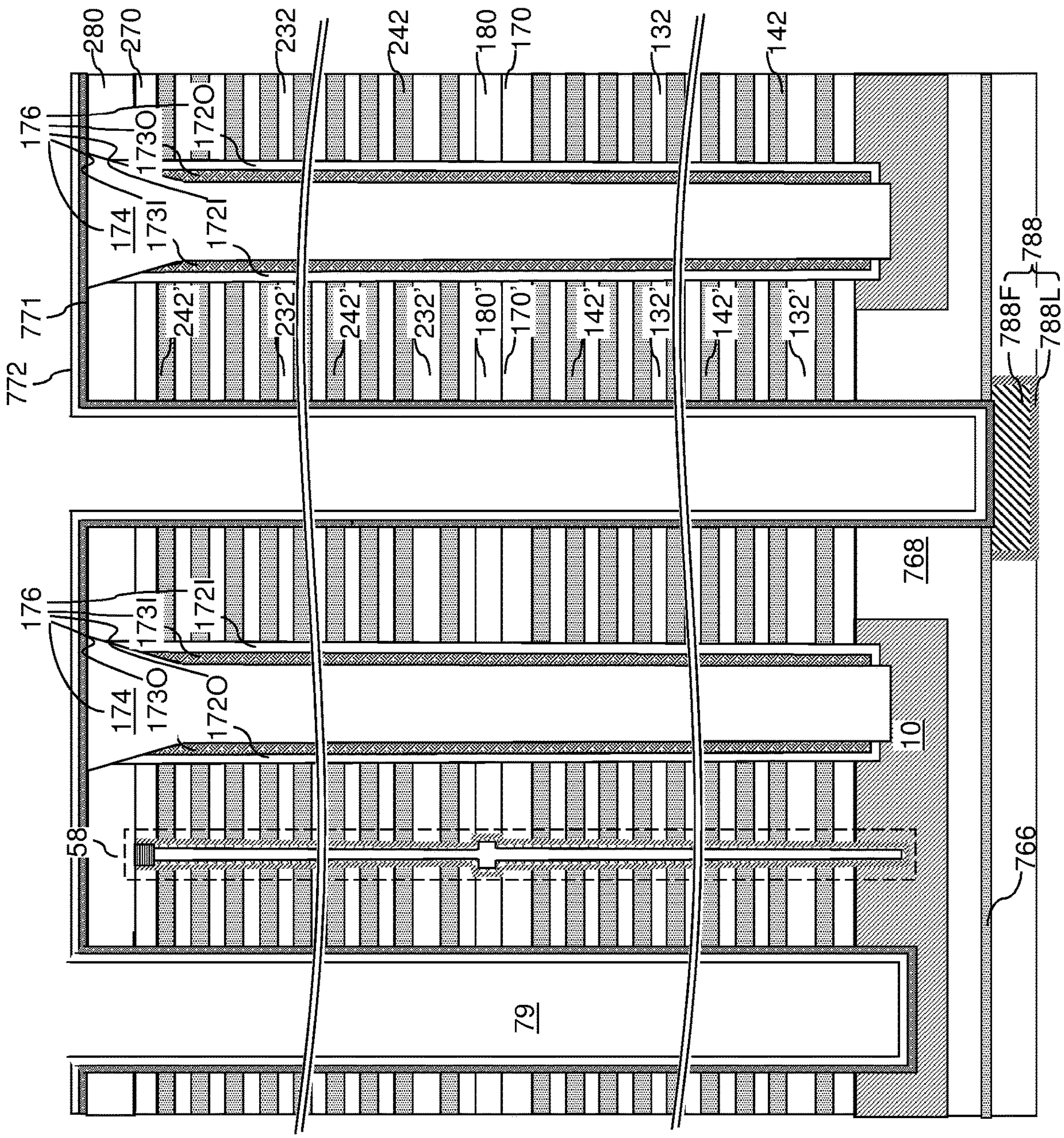
FIG. 15B is another vertical cross-sectional view of the exemplary structure of FIG. 15A.
Figure 15C:
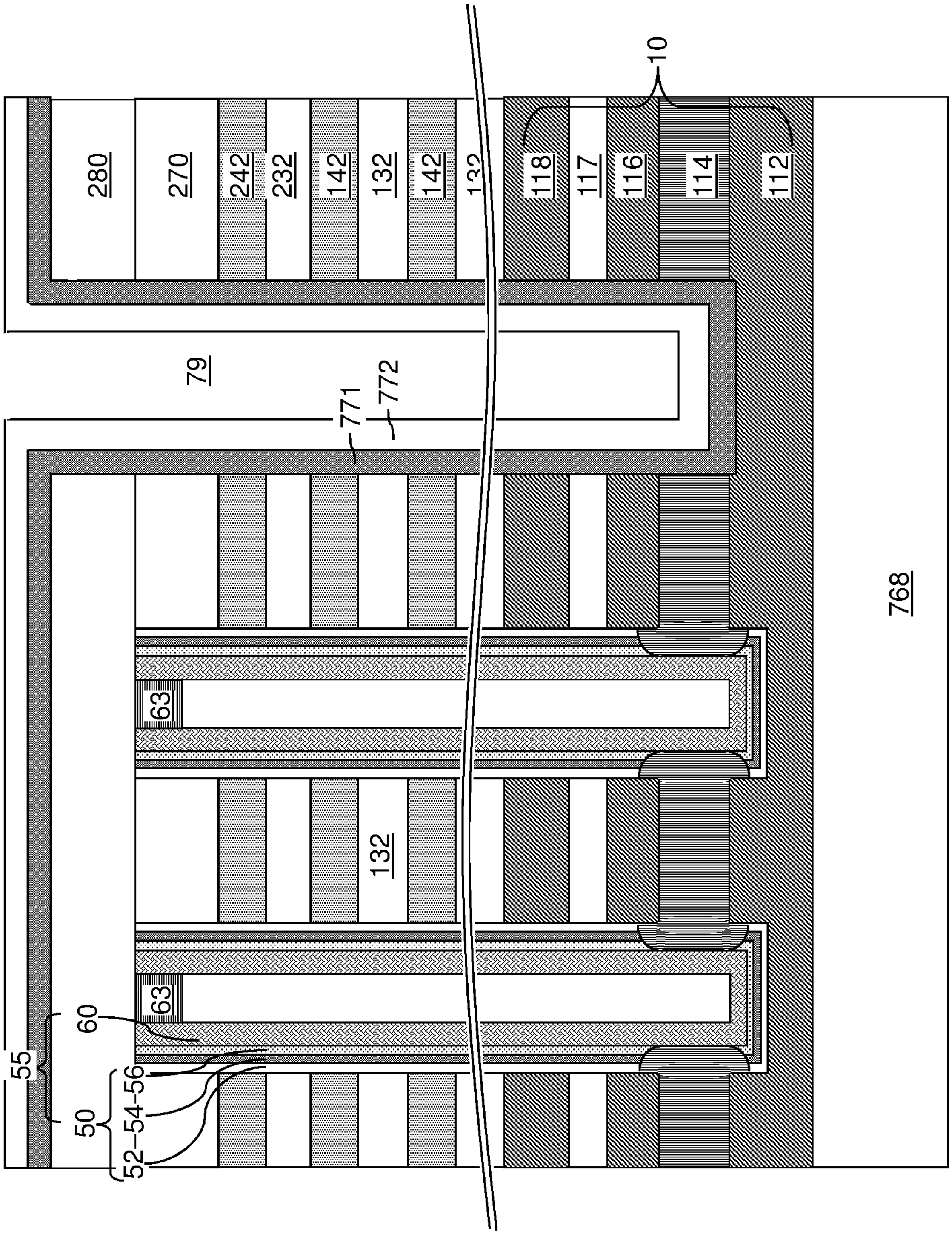
FIG. 15C is yet another vertical cross-sectional view of the exemplary structure of FIGS. 15A and 15B.
Figure 16A:
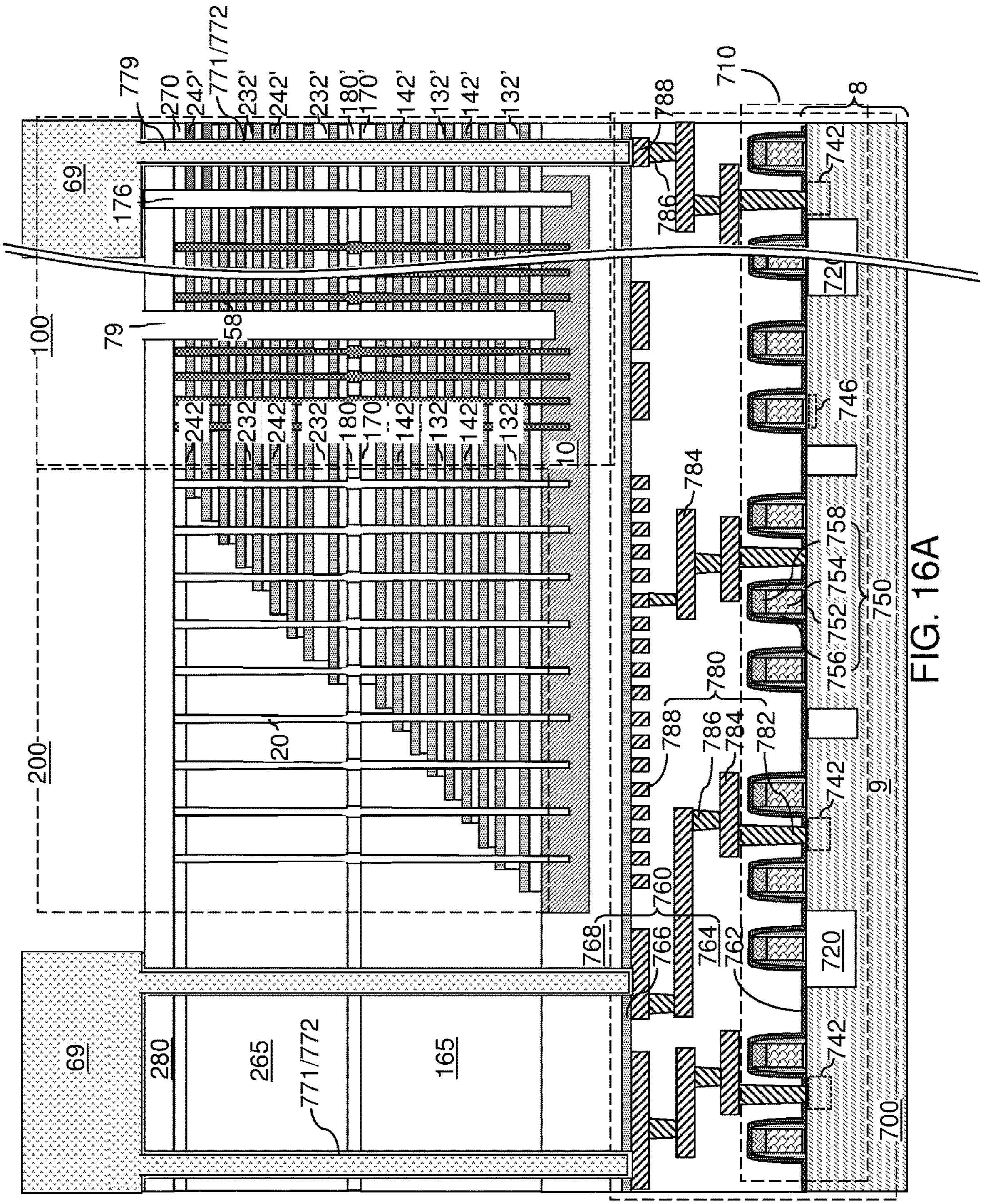
FIG. 16A is a vertical cross-sectional view of the exemplary structure after patterning the conformal silicon oxide liner and the conformal silicon nitride liner according to an embodiment of the present disclosure.
Figure 16B:
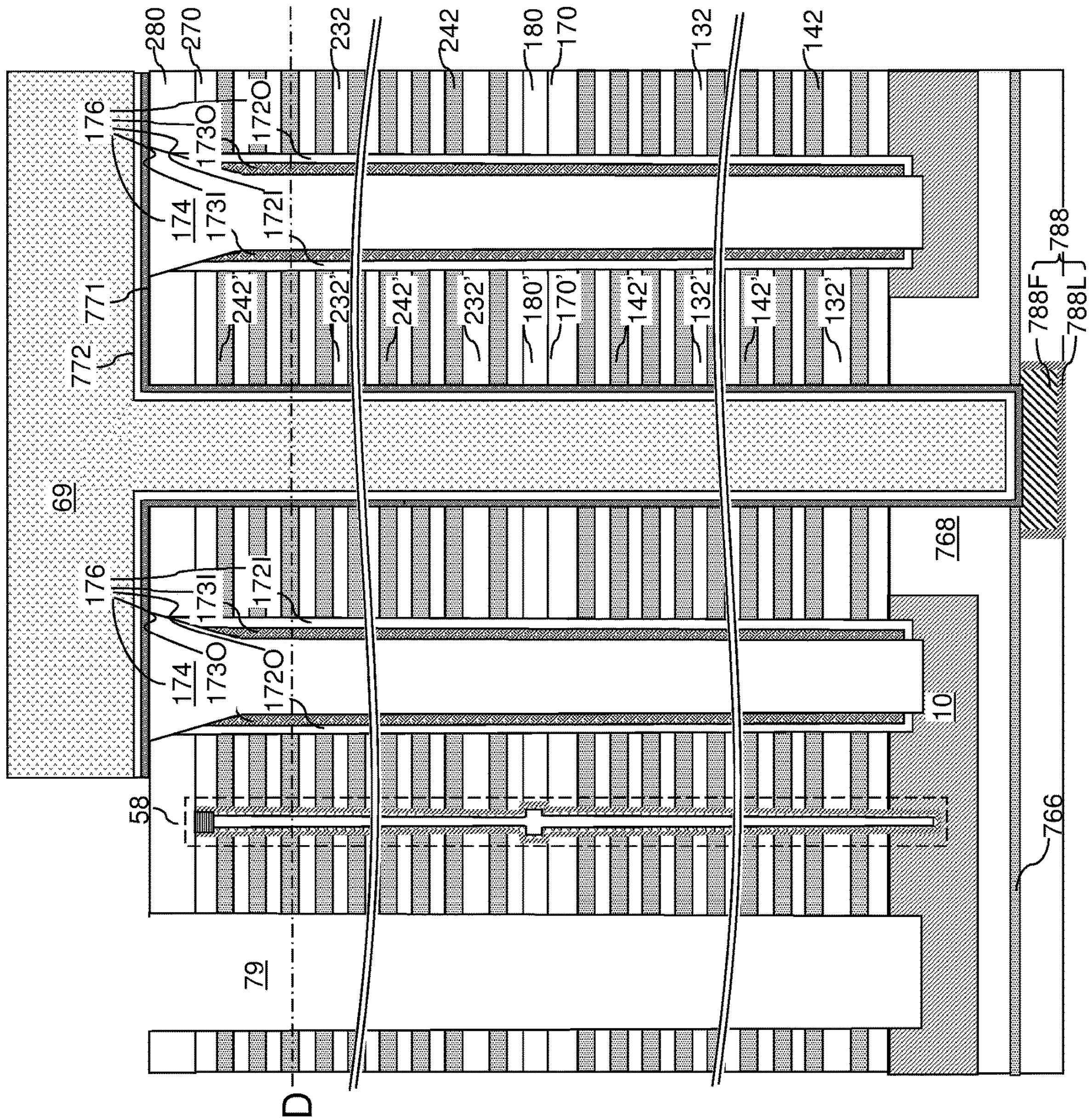
FIG. 16B is another vertical cross-sectional view of the exemplary structure of FIG. 16A.
Figure 16C:
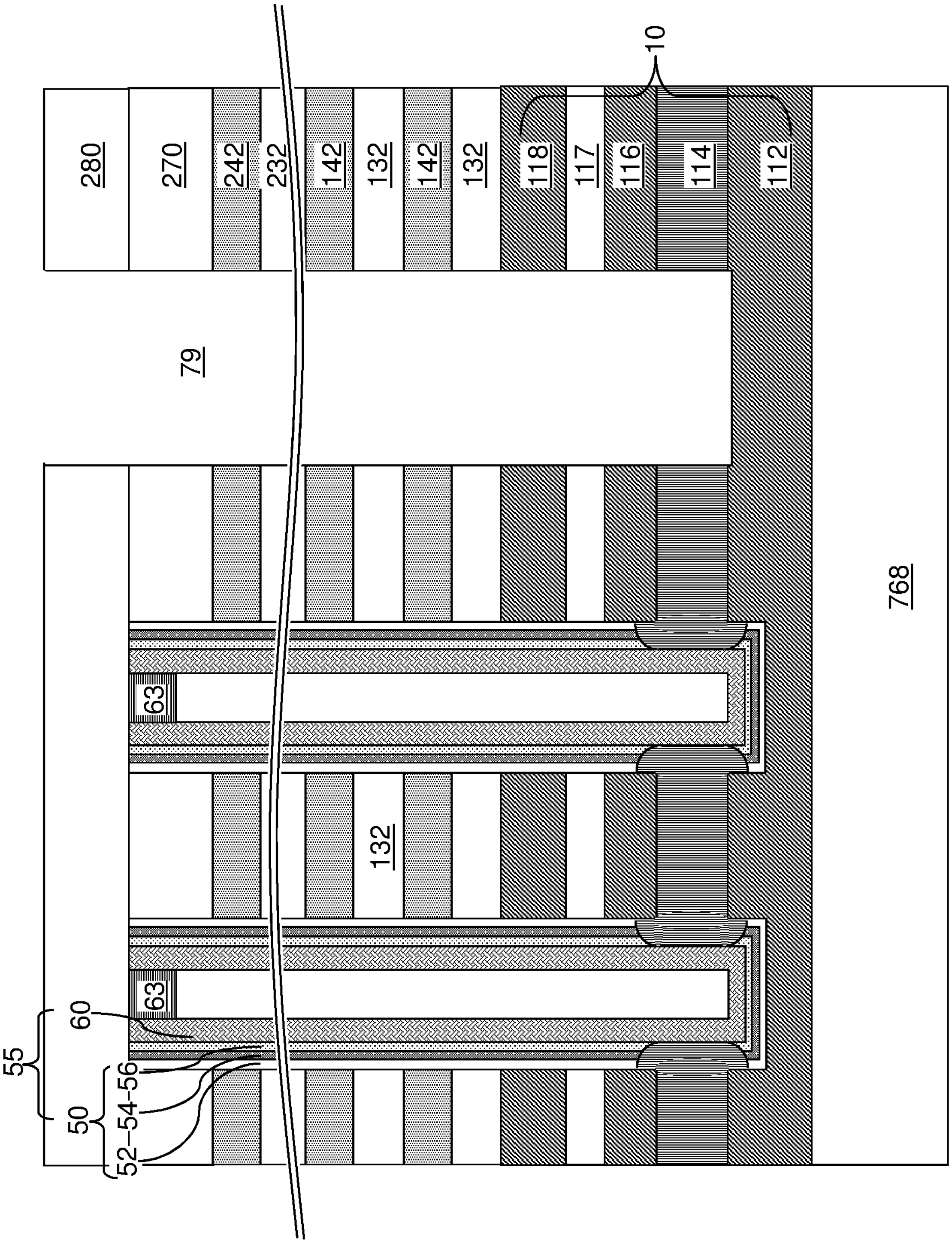
FIG. 16C is yet another vertical cross-sectional view of the exemplary structure of FIGS. 16A and 16B.
Figure 16D:
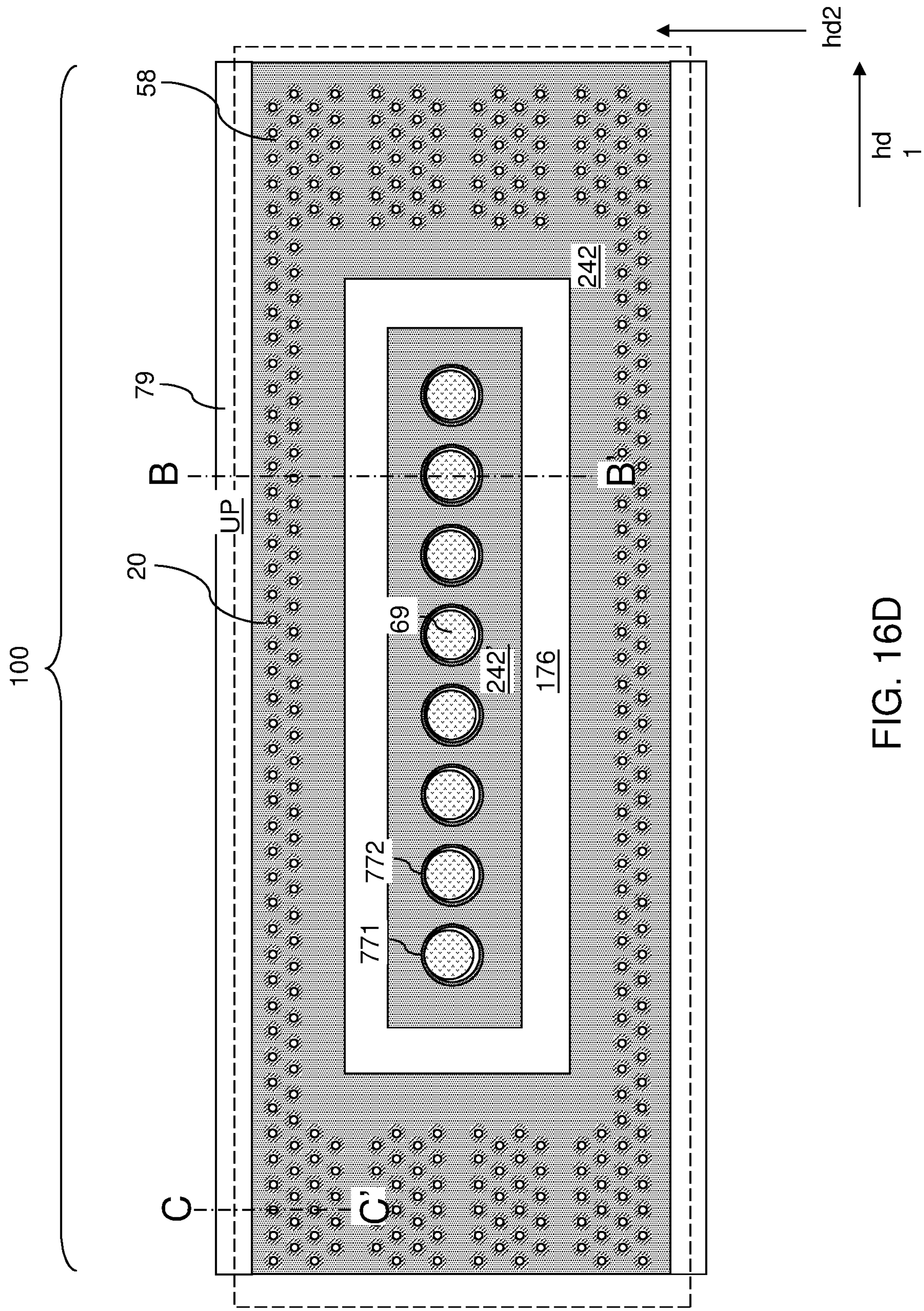
FIG. 16D is a horizontal cross-sectional view along the horizontal plane D-D' of FIG. 16B. The vertical cross-sectional plane B-B' is the plane of the vertical cross-section of FIG. 16B. The vertical cross-sectional plane C-C' is the plane of the vertical cross-section of FIG. 16C.
Figure 17A:
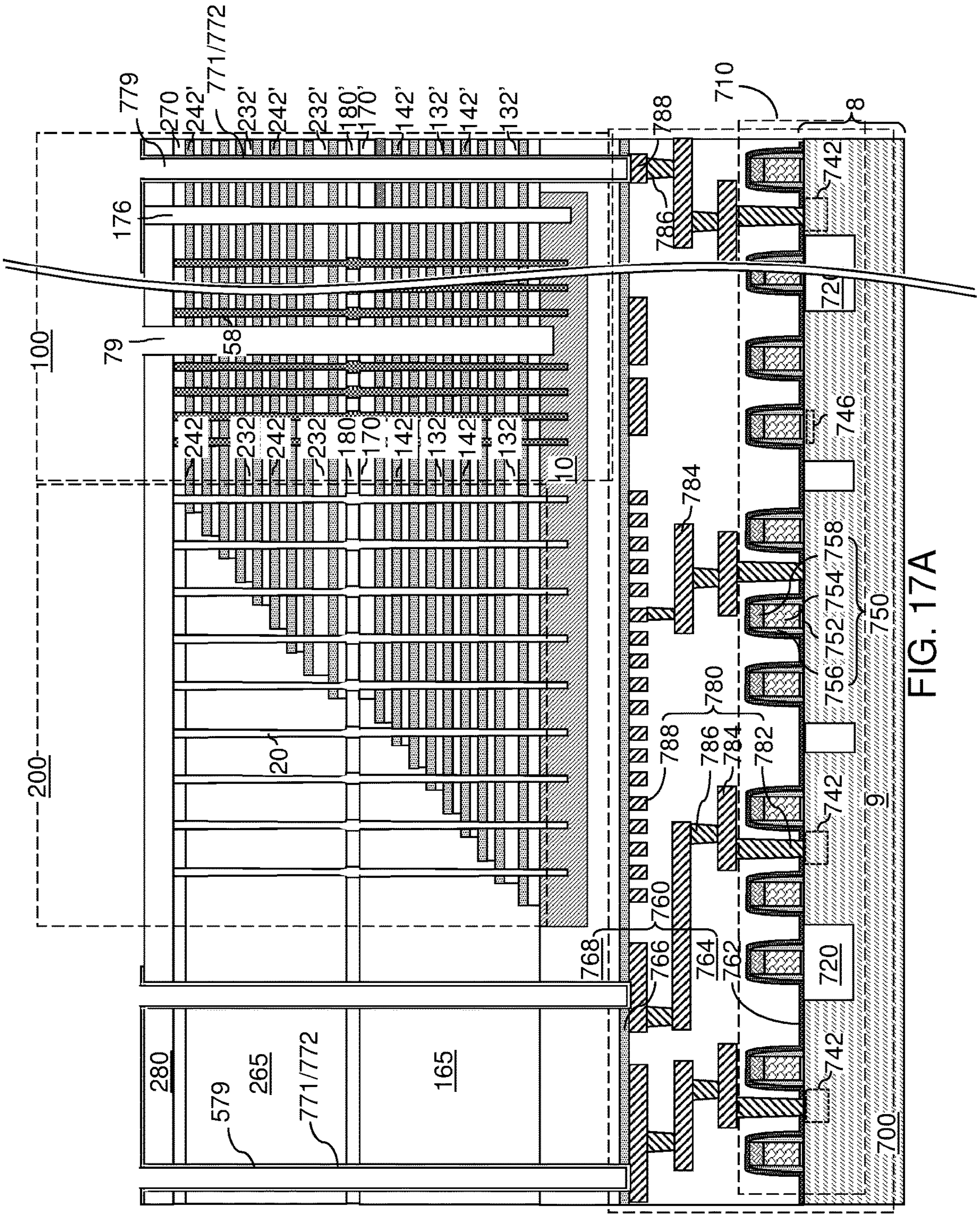
FIG. 17A is a vertical cross-sectional view of the exemplary structure after an oxidation process that forms dielectric semiconductor oxide material portions according to an embodiment of the present disclosure.
Figure 17B:
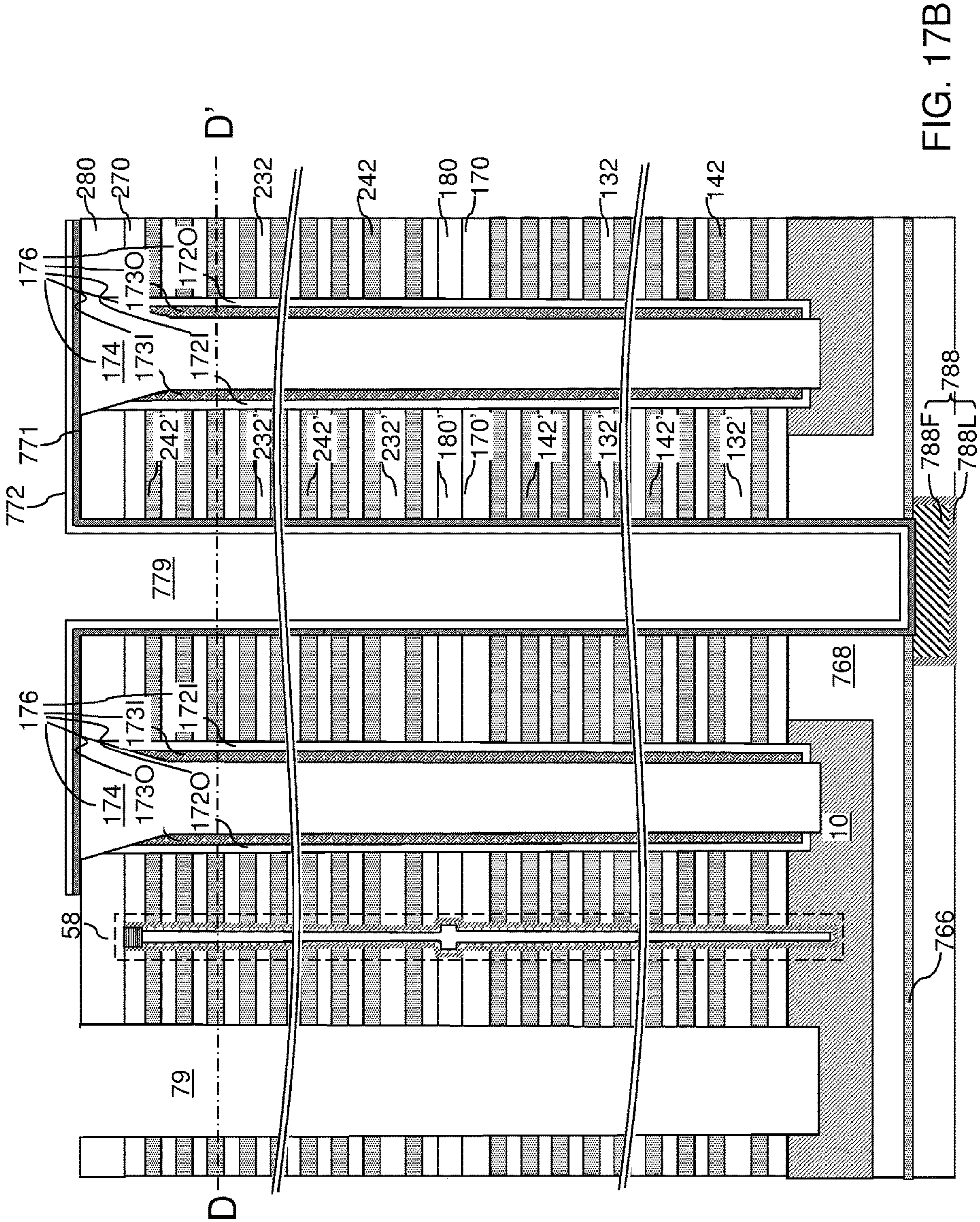
FIG. 17B is another vertical cross-sectional view of the exemplary structure of FIG. 17A.
Figure 17C:
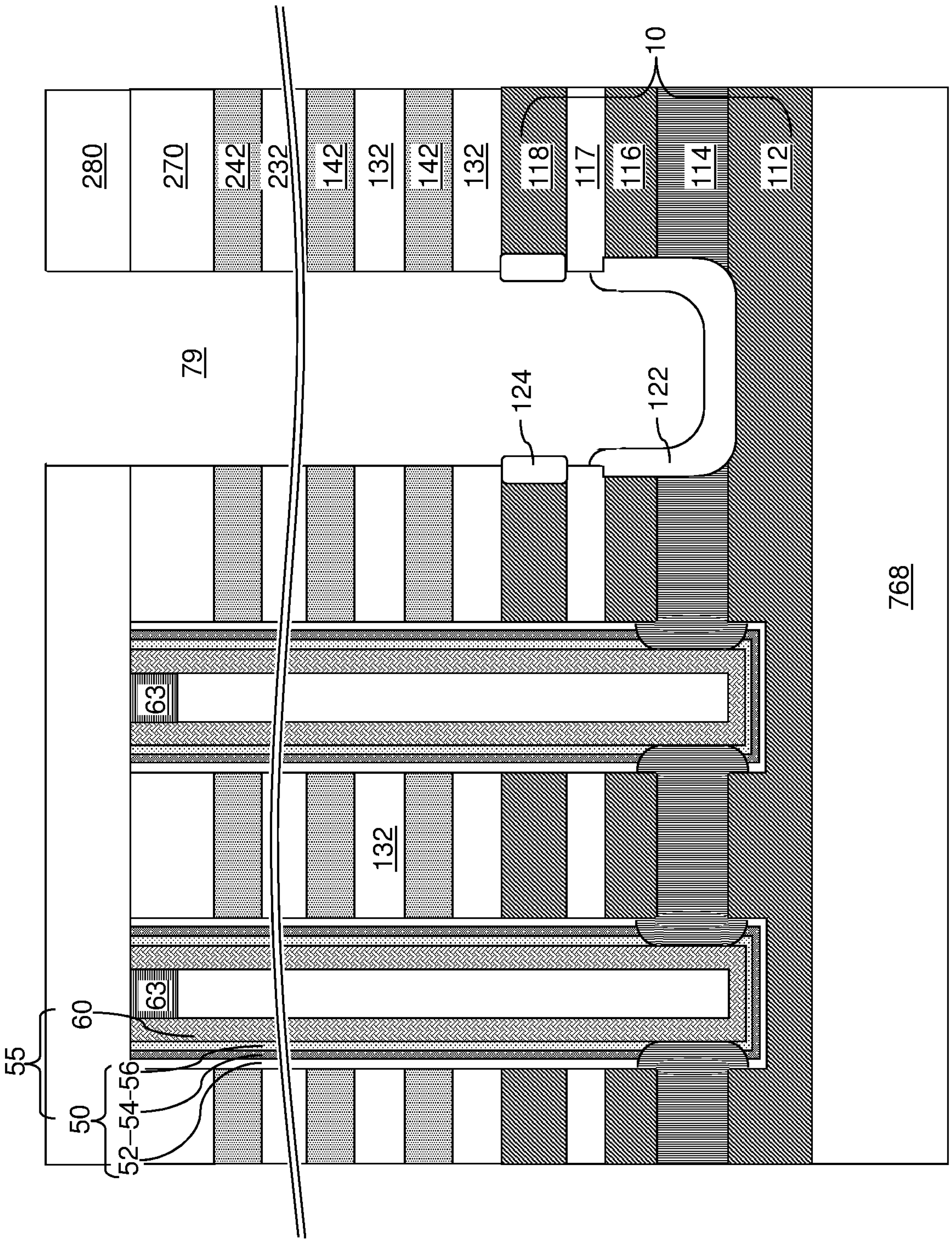
FIG. 17C is yet another vertical cross-sectional view of the exemplary structure of FIGS. 17A and 17B.
Figure 17D:
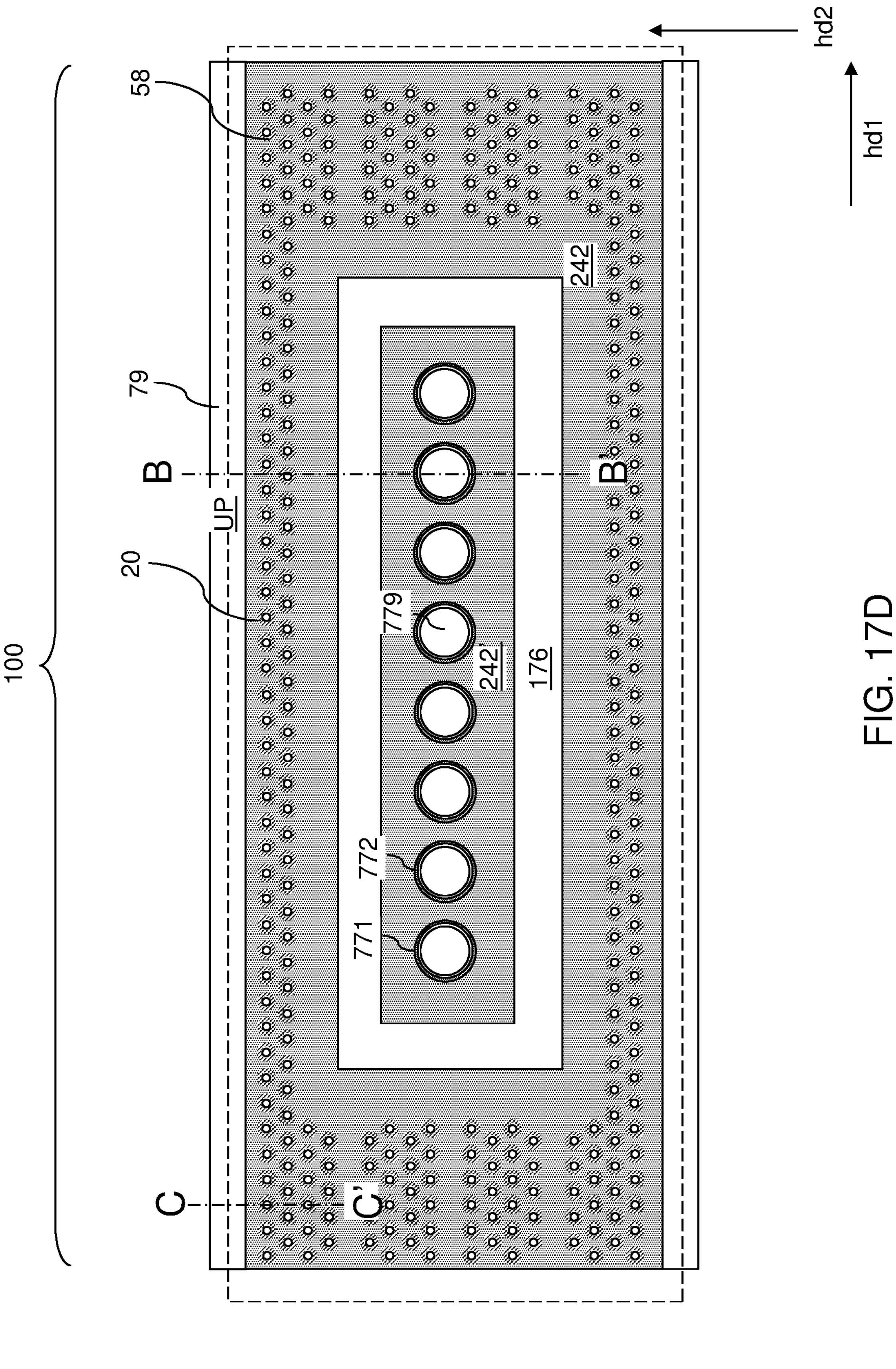
FIG. 17D is a horizontal cross-sectional view along the horizontal plane D-D' of FIG. 17B. The vertical cross-sectional plane B-B' is the plane of the vertical cross-section of FIG. 17B. The vertical cross-sectional plane C-C' is the plane of the vertical cross-section of FIG. 17C.
Figure 18A:
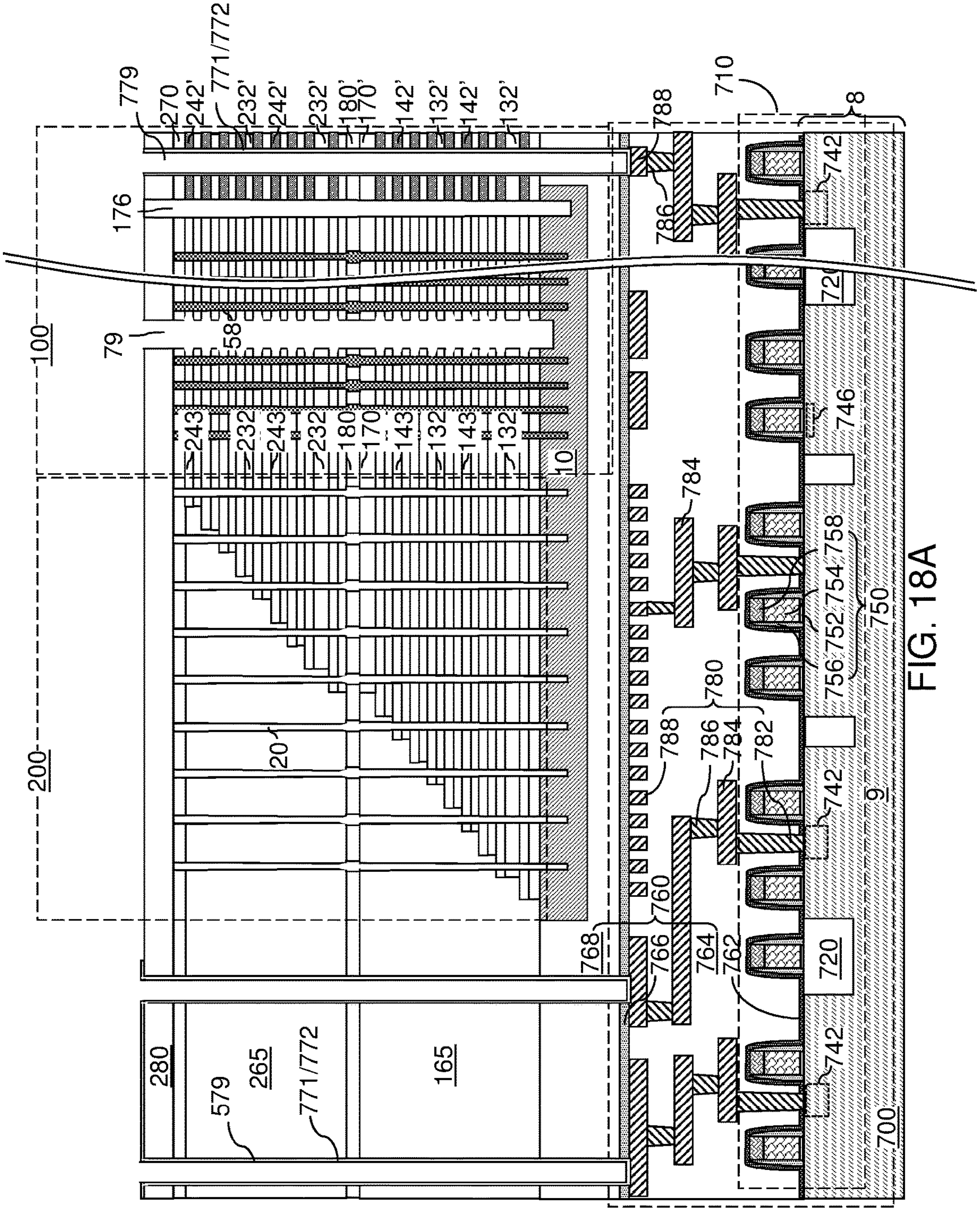
FIG. 18A is a vertical cross-sectional view of the exemplary structure after formation of backside recesses according to an embodiment of the present disclosure.
Figure 18B:
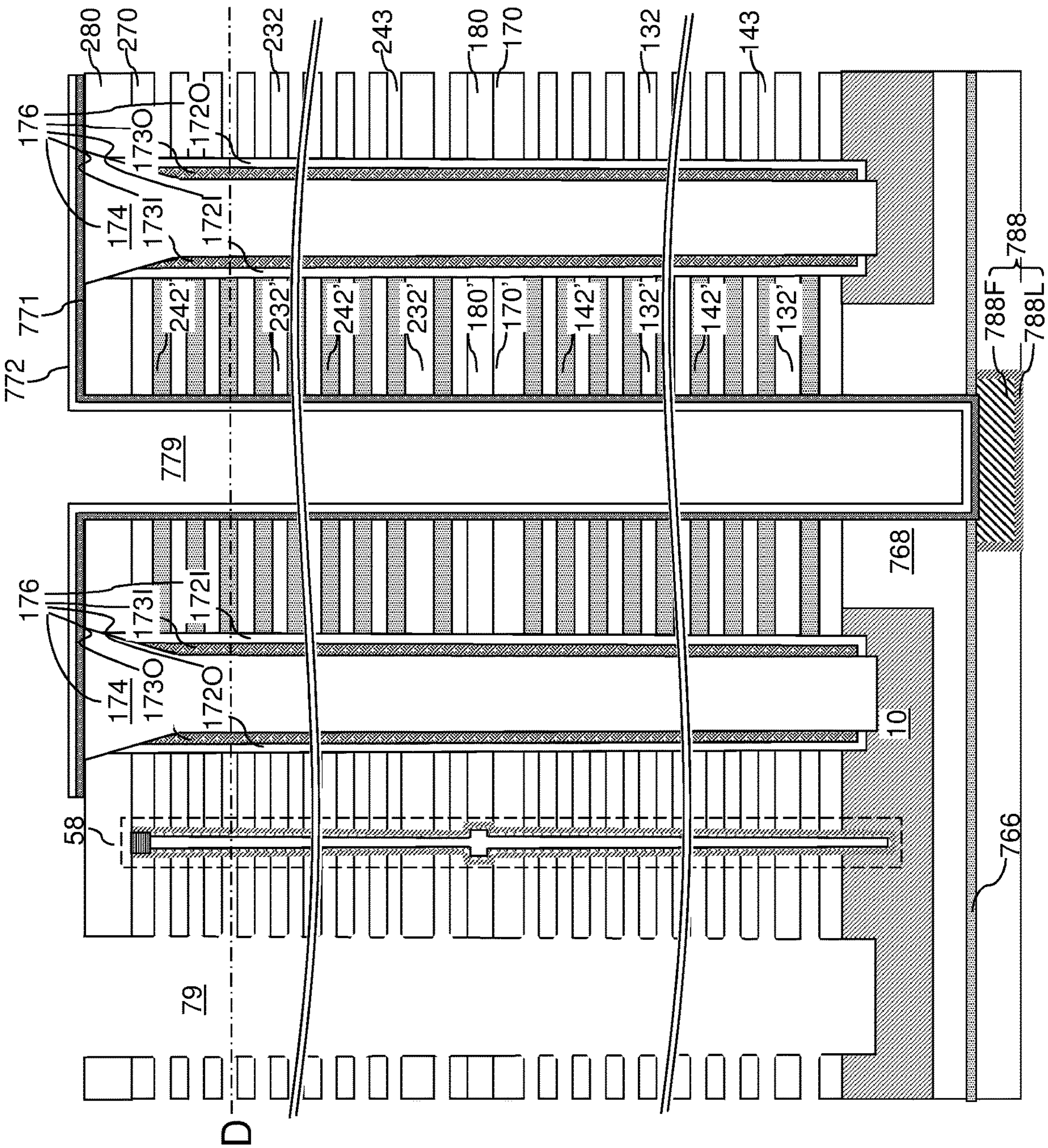
FIG. 18B is another vertical cross-sectional view of the exemplary structure of FIG. 18A.
Figure 18C:
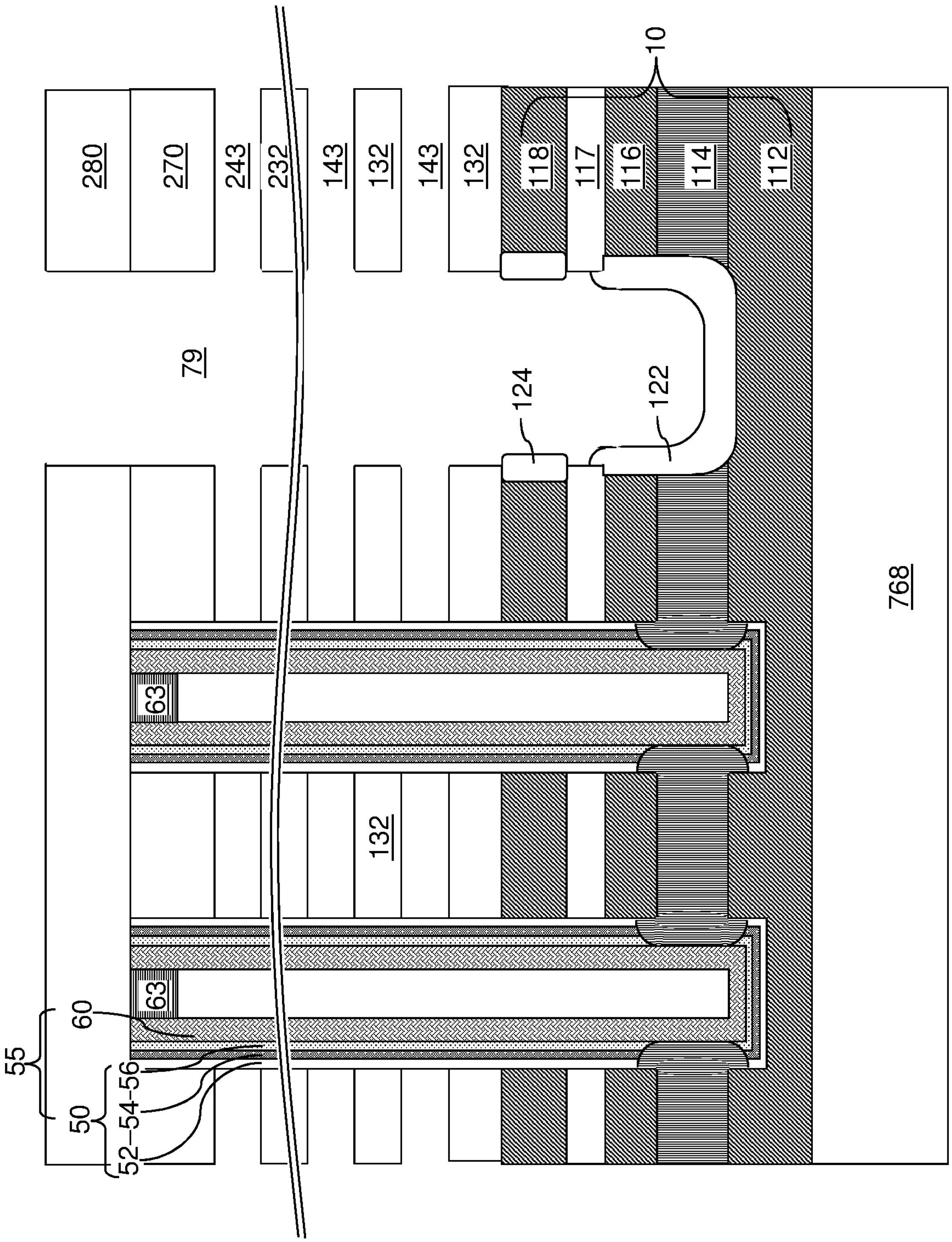
FIG. 18C is yet another vertical cross-sectional view of the exemplary structure of FIGS. 18A and 16B.
Figure 18D:
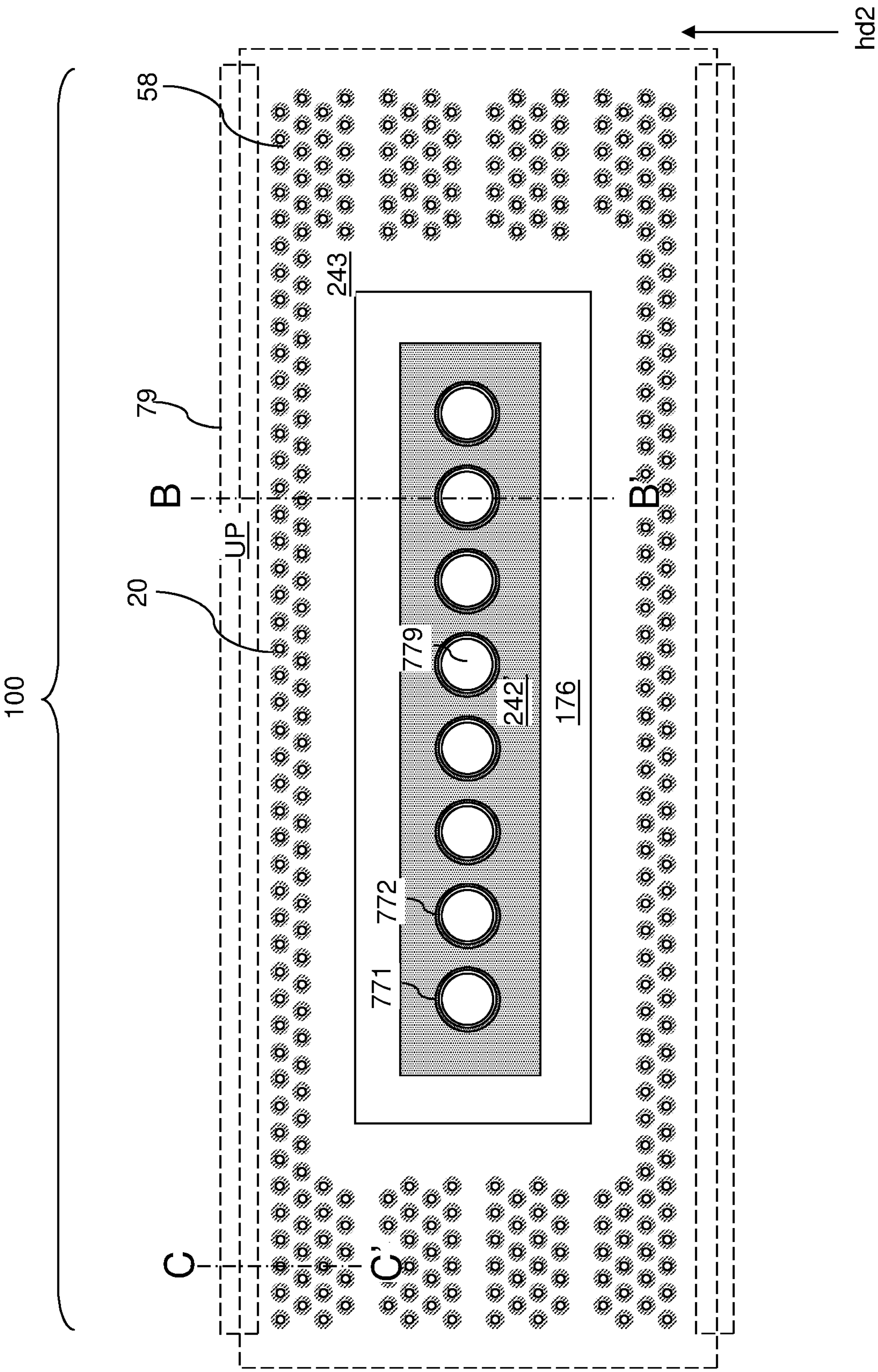
FIG. 18D is a horizontal cross-sectional view along the horizontal plane D-D' of FIG. 18B. The vertical cross-sectional plane B-B' is the plane of the vertical cross-section of FIG. 18B. The vertical cross-sectional plane C-C' is the plane of the vertical cross-section of FIG. 18C.

Referring to FIGS. 15A-15C, an oxidation process can be performed to convert at least surface portions of the conformal silicon nitride liner 771 into a silicon oxide liner, which is herein referred to as a conformal silicon oxide liner 772 or a first conformal silicon oxide liner. The oxidation process may be a thermal oxidation process or a plasma oxidation process. In case a thermal oxidation process is performed, a wet oxidation process, a dry oxidation process, or a radial oxidation process (such as in-situ steam generation oxidation process) may be employed. If the planar silicon nitride liner 766 is present, then the oxidation process can optionally be performed for a sufficient time to convert the entire conformal silicon nitride liner 771 into the conformal silicon oxide liner 772. If the planar silicon nitride liner 766 is omitted, then the oxidation process is terminated after only surface portions of the conformal silicon nitride liner 771 are converted into the conformal silicon oxide liner 772, but at least a portion of the conformal silicon nitride liner 771 remains under the conformal silicon oxide liner 772. For example, at least a 2 nm thick, such as 3 nm to 10 nm thick portion of the conformal silicon nitride liner 771 remains under the conformal silicon oxide liner 772. The planar silicon nitride liner 766 and/or bottom portions of the conformal silicon nitride liner 771 underlying the through-memory-level via cavities (779 579) can prevent or reduce oxidation of metal pad structures 788 during formation of the conformal silicon oxide liner 772.

In one embodiment, the conformal silicon oxide liner 772 can be formed by oxidizing a surface portion of the conformal silicon nitride liner 771 without oxidizing a portion of the conformal silicon nitride liner 771 that is proximal to the sidewalls of the through-memory-level via cavities (779, 579) or to the sidewalls of the backside trenches 79. For example, the duration of the oxidation process can be selected such that a fraction of the conformal silicon nitride liner 771 is not oxidized by the oxidation process. In one embodiment, the thickness of the remaining portion of the conformal silicon nitride liner 771 after the oxidation process may be in a range from 10% to 90%, such as from 20% to 80%, of the initial thickness of the conformal silicon nitride liner 771 as deposited. The conformal silicon oxide liner 772 can contact the conformal silicon nitride liner 771. In one embodiment, residual nitrogen atoms may be present within interfacial portions of the conformal silicon oxide liner 772 that is proximal to the conformal silicon nitride liner 771. In this case, an interfacial portion of the conformal silicon oxide liner 772 can comprise a nitrogen-doped surface region having a variable atomic concentration of nitrogen atoms that decreases with a distances from the conformal silicon nitride liner 771.

Referring to FIGS. 16A-16D, a photoresist layer 69 can be applied over the exemplary structure, and can be lithographically patterned to cover the through-memory-level via cavities (779, 579) without covering the backside trenches 79. A sequence of isotropic etch processes may be employed to isotropically etch unmasked portions of the conformal silicon oxide liner 772 and the conformal silicon nitride liner 771. For example, a first wet etch process employing hydrofluoric acid may be performed to etch unmasked portions of the conformal silicon oxide liner 772, and a second wet etch process employing a combination of hot phosphoric acid may be employed to etch unmasked portions of the conformal silicon nitride liner 771. The photoresist layer 69 can be subsequently removed, for example, by ashing.

Referring to FIGS. 17A-17D, an oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124. Planar silicon nitride liner 766 and/or the bottom portions of the conformal silicon nitride liner 771 underlying the through-memory-level via cavities (779 579) can prevent or reduce oxidation of metal pad structures 788 during formation of the conformal silicon oxide liner 772, the dielectric semiconductor oxide plates 122, and the annular dielectric semiconductor oxide spacers 124. For example, if the metal pad structures 788 include a titanium nitride metallic nitride liner 788L, then oxidation of titanium nitride during oxidation steps forms higher resistivity titanium oxide. The planar silicon nitride liner 766 covers the exposed top portion of the titanium nitride metallic nitride liner 788L, while the bottom portions of the conformal silicon nitride liner 771 prevent the titanium nitride metallic nitride liner 788L from being exposed in the through-memory-level via cavities 779, and thus reduce or prevent formation of high resistivity titanium oxide in the metal pad structures 788 during one or more oxidation steps.

Referring to FIGS. 18A-18D, the sacrificial material layers (142, 242) can be removed selective to the insulating layers (132, 232), the first and second insulating cap layers (170, 270), the contact-level dielectric layer 280, and the source contact layer 114, the dielectric semiconductor oxide plates 122, and the annular dielectric semiconductor oxide spacers 124. An isotropic etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art. The duration of the isotropic etch process may be selected such that the entirety of the sacrificial material layers (142, 242) is removed by the isotropic etch process.

Backside recesses (143, 243) may be formed in volumes from which the sacrificial material layers (142, 242) are removed. The backside recesses (143, 243) include first backside recesses 143 that may be formed in volumes from which the first sacrificial material layers 142 are removed and second backside recesses 243 that may be formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

The first lateral recesses 143 can be laterally bounded by the outer sidewalls of a respective dielectric moat fill structure 176. Thus, the outer sidewalls of the dielectric moat fill structures 176 are physically exposed to the first lateral recesses 143. The second lateral recesses 243 can be laterally bounded by the outer sidewalls of a respective dielectric moat fill structure 176. Thus, the outer sidewalls of the dielectric moat fill structures 176 are physically exposed to the second lateral recesses 243.

Figure 19A:
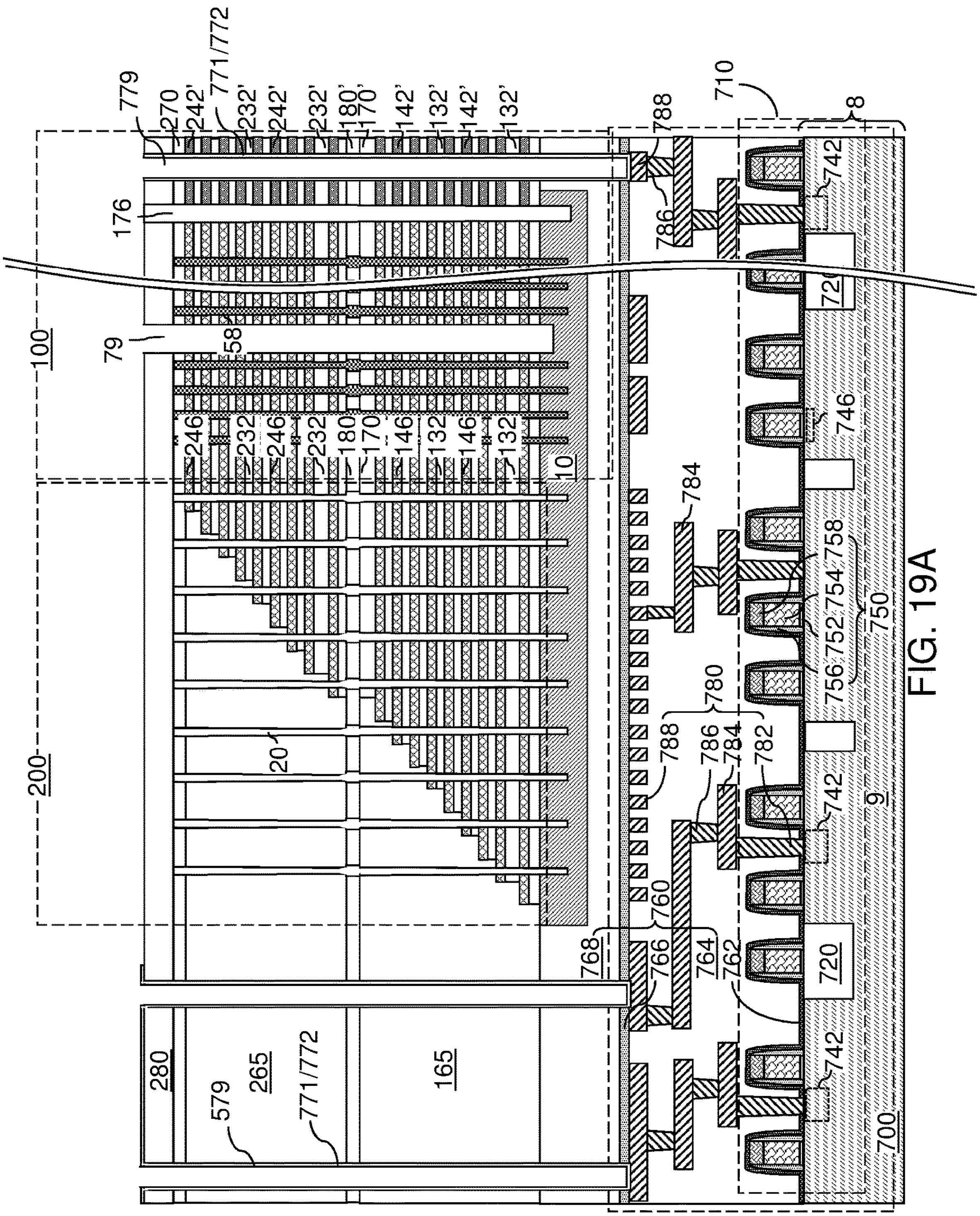
FIG. 19A is a vertical cross-sectional view of the exemplary structure after formation of electrically conductive layers according to an embodiment of the present disclosure.
Figure 19B:
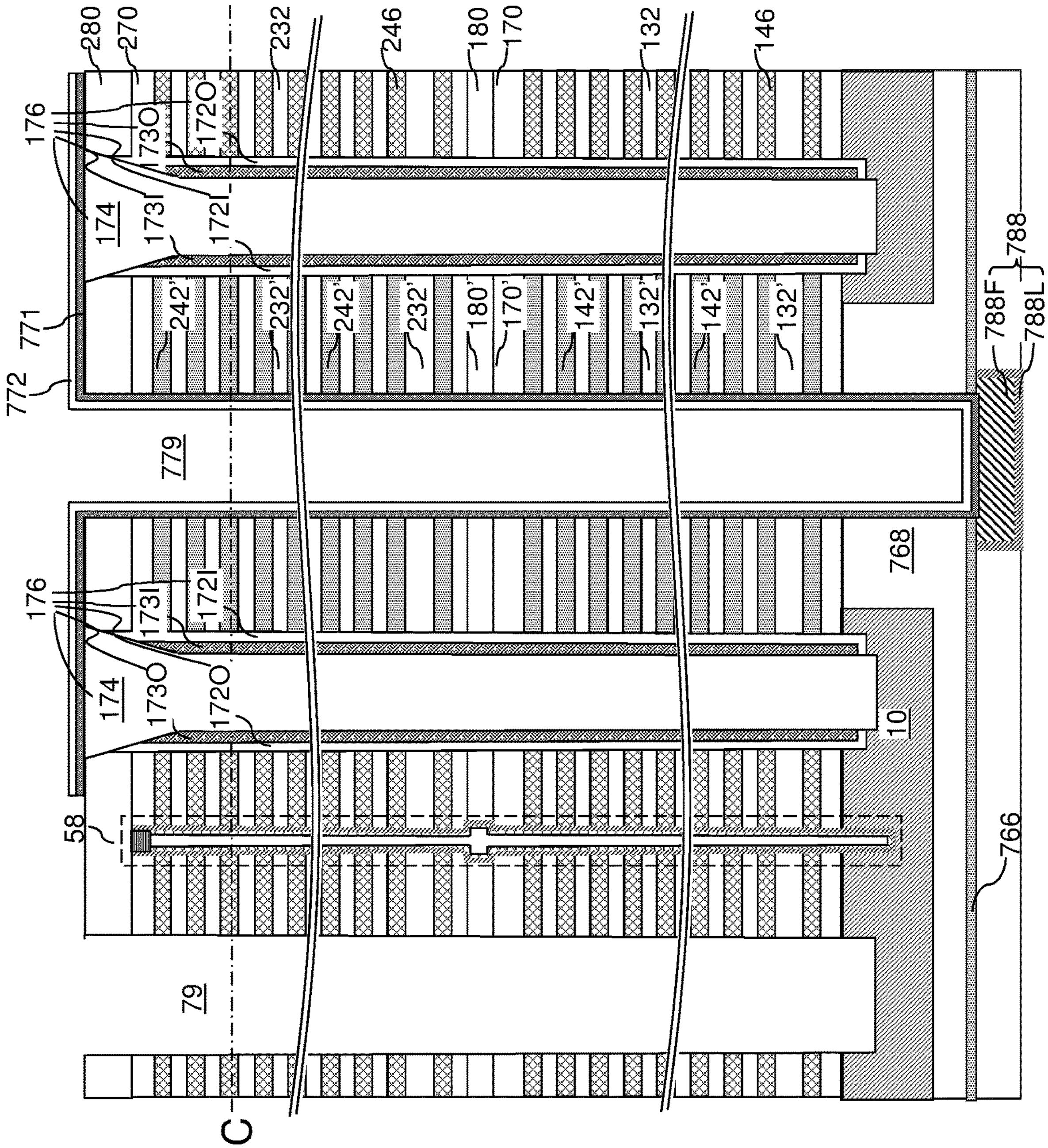
FIG. 19B is another vertical cross-sectional view of the exemplary structure of FIG. 19A.
Figure 19C:
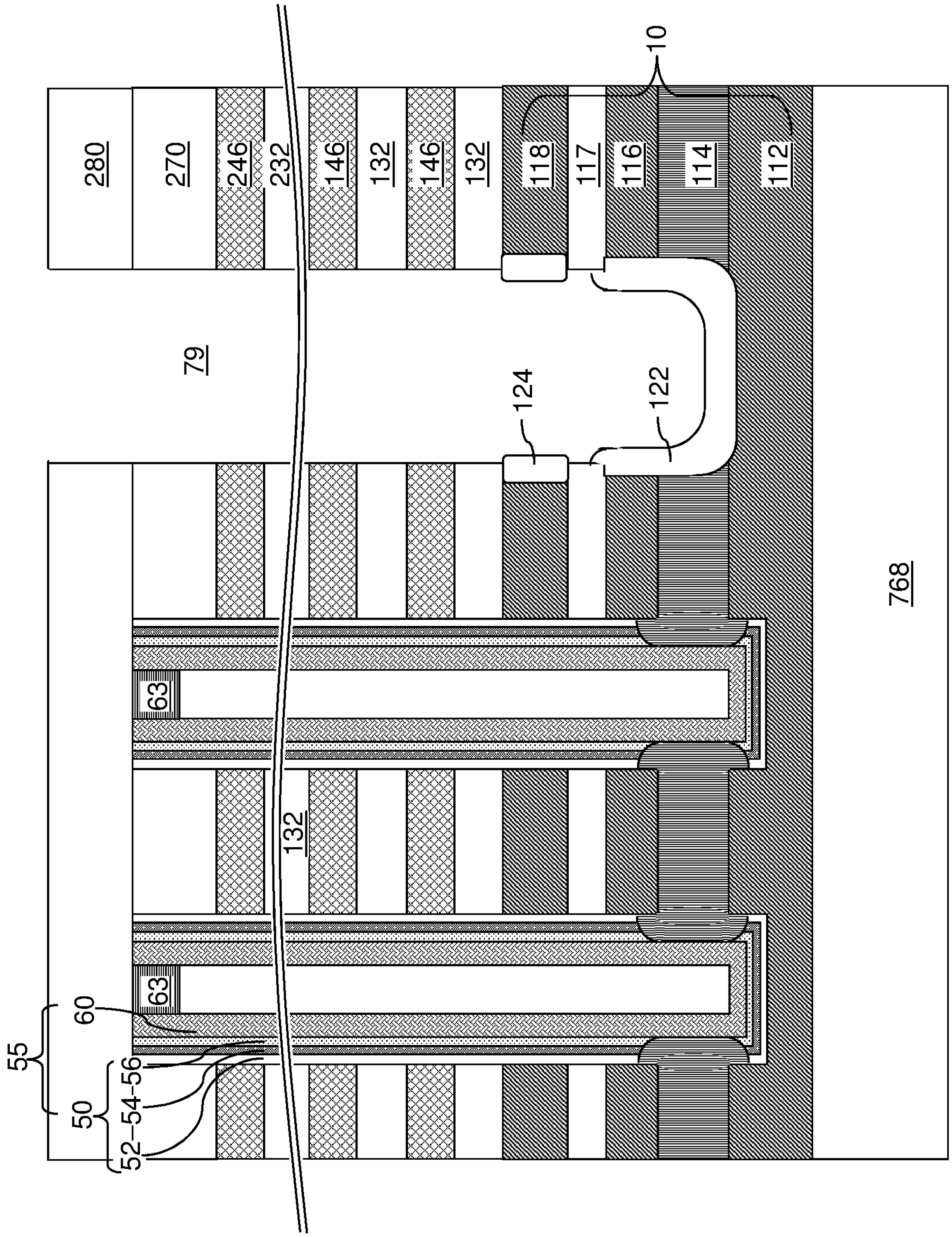
FIG. 19C is yet another vertical cross-sectional view of the exemplary structure of FIGS. 19A and 17B.

Referring to FIGS. 19A-19C, a backside blocking dielectric layer (not shown) may be optionally deposited in the backside recesses (143, 243) and the backside trenches 79 and over the contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive layers 146 and the second electrically conductive layers may be physically exposed to a respective backside trench 79.

Remaining portions of the first sacrificial material layers 142 located outside the dielectric moat fill structures 176 are replaced with the first electrically conductive layers 146, and remaining portions of the second sacrificial material layers 242 outside the dielectric moat fill structures 176 are replaced with the second electrically conductive layers 246. Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes alternating stack {(132, 146), (232, 246)} and memory stack structures 55 vertically extending through the alternating stack (132, 146, 232, 246). Generally, portions of the sacrificial material layers (142, 242) located outside the dielectric moat fill structures 176 are replaced with the electrically conductive layers (146, 246) so that an alternating stack {(132, 146), (232, 246)} of insulating layers (132, 232) and electrically conductive layers (146, 246) is formed outside the dielectric moat fill structures 176.

A three-dimensional array of memory elements can be formed over the lower-level dielectric material layers 760. The three-dimensional array of memory elements comprises an alternating stack of insulating layers (132, 232) and electrically conductive layers (146, 246) overlying a semiconductor material layer within the source-level material layers 10, memory stack structures 55 vertically extending through the alternating stack and comprising a respective vertical semiconductor channel 60 and a respective memory film 50, and a vertically alternating sequence of insulating plates (132', 232') and dielectric material plates (142', 242') laterally surrounded by the alternating stack {(132, 146), (232, 246)}.

Figure 20A:
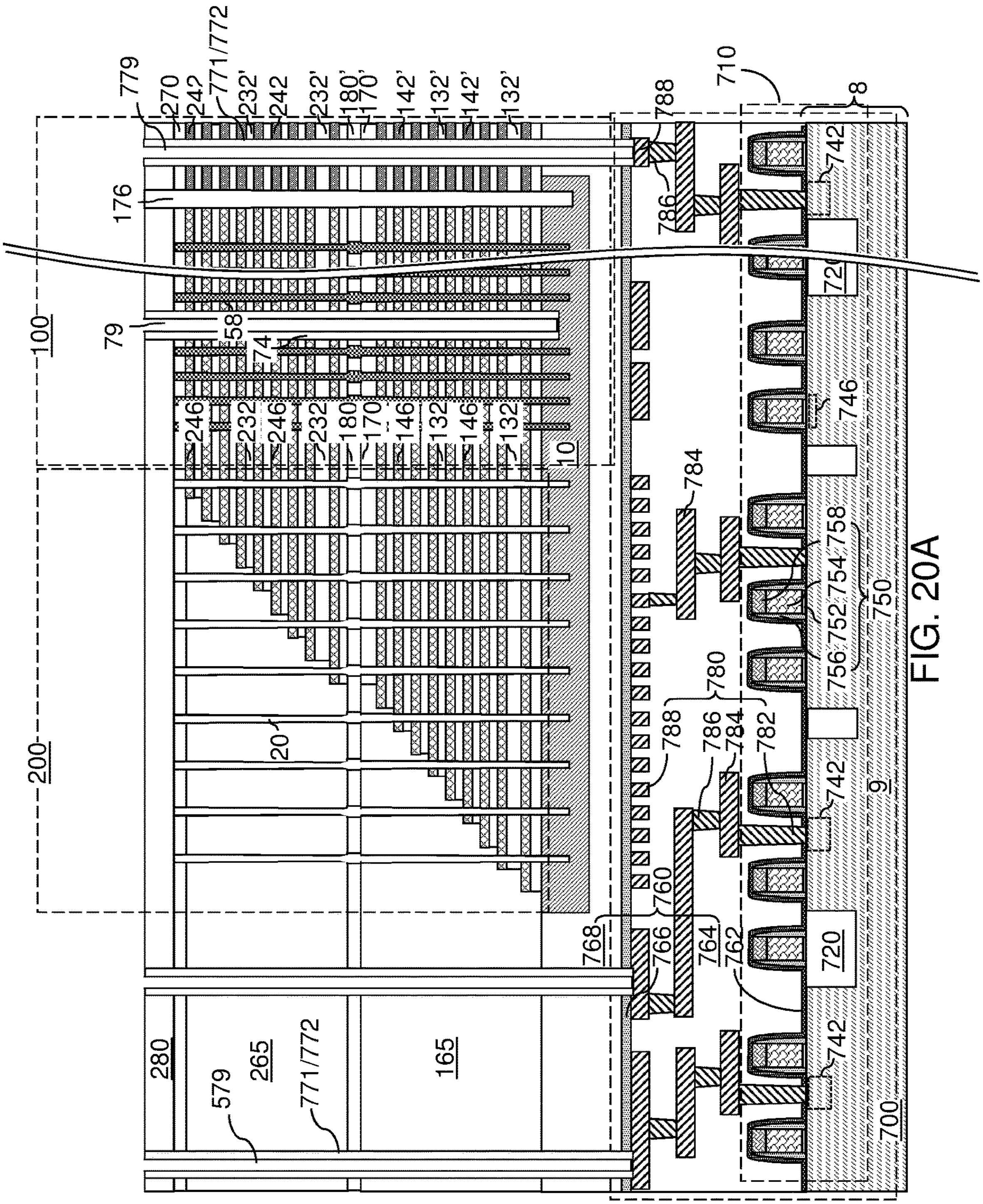
FIG. 20A is a vertical cross-sectional view of the exemplary structure after formation of insulating spacers according to an embodiment of the present disclosure.
Figure 20B:
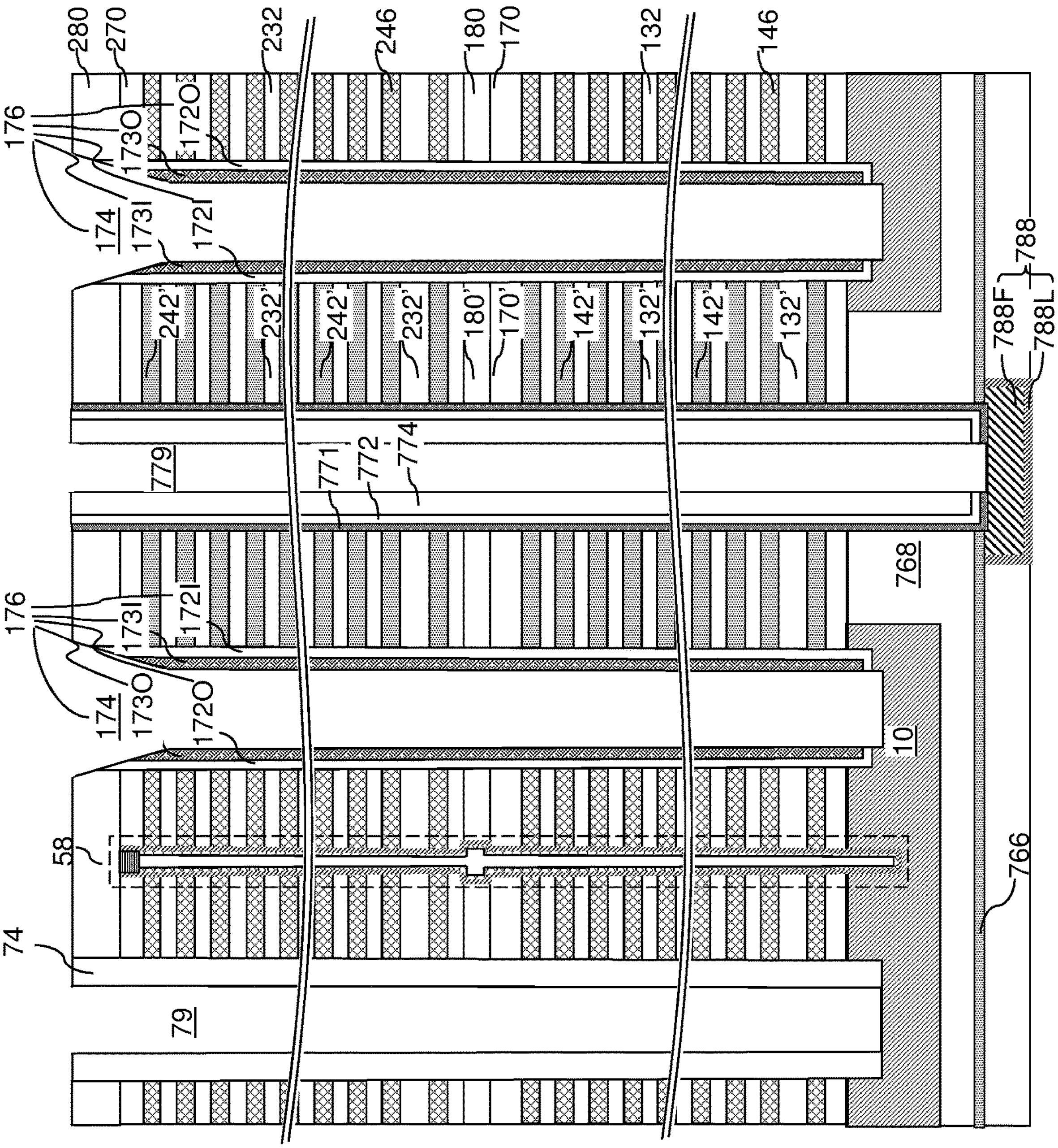
FIG. 20B is another vertical cross-sectional view of the exemplary structure of FIG. 20A.
Figure 20C:
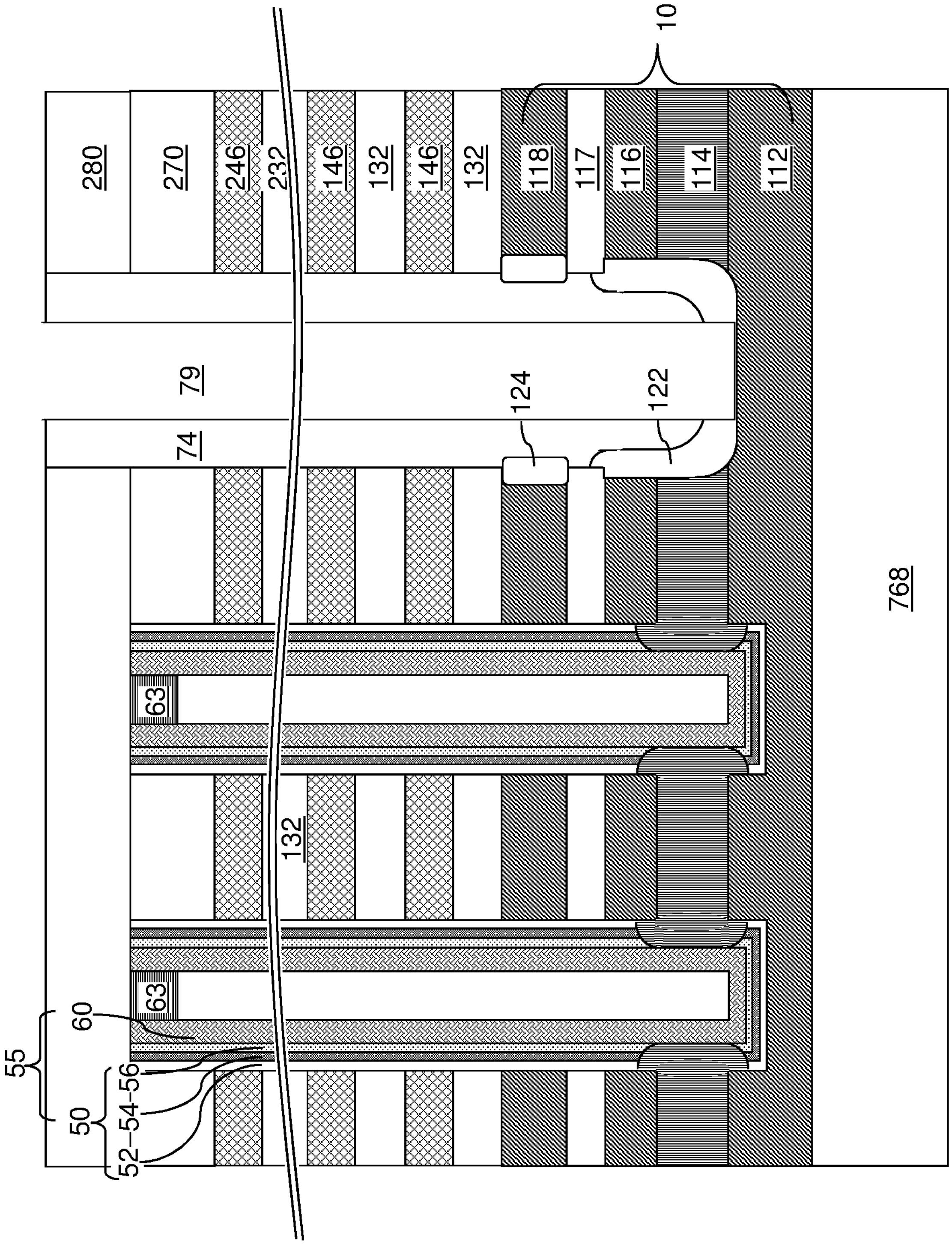
FIG. 20C is yet another vertical cross-sectional view of the exemplary structure of FIGS. 20A and 18B.
Figure 21A:
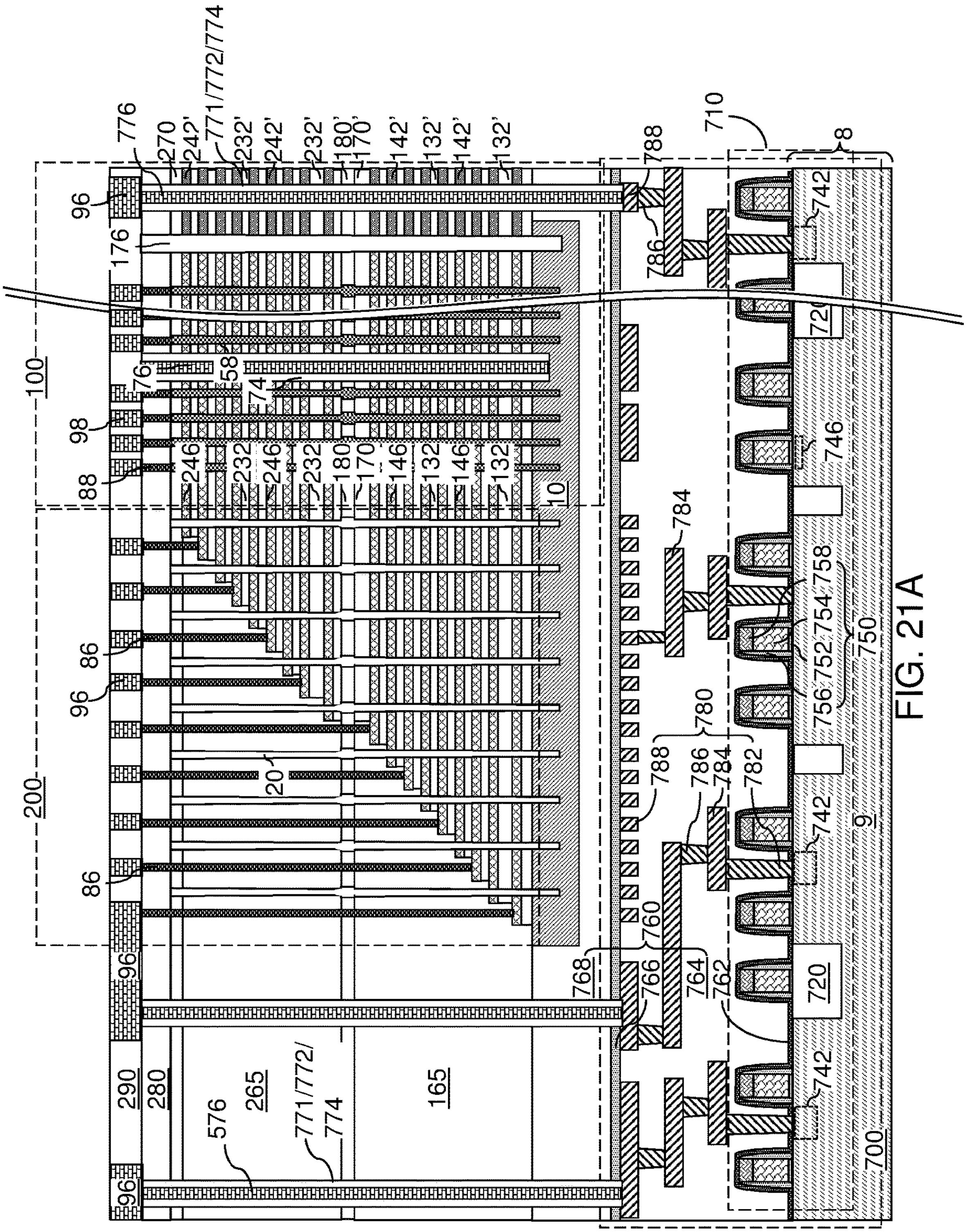
FIG. 21A is a vertical cross-sectional view of the exemplary structure after formation of various contact via structures and upper-level metal interconnect structures according to an embodiment of the present disclosure.
Figure 21B:
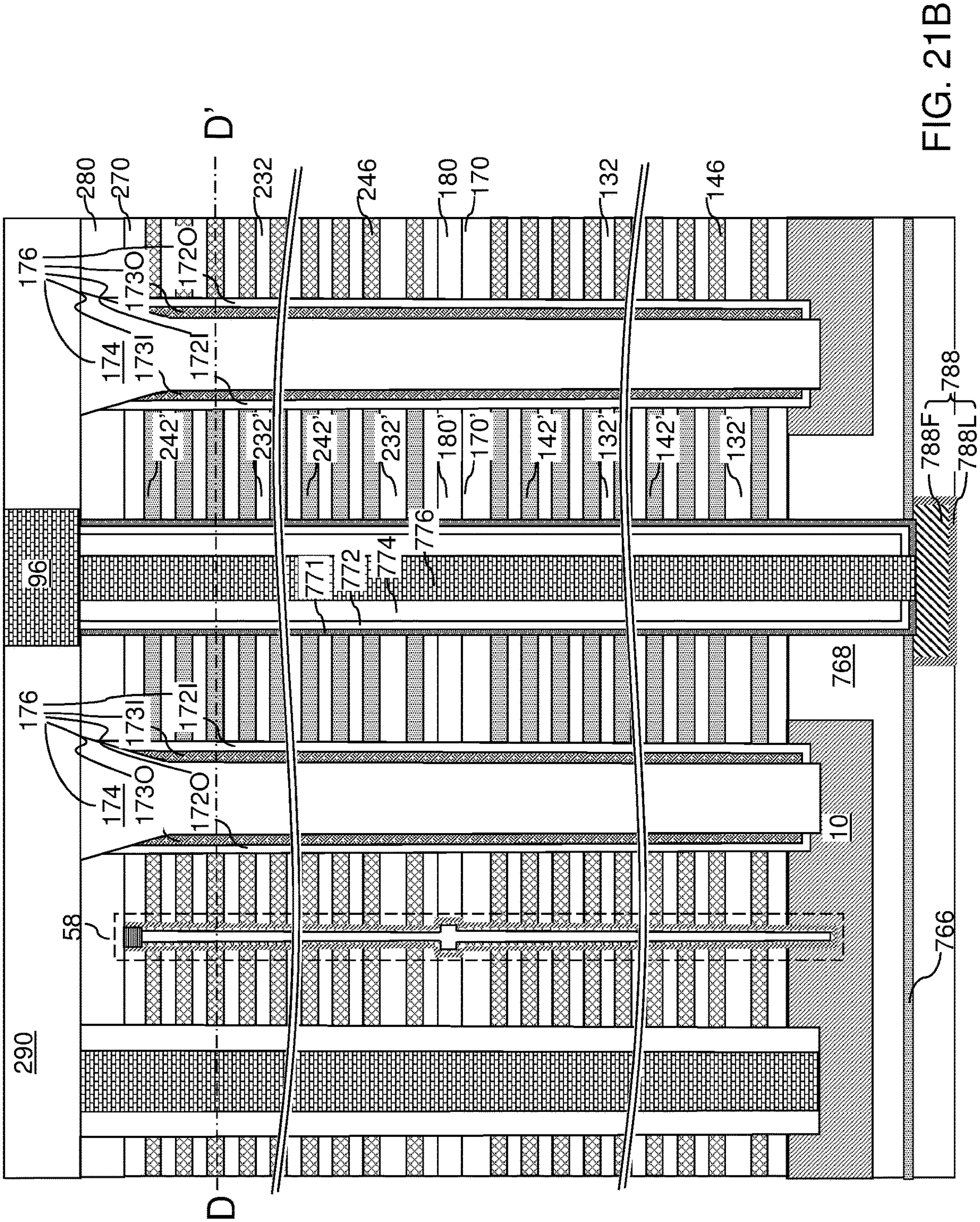
FIG. 21B is another vertical cross-sectional view of the exemplary structure of FIG. 21A.
Figure 21C:
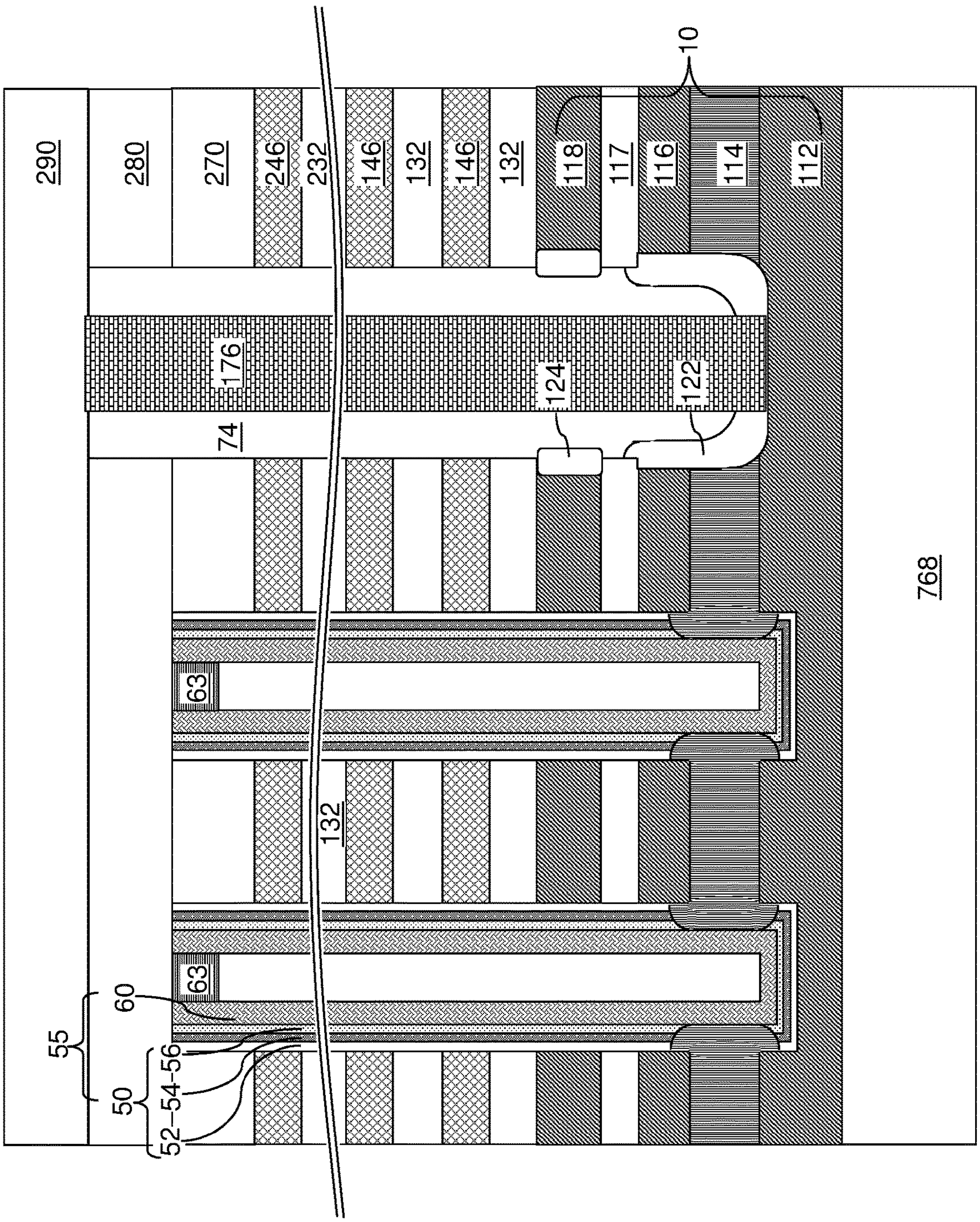
FIG. 21C is yet another vertical cross-sectional view of the exemplary structure of FIGS. 21A and 19B.
Figure 21D:
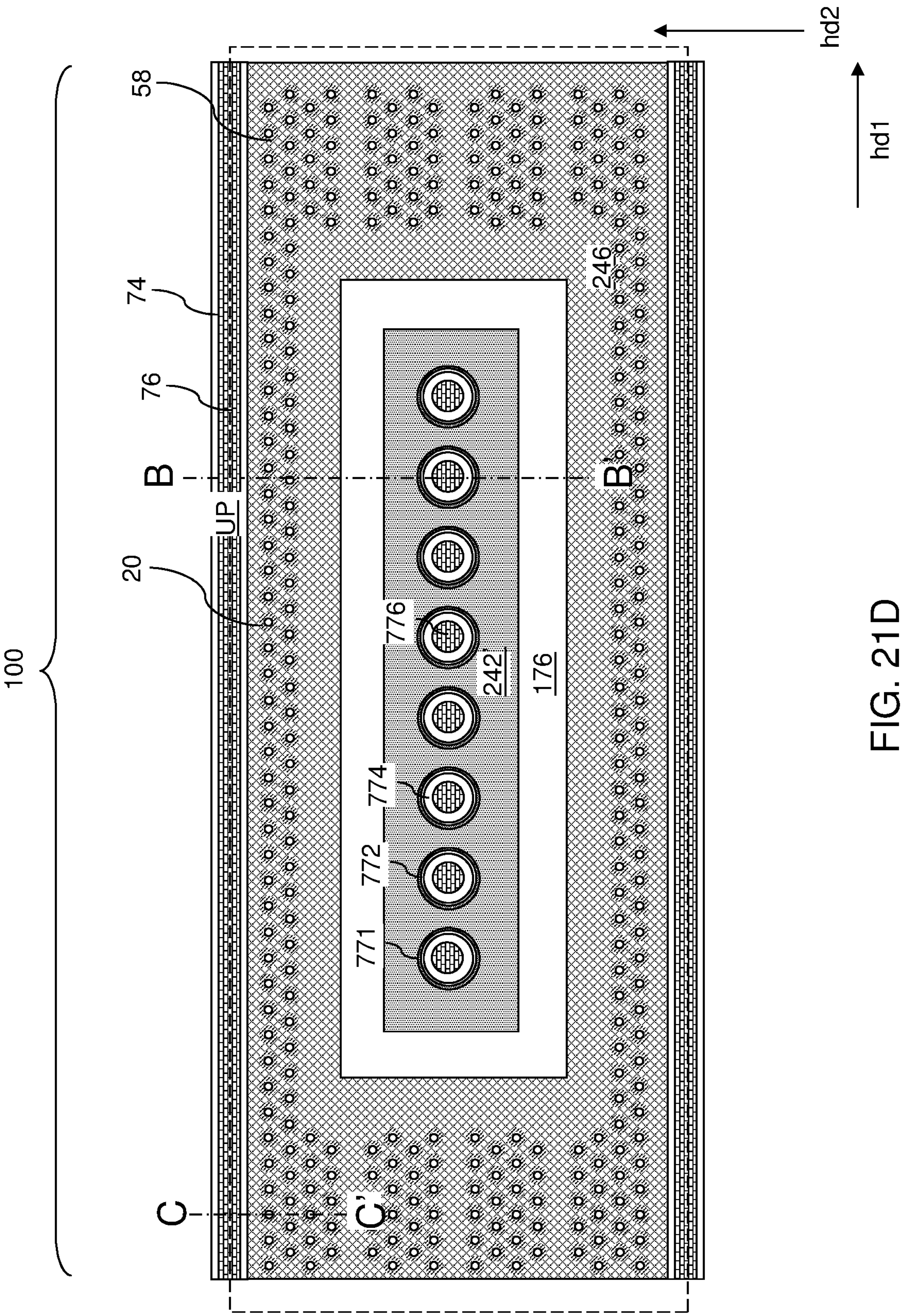
FIG. 21D is a horizontal cross-sectional view along the horizontal plane D-D' of FIG. 21B. The vertical cross-sectional plane B-B' is the plane of the vertical cross-section of FIG. 21B. The vertical cross-sectional plane C-C' is the plane of the vertical cross-section of FIG. 21C.

Referring to FIGS. 20A-20C, a dielectric material such as silicon oxide can be conformally deposited in the backside trenches 79 and the through-memory-level via cavities (779, 579), and can be anisotropically etched. Remaining patterned vertically-extending portions of the dielectric material in the backside trenches 79 comprise backside insulating spacers 74. Remaining patterned vertically-extending portions of the dielectric material in the first through-memory-level via cavities 779 comprise first insulating spacers 774. Remaining patterned vertically-extending portions of the dielectric material in the second through-memory-level via cavities 579 comprise second insulating spacers 574. The lateral thickness of the backside insulating spacers 74, the first insulating spacers 774, the second insulating spacers 574 may have a thickness in a range from 6 nm to 100 nm, such as from 12 nm to 50 nm, although lesser and greater thicknesses may also be employed.

Referring to FIGS. 21A-21D, a photoresist layer (not shown) can be applied over the exemplary structure, and can be lithographically patterned to form opening in areas that overlie the memory opening fill structures 58 and in areas that overlie the stepped surfaces of the alternating stack {(132, 146), (232, 246)}. Drain contact via cavities are formed over the drain regions 63 of the memory opening fill structures 58. Layer contact via cavities are formed over the stepped surfaces of the alternating stack {(132, 146), (232, 246)}.

At least one metallic material (such as a combination of a metallic nitride liner (e.g., TiN, TaN, or WN) and a metallic fill material (e.g., W, Cu, Mo, Ru, Co, etc.)) may be deposited in unfilled volumes of the backside trenches 79, the through-memory-level via cavities (779, 579), the drain contact via cavities, and the layer contact via cavities. Excess portions of the at least one metallic material can be removed from above the horizontal plane including the contact-level dielectric layer 280 by a planarization process. Horizontally-extending portions of the conformal silicon oxide liner 772 and the conformal silicon nitride liner 771 (if present) can be removed from above the horizontal plane including the contact-level dielectric layer 280 by the planarization process. This embodiment may reduce or prevent oxidation of electrically conductive layers, such as tungsten and/or TiN.

A backside contact via structure 76 can be formed within each backside trench 79. A first through-memory-level interconnection via structure 776 can be formed in each first through-memory-level via cavity 779. A second through-memory-level interconnection via structure 576 can be formed in each second through-memory-level via cavity 579. A drain contact via structure 88 can be formed on a top surface of a respective one of the drain regions 63. Layer contact via structures 86 can be formed on a top surface of a respective one of the electrically conductive layers (146, 246).

In one embodiment, each first through-memory-level interconnection via structure 776 contacts a center portion of a top surface of a respective one of the lower-level metal interconnect structures 680, such as a metal pad structure 788. At least one silicon nitride liner (766, 771) contacts a peripheral portion of the top surface of the respective one of the lower-level metal interconnect structures 680 and contacts a cylindrical bottom end portion of a sidewall of the first through-memory-level interconnection via structure 776. Each first through-memory-level interconnection via structure 776 vertically extends through each plate within a respective vertically alternating sequence of insulating plates (132', 232') and dielectric material plates (142', 242') and contacts a center portion of a top surface of a respective one of the lower-level metal interconnect structures 680. The planar silicon nitride liner 771 laterally extends over, and contacts a top surface of, a plurality of the lower-level metal interconnect structures 780.

Each conformal silicon nitride liner 771 formed within a first through-memory-level via cavity 779 is herein referred to as a first conformal silicon nitride liner, and each conformal silicon nitride liner 771 formed within a second through-memory-level via cavity 579 is herein referred to as a second conformal silicon nitride liner. Each conformal silicon oxide liner 772 formed within a first through-memory-level via cavity 779 is herein referred to as a first conformal silicon oxide liner, and each conformal silicon oxide liner 772 formed within a second through-memory-level via cavity 579 is herein referred to as a second conformal silicon oxide liner. Each of the conformal silicon nitride liner 771 and the conformal silicon oxide liners 772 can have a top surface within a horizontal plane including the top surfaces of the through-memory-level interconnection via structures (776, 576) and the backside contact via structures 76.

In one embodiment, each backside contact via structure 76 vertically extends through the alternating stack of insulating layers {(132, 146), (232, 246)}, contacts one of the source-level material layers 10, and comprising a same material as the through-memory-level interconnection via structures (776, 576). A backside insulating spacer 74 laterally surrounds each backside contact via structure 76 and contacts each layer within the alternating stack {(132, 146), (232, 246)}.

Generally, at least one interconnection via structure (such as at least one first through-memory-level interconnection via structure 776) may be formed through each of the insulating plates (132', 232') and each of the dielectric material plates (142', 242') within the vertically alternating sequence {(132', 142'), (232', 242')}. In this case, each of the at least one interconnection via structure (such as at least one first through-memory-level interconnection via structure 776) vertically extends through each of the insulating plates (132', 232') and each of the dielectric material plates within the vertically alternating sequence {(132', 142'), (232', 242')}. In one embodiment, one, a plurality and/or each of interconnection via structures 776 may contact a top surface of one of the lower-level metal interconnect structures 780. In one embodiment, a source contact layer 114 may be located between the lower-level dielectric material layers 760 and the alternating stack {(132, 146), (232, 246)}, and may comprise at least one opening therethrough. In this case, one, a plurality and/or each of the interconnection via structures (such as the first through-memory-level interconnection via structures 776) may vertically extend through a respective opening in the source contact layer 114, and may be laterally spaced from the source contact layer 114.

Subsequently, a line-level dielectric material layers 290 and upper-level metal interconnect structures (98, 96) can be formed. The upper-level metal interconnect structures (98, 96) can include bit lines 98 and connection metal lines (e.g., word line interconnects) 96. Additional upper-level dielectric material layers (not shown) and additional upper-level metal interconnect structures (not shown) may be formed as needed.

Figure 22A:
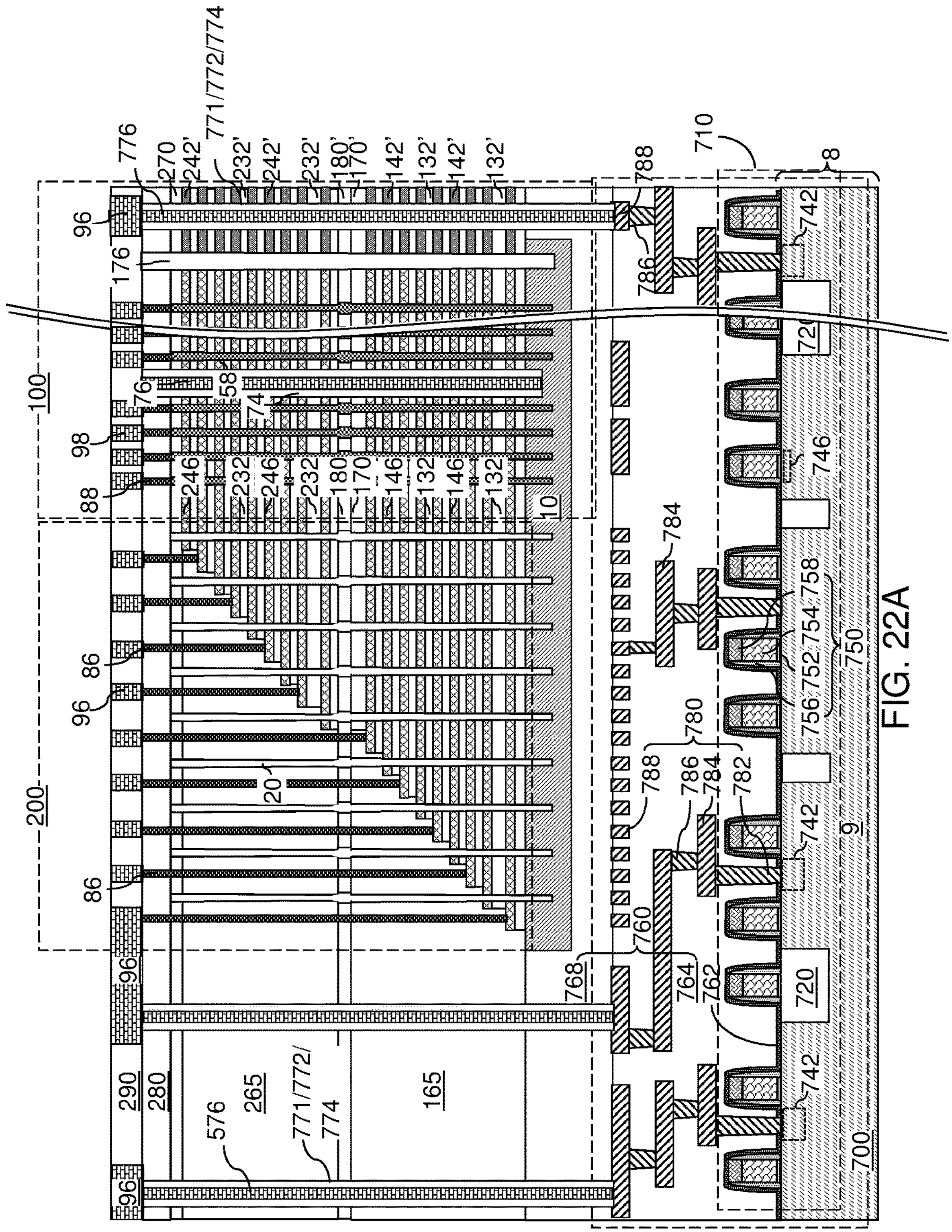
FIG. 22A is a vertical cross-sectional view of a first alternative configuration of the exemplary structure after formation of various contact via structures and upper-level metal interconnect structures according to an embodiment of the present disclosure.
Figure 22B:
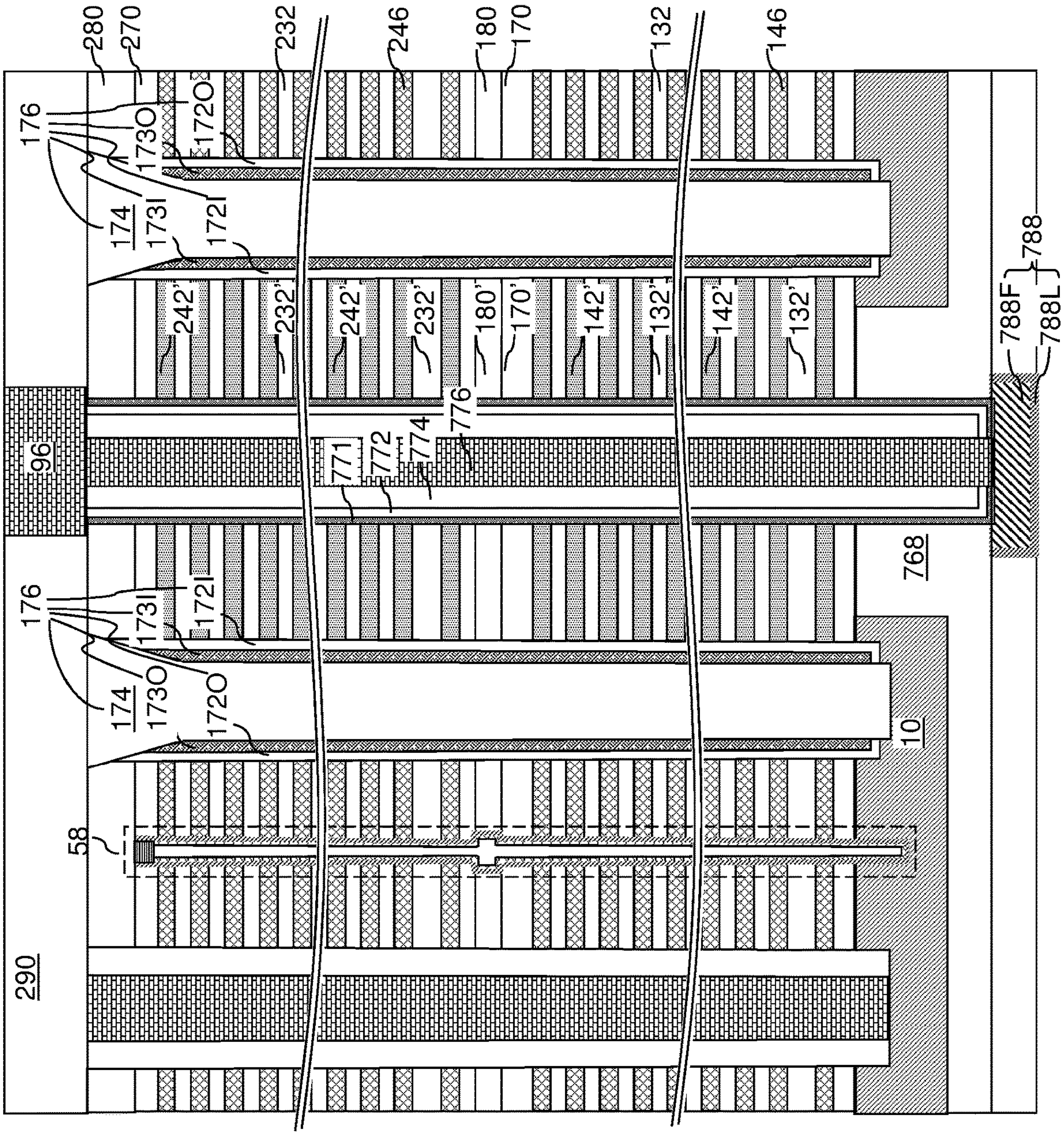
FIG. 22B is another vertical cross-sectional view of the exemplary structure of FIG. 22A.

Referring to FIGS. 22A and 22B, a first alternative configuration of the exemplary structure can be derived from the exemplary structure of FIGS. 21A-21D by omitting formation of the planar silicon nitride liner 766. In this case, the first and second conformal silicon nitride liners 771 function as oxidation barriers during the oxidation process, and prevents or reduced oxidation of underlying lower-level metal interconnect structures 780 such as the metal pad structures 788.

Figure 23A:
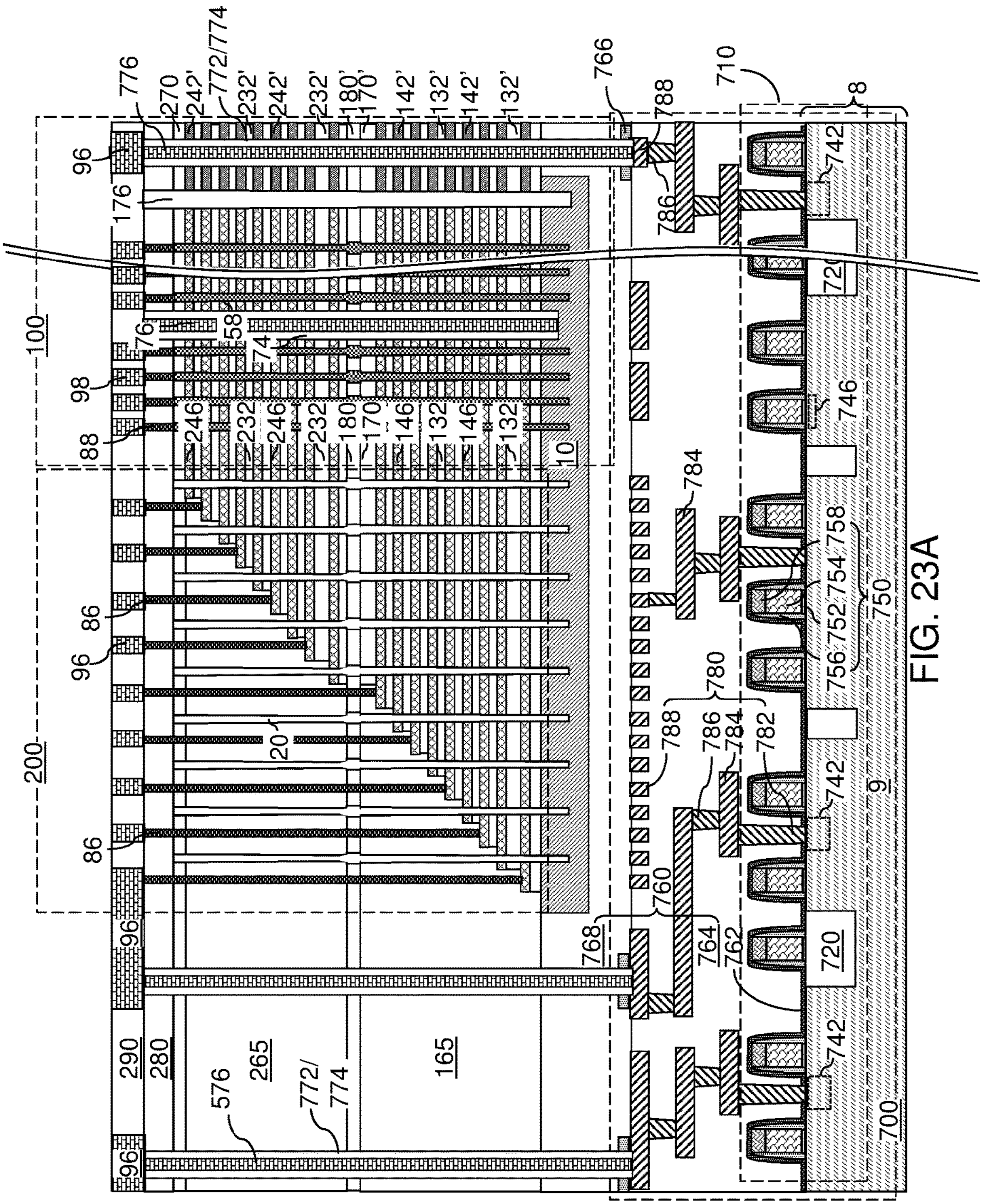
FIG. 23A is a vertical cross-sectional view of a second alternative configuration of the exemplary structure after formation of various contact via structures and upper-level metal interconnect structures according to an embodiment of the present disclosure.
Figure 23B:
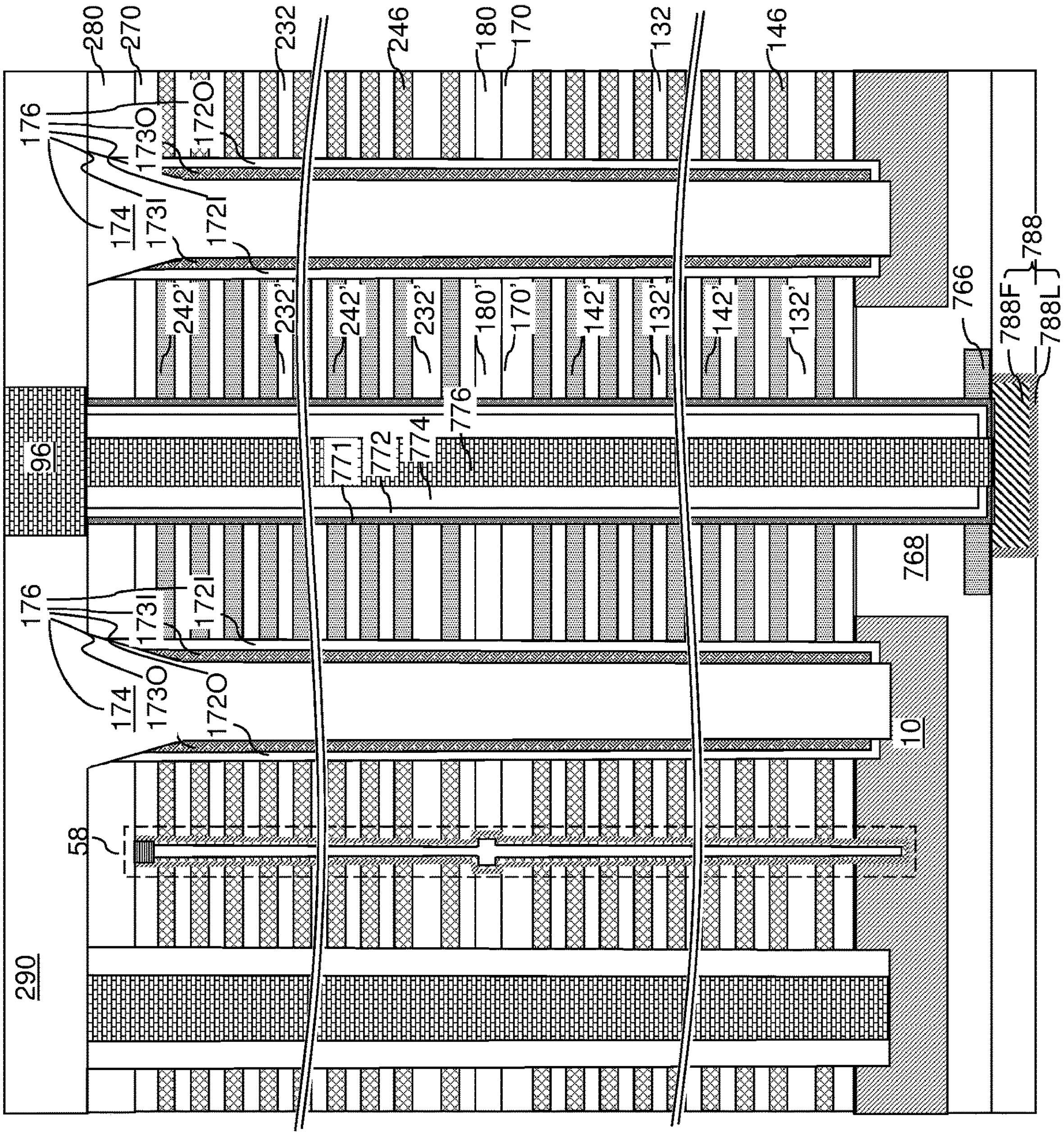
FIG. 23B is another vertical cross-sectional view of the exemplary structure of FIG. 23A.

Referring to FIGS. 23A and 23B, a second alternative configuration of the exemplary structure can be derived from the exemplary structure of FIGS. 21A-21D by patterning a continuous planar silicon nitride liner 766 into a plurality of discrete planar silicon nitride liners 766 that are not interconnected among one another. In one embodiment, each planar silicon nitride liner does not contact any other of the lower-level metal interconnect structures. The planar silicon nitride liners 766 and the first and second conformal silicon nitride liners 771 function as oxidation barriers during the oxidation process. The planar silicon nitride liner 766 preferably has a thickness greater than 2 nm, such as a thickness in a range from 4 nm to 40 nm, such as from 6 nm to 20 nm. Preferably, the planar silicon nitride liner 766 extends at least 300 nm, such as 400 nm to 1 micron, from the edges of the through-memory-level via cavities (779, 579).

Referring to FIGS. 24A-24D, a third alternative configuration of the exemplary structure can be derived from the exemplary structure of FIGS. 21A-21D by omitting formation of the conformal silicon nitride liner 771 at the processing steps of FIGS. 14A-14C and by forming a conformal silicon oxide liner 772 at the processing steps of FIGS. 15A-15C by oxidizing the entire thickness of the silicon nitride liner 771. Each patterned portion of the conformal silicon oxide liner 772 after the planarization process at the processing steps of FIGS. 21A-21D in the first through-memory-level via cavities comprises a first conformal silicon oxide liner, and each patterned portion of the conformal silicon oxide liner 772 after the planarization process at the processing steps of FIGS. 21A-21D in the second through-memory-level via cavities comprises a second conformal silicon oxide liner. In this case, each first conformal silicon oxide liner 772 can contact each plate within a respective vertically alternating sequence of insulating plates (132', 232') and dielectric material plates (142', 242'), and laterally surrounding a first through-memory-level interconnection via structure 776.

Figure 24A:
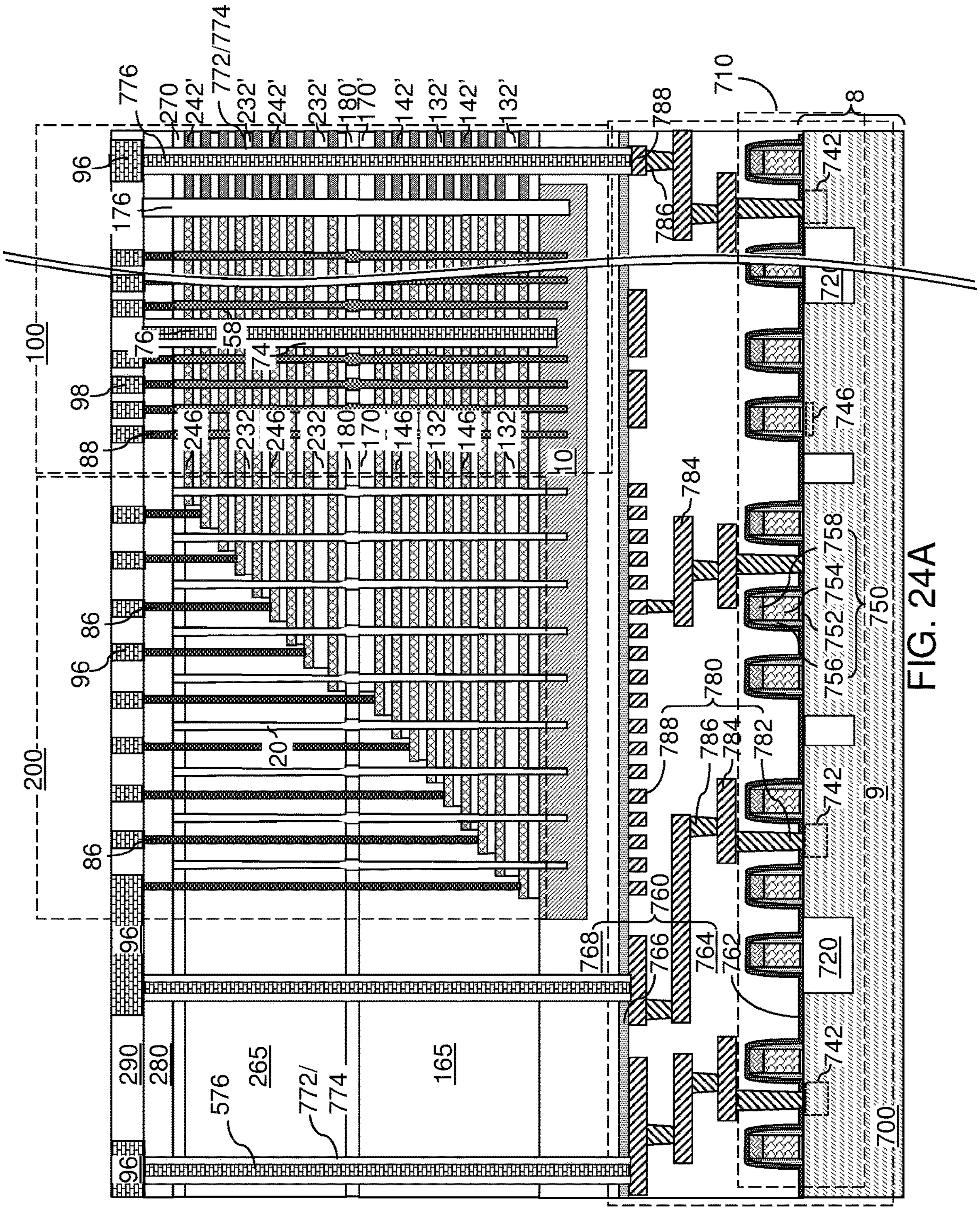
FIG. 24A is a vertical cross-sectional view of a third alternative configuration of the exemplary structure after formation of various contact via structures and upper-level metal interconnect structures according to an embodiment of the present disclosure.
Figure 24B:
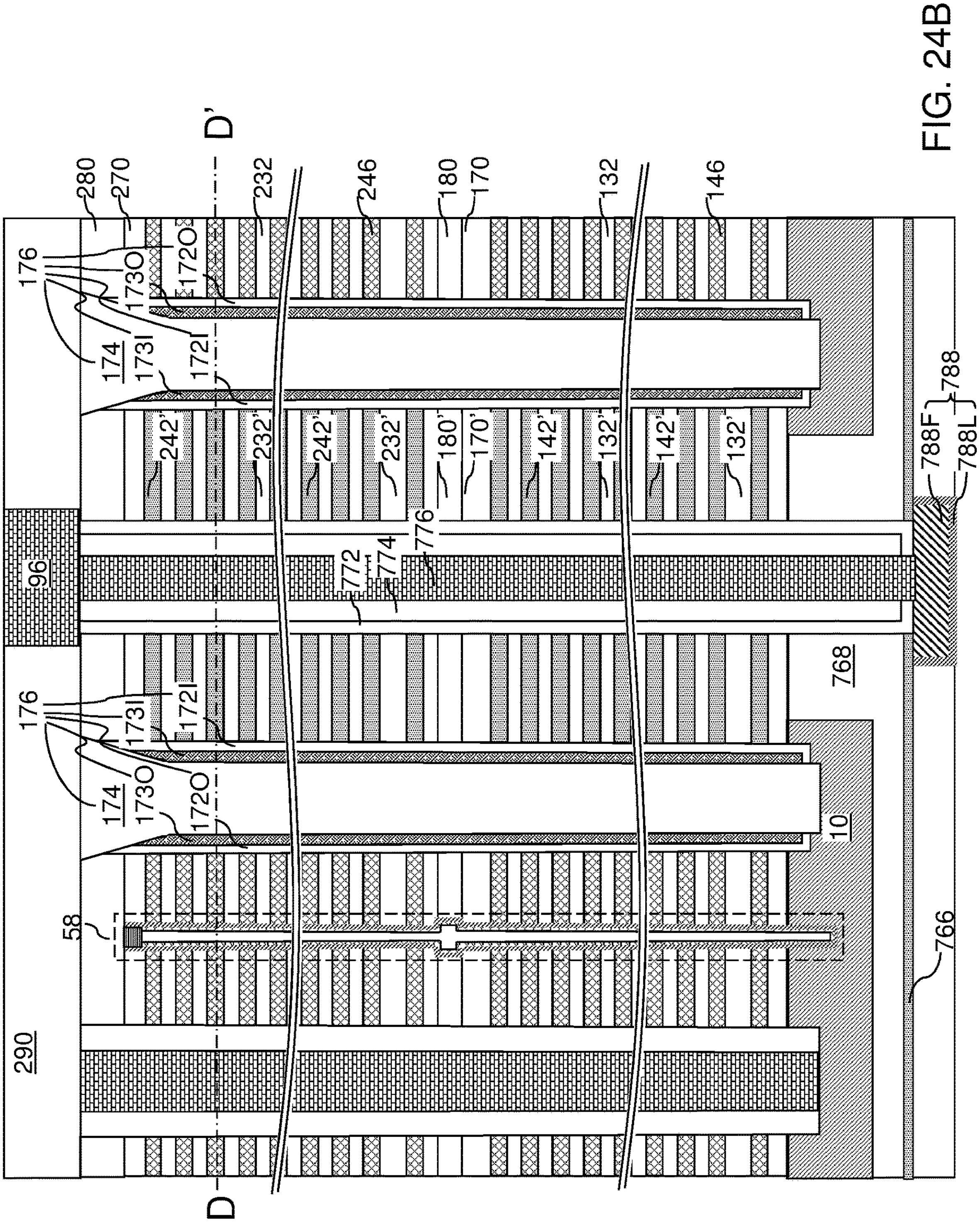
FIG. 24B is another vertical cross-sectional view of the exemplary structure of FIG. 24A.
Figure 24C:
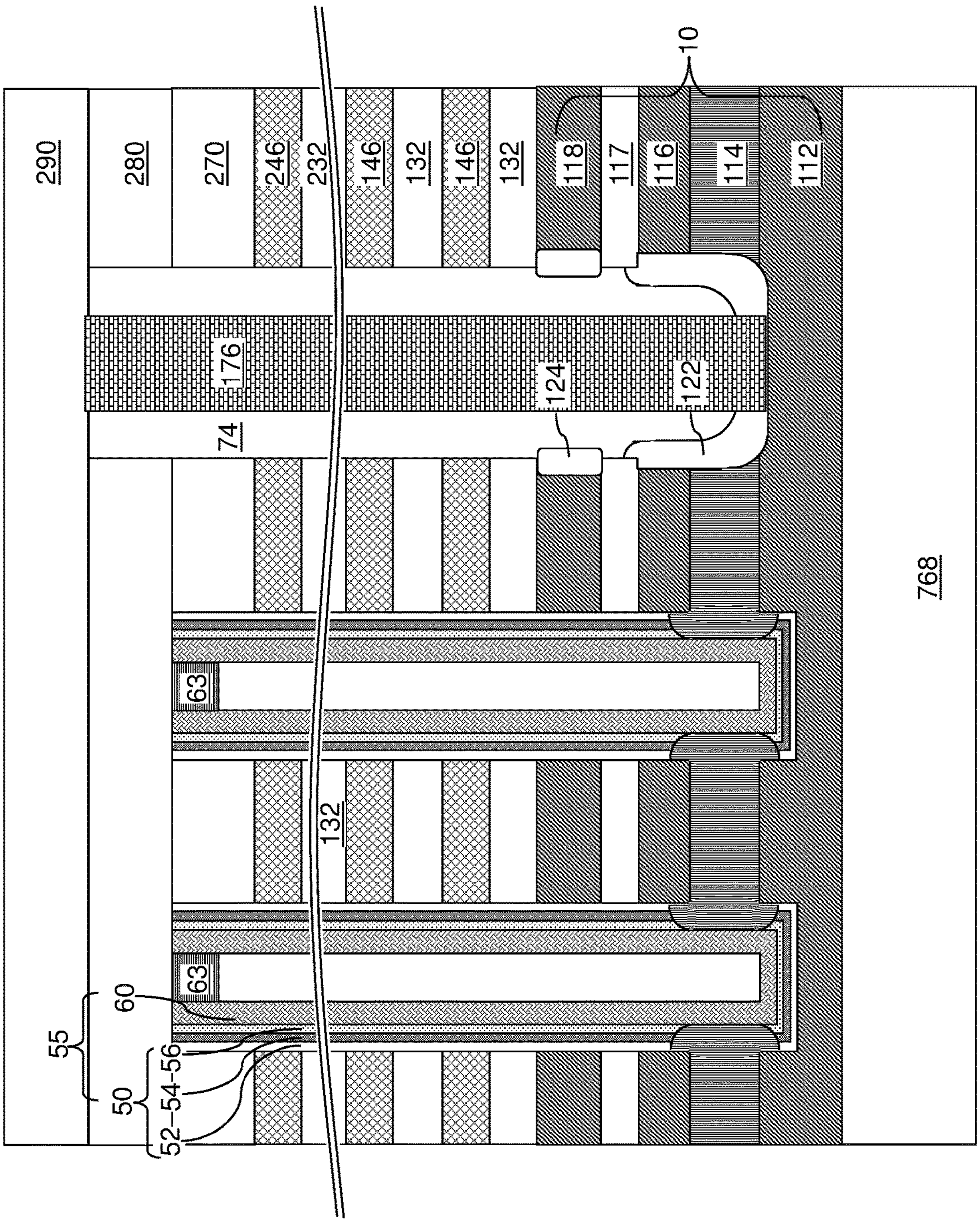
FIG. 24C is yet another vertical cross-sectional view of the exemplary structure of FIGS. 24A and 22B.
Figure 24D:
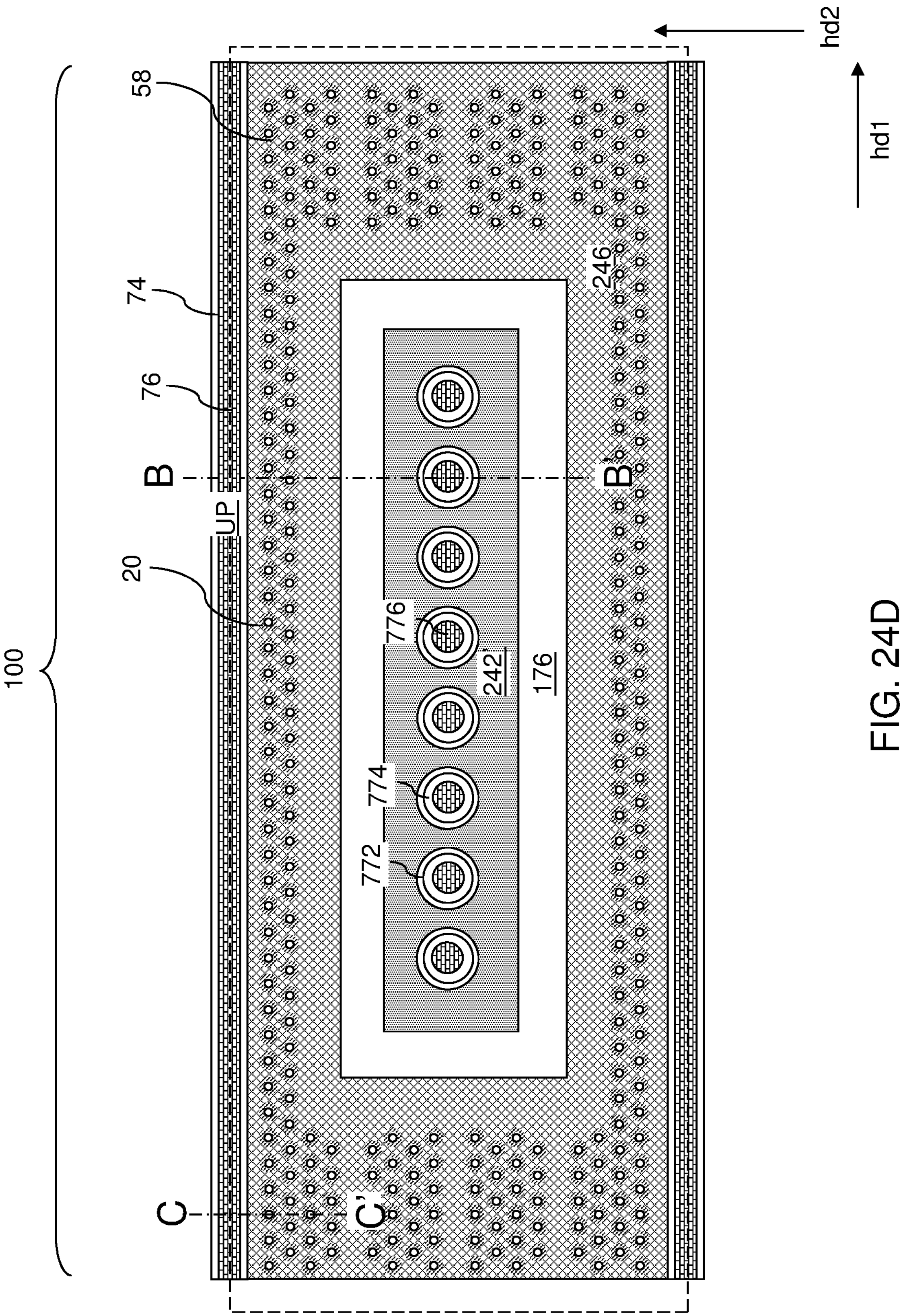
FIG. 24D is a horizontal cross-sectional view along the horizontal plane D-D' of FIG. 24B. The vertical cross-sectional plane B-B' is the plane of the vertical cross-section of FIG. 24B. The vertical cross-sectional plane C-C' is the plane of the vertical cross-section of FIG. 24C.
Figure 25A:
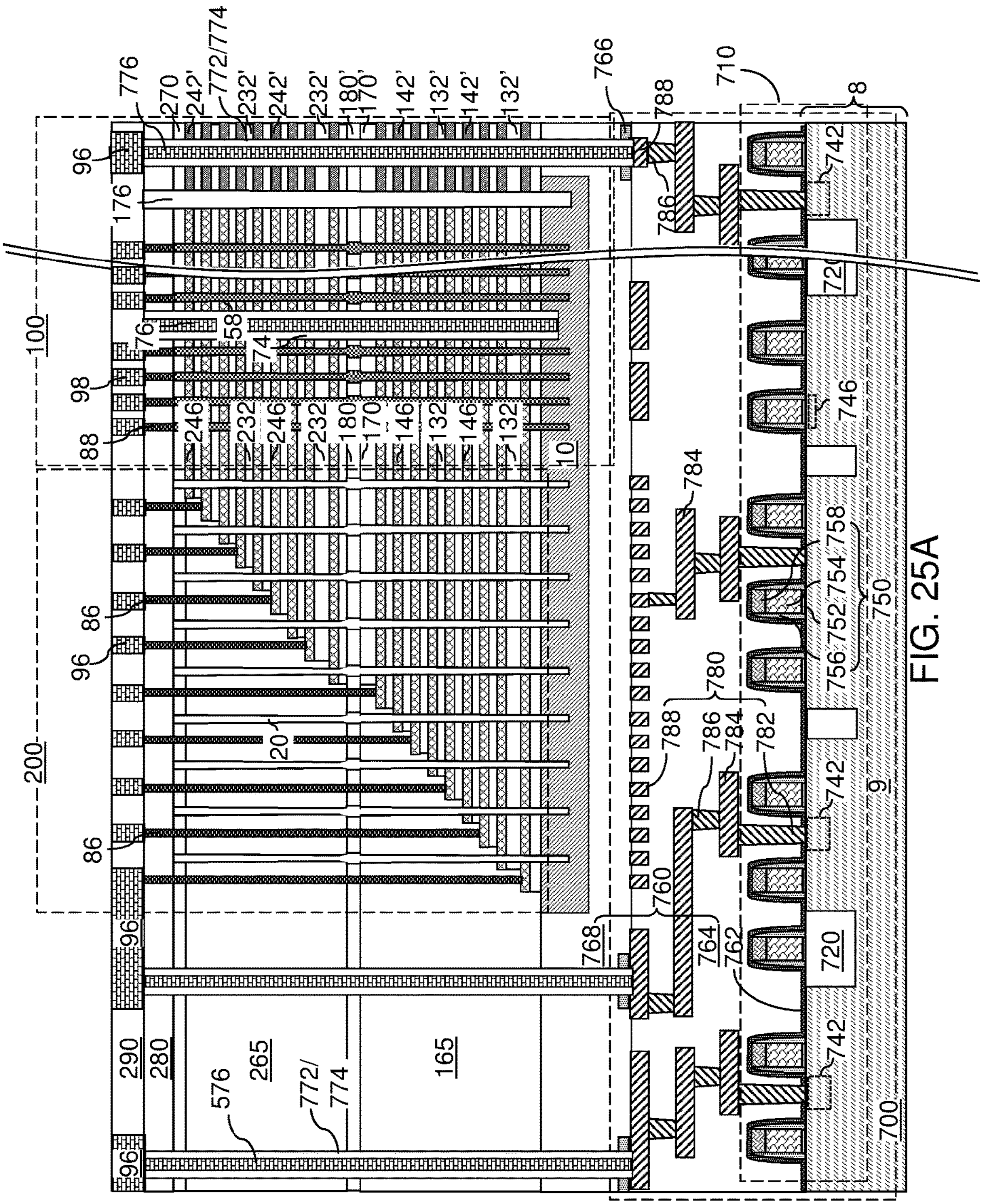
FIG. 25A is a vertical cross-sectional view of a third alternative configuration of the exemplary structure after formation of various contact via structures and upper-level metal interconnect structures according to an embodiment of the present disclosure.
Figure 25B:
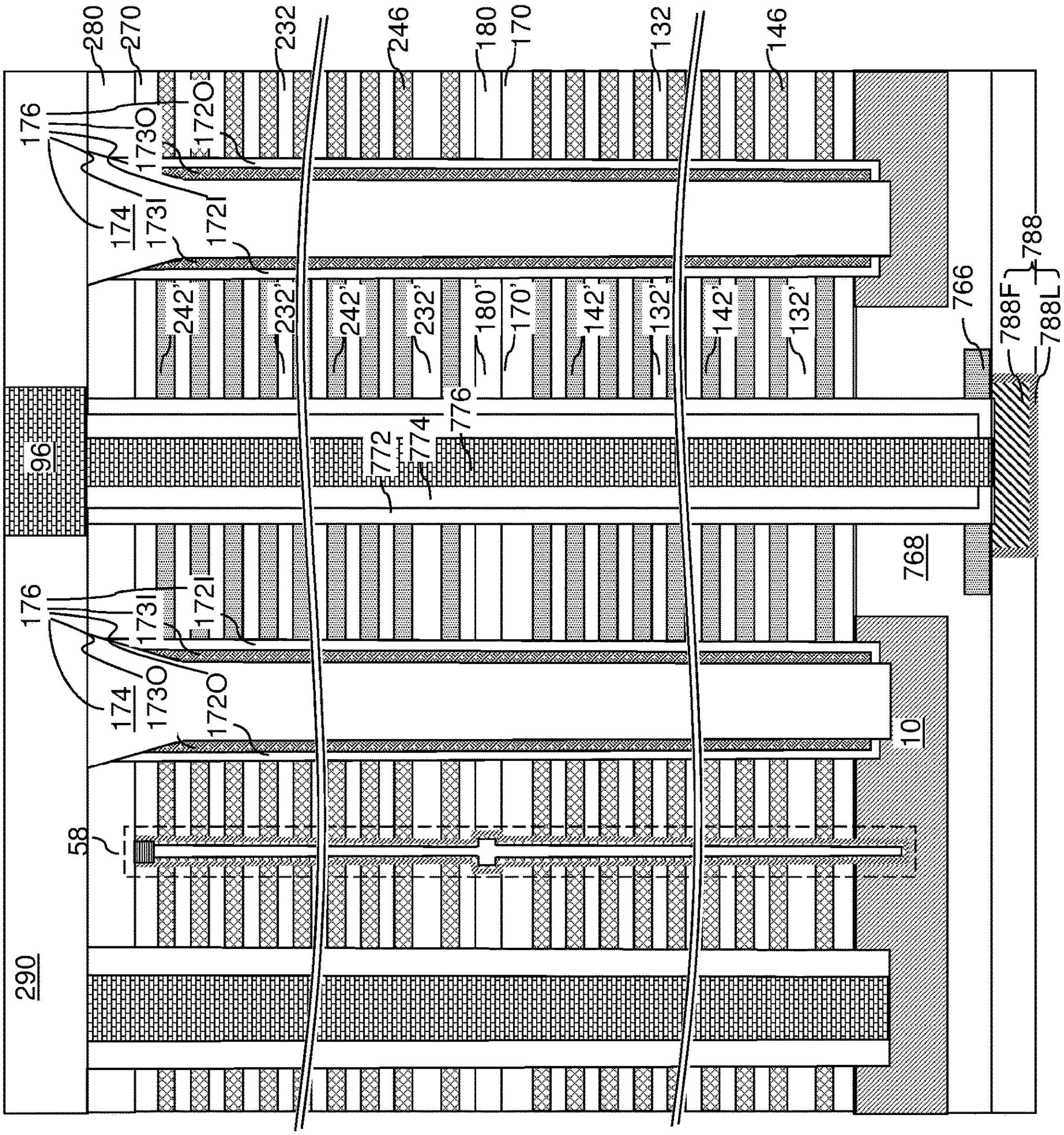
FIG. 25B is another vertical cross-sectional view of the exemplary structure of FIG. 25A.

Referring to FIGS. 25A and 25B, a fourth alternative configuration of the exemplary structure can be derived from the third alternative configuration of the exemplary structure of FIGS. 24A and 24B by patterning the planar silicon nitride liners 766 into a plurality of discrete silicon nitride liners 766. Each silicon nitride liner 766 can contact the entire periphery of a top surface of a respective lower-level metal interconnect structure 780 such as a metal pad structure 788.

In one embodiment, each planar silicon nitride liner 766 may be located entirely below a horizontal plane including a bottom surface of the source-level material layers 10. Each planar silicon nitride liner 766 can contact an entirety of a periphery of the top surface of at least one of the lower-level metal interconnect structures 780.

Figure 26A:
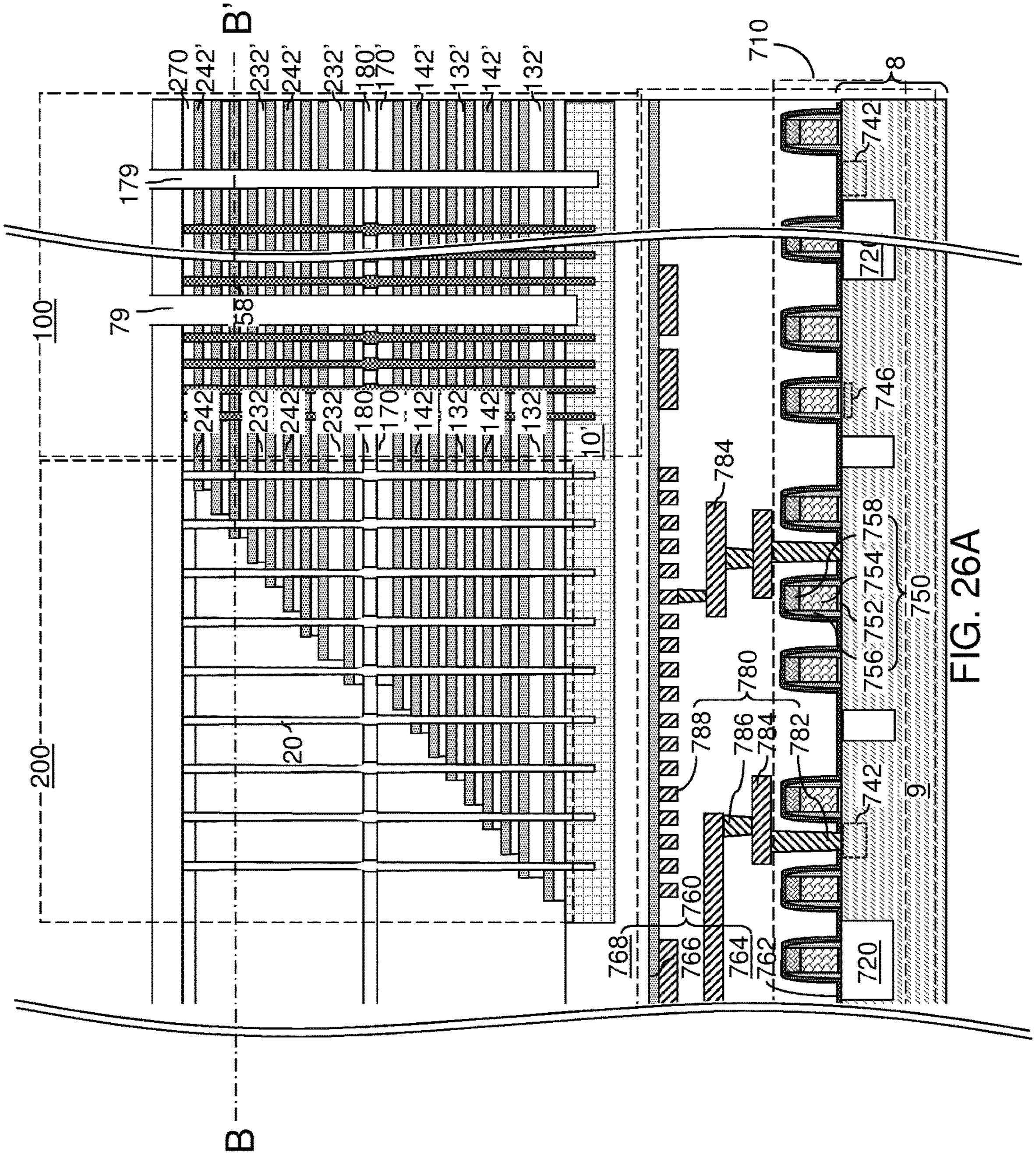
FIG. 26A is a vertical cross-sectional view of the exemplary structure after formation of a moat trench and backside trenches according to an alternative embodiment of the present disclosure.
Figure 26B:
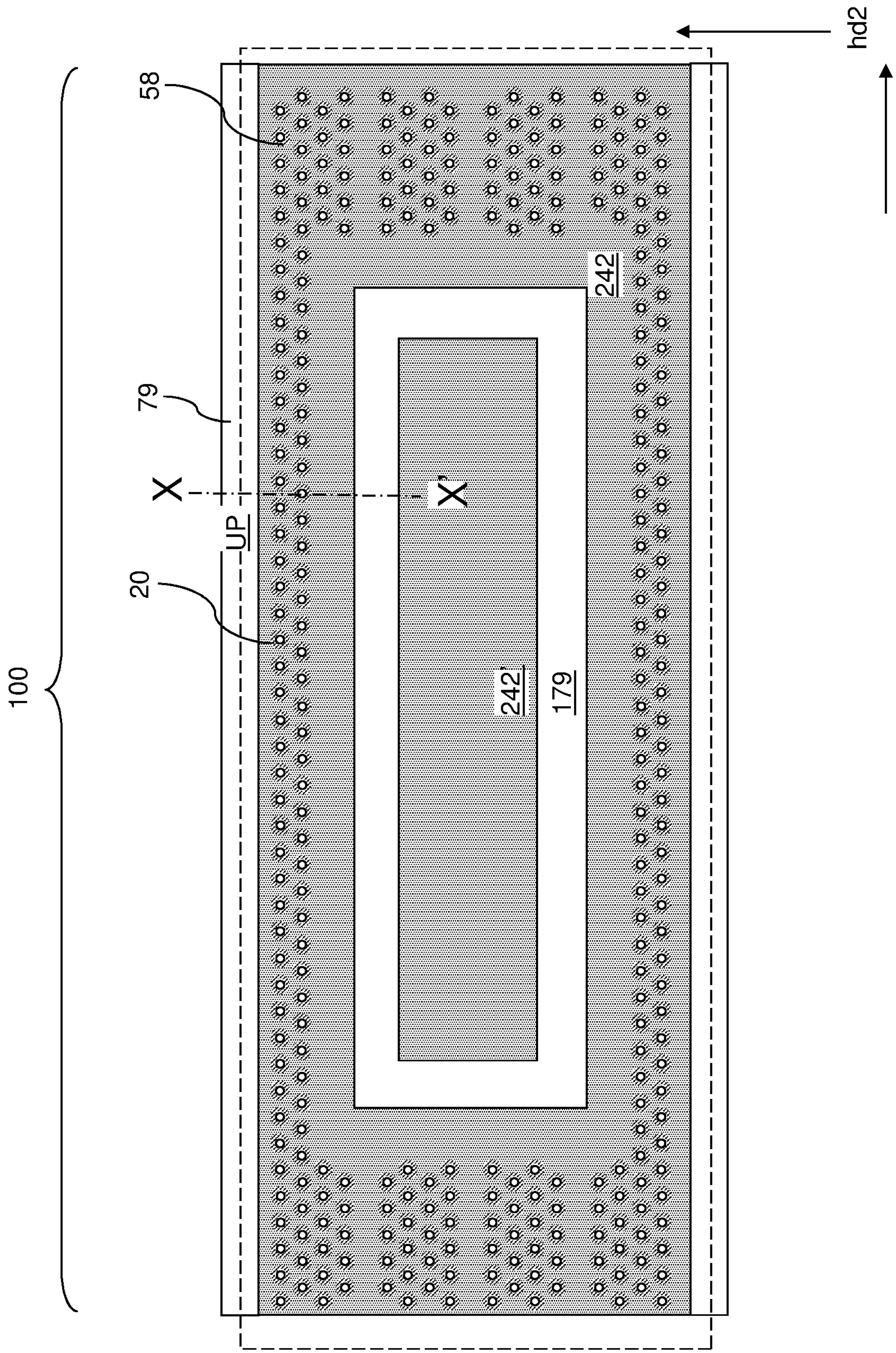
FIG. 26B is a horizontal cross-sectional view along the horizontal plane B-B' of FIG. 26A.

FIGS. 26A and 26B illustrated an exemplary structure after formation of a moat trench and backside trenches according to an alternative embodiment of the present disclosure. FIGS. 27A-27G are sequential vertical cross-sectional views along line X-X' in FIG. 26B of a region of the exemplary structure during formation of a dielectric moat fill structure according to the alternative embodiment of the present disclosure.

As shown in FIGS. 26A and 26B, the backside trenches 79 and the moat trenches 179 may be formed during the same process steps. Thus, the same photoresist layer may be used as a mask to form the backside trenches 79 and the moat trenches 179. Moat-shaped openings and line shaped openings are formed in the photoresist layer. The backside trenches 79 and the moat trenches 179 are etched through the contact-level dielectric layer 280, the second-tier structure (232, 242, 270, 265), and the first-tier structure (132, 142, 170, 165) underneath the respective line-shaped openings and the moat-shaped openings in the photoresist layer.

The steps in FIGS. 27A-27G are based on the steps described above with respect to FIGS. 10A-10E, so only the differences will be described below.

Figures 27A, 27B, 27C, 27D, 27E, 27F, 27G:
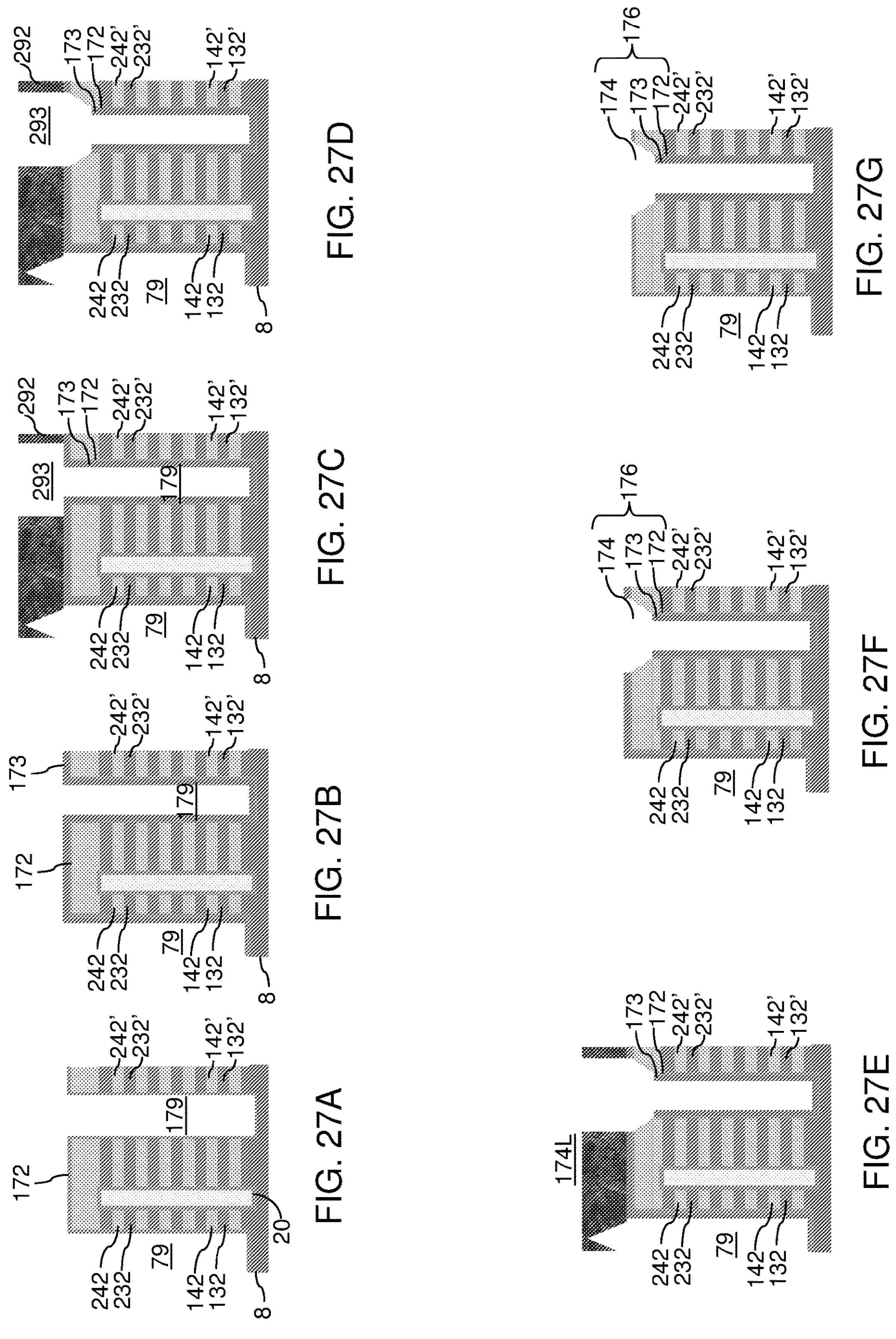
FIGS. 27A-27G are sequential vertical cross-sectional views along line X-X' in FIG. 26B of a region of the exemplary structure during formation of a dielectric moat fill structure according to the alternative embodiment of the present disclosure.

Referring to FIG. 27A, the conformal dielectric liner 172 is simultaneously deposited on sidewalls of the backside trenches 79 and the moat trench 179, on physically exposed surfaces of the in-process source-level material layers 10', and over the top surface of the contact-level dielectric layer 280, as described with respect to FIG. 10A above. In this alternative embodiment, the conformal dielectric liner 172 is also formed in the backside trenches 79, in contrast to the step shown in FIG. 10A.

Referring to FIG. 27B, the second liner 173 is deposited over the conformal dielectric liner 172 in both the backside trenches 79 and the moat trench 179, as described with respect to FIG. 10B above. In this alternative embodiment, the second liner 173 is also formed in the backside trenches 79, in contrast to the step shown in FIG. 10B.

Referring to FIG. 27C, a hard mask film 292 is non-conformally deposited over the top surface of the contact-level dielectric layer 280. The hard mask film 292 is located over but does not fill the backside trenches 79 and the moat trench 179. The hard mask film 292 may comprise any suitable one or more hard mask layers, such as a carbon hard mask layer, for example Advanced Patterning Film ("APF") available from Applied Materials, Inc. Optionally, a dielectric antireflective coating may be formed over the carbon hard mask layer. The hard mask film 292 is then photolithographically patterned to form an opening 293 over the moat trench 179, while the backside trenches remain covered by the hard mask film 292. The opening 293 may be wider than the width of the opening in the moat trench 179.

Referring to FIG. 27D, the etch process described above with respect to FIG. 10C is performed using the hard mask film 292 as a mask to remove portions of the conformal dielectric liner 172 and the second liner 173 exposed in the opening 193 from the upper portion of the moat trench 179. The etch process may also collaterally etch the material of the contact-level dielectric layer 280, as described above with respect to FIG. 10C. The conformal dielectric liner 172 and the second liner 173 remain in the backside trenches 79 and in the lower portion of the moat trench 179.

Referring to FIG. 27E, the dielectric fill material layer 174L is deposited over the hard mask film 292 and over the second liner 173 located in the moat trench 179, as described above with respect to FIG. 10D.

Referring to FIG. 27F, the dielectric fill material layer 174L is etched back using a suitable etching process to form the dielectric fill material portion 174, as described above with respect to FIG. 10E. For example, a buffered hydrofluoric acid etch may be used to etch back a silicon oxide dielectric fill material layer 174L. The silicon nitride second liner 173 and hard mask film 192 protect the remaining portions of the device from being etch during the etch back. The hard mask film 192 is then selectively removed, such as by ashing.

Referring to FIG. 27G, the second liner 173 is then selectively removed from the backside trenches 79 and from above the top surface of the contact-level dielectric layer 280. For example, a silicon nitride second liner 173 may be removed by hot phosphoric acid etching. Portions of the conformal dielectric liner 172 remain in the backside trenches 79 and prevent the sacrificial material layers (142, 242) from being etched during removal of the second liner 173 from the backside trenches 79.

The process of the alternative embodiment then proceeds as in the prior embodiment. For example, the first through-memory-level via cavities 779 are then formed through the vertical alternating sequences of insulating plates (132', 232') and dielectric material plates (142', 242'), as described above with respect to FIGS. 12A-12E.

Referring to all drawings and according to various embodiments of the present disclosure, a semiconductor structure is provided, which comprises: an alternating stack {(132, 146), (232, 246)} of insulating layers (132, 232) and electrically conductive layers (146, 246) that alternate along a vertical direction; a dielectric moat fill structure 176 at least partially laterally surrounded by the alternating stack {(132, 146), (232, 246)} and having an outer sidewall that contacts each of the insulating layers (132, 232) within the alternating stack {(132, 146), (232, 246)}, wherein the dielectric moat fill structure 176 comprises a nested structure including, from outside to inside, an outer dielectric liner 172O having a first Young's modulus, an outer material layer 173O having a second Young's modulus, a dielectric fill material portion 174, an inner material layer 173I having the second Young's modulus, and an inner dielectric liner 172I having the first Young's modulus, wherein the second Young's modulus is greater than the first Young's modulus; a vertically alternating sequence {(132', 142'), (232', 242')} of insulating plates (132', 232') and dielectric material plates (142', 242') at least partially laterally surrounded by the dielectric moat fill structure 176, wherein an inner sidewall of the dielectric moat fill structure 176 contacts each of the insulating plates (132', 232') and each of the dielectric material plates (142', 242') within the vertically alternating sequence {(132', 142'), (232', 242')}; and an interconnection via structure 776 vertically extending through each of the insulating plates (132', 232') and each of the dielectric material plates within the vertically alternating sequence {(132', 142'), (232', 242')}.

In one embodiment, the second Young's modulus is at least two times greater than the first Young's modulus. In one embodiment, the dielectric fill material portion 174 has a third Young's modulus which is smaller than the second Young's modulus.

In one embodiment, the inner dielectric liner 172I and the outer dielectric liner 172O consist essentially of a first dielectric material; and the inner material layer 173I and the outer material layer 173O consist essentially of a second material different from the first dielectric material. In one embodiment, the first dielectric material consists essentially of a silicon oxide material; and the second material consists essentially of a material selected from silicon, silicon nitride or a dielectric metal oxide.

In one embodiment, each of the inner dielectric liner 172I and the outer dielectric liner 172O has a first lateral thickness throughout; and each of the inner material layer 173I and the outer material layer 173O comprises a respective uniform thickness region having a second lateral thickness and extending vertically. In one embodiment, each of the inner material layer 173I and the outer material layer 173O comprises a respective tapered region adjoined to a top end of the respective uniform thickness region and having an increasing thickness that increases from top to bottom.

In one embodiment, the semiconductor structure comprises a contact-level dielectric layer 280 that overlies the alternating stack {(132, 146), (232, 246)} and having a top surface that is located within a same horizontal plane as a top surface of the dielectric moat fill structure 176. In one embodiment, the dielectric fill material portion 174 comprises a tapered flare region in contact with the contact-level dielectric layer 280 and contacting an annular top surface of the inner dielectric liner 172I and contacting an annular top surface of the outer dielectric liner 172O.

In one embodiment, a top portion of the dielectric fill material portion 174 vertically extends above topmost surfaces of the inner dielectric liner 172I, the inner material layer 173I, the outer material layer 173O, and the outer dielectric liner 172O; and a bottom portion of the dielectric fill material portion 174 vertically extends below bottommost surfaces of the inner dielectric liner 172I, the inner material layer 173I, the outer material layer 173O, and the outer dielectric liner 172O.

In one embodiment, the semiconductor structure comprises: memory openings 49 vertically extending through the alternating stack {(132, 146), (232, 246)}; and memory opening fill structures 58 located within the memory openings 49, wherein each of the memory opening fill structures 58 comprises a respective vertical semiconductor channel 60 and a respective vertical stack of memory elements. In one embodiment, the semiconductor structure comprises a source contact layer 114 underlying the alternating stack {(132, 146), (232, 246)}, and contacting the vertical semiconductor channels 60 and drain regions 63 contacting tops of the vertical semiconductor channels 60.

In one embodiment, the semiconductor structure comprises: a semiconductor substrate 8 underlying the alternating stack {(132, 146), (232, 246)}; peripheral (e.g., driver) semiconductor devices 710 located on a top surface of the semiconductor substrate 8; and lower-level metal interconnect structures 780 embedded in lower-level dielectric material layers 760, electrically connected to the peripheral semiconductor devices 710 and overlying the semiconductor substrate 8, and located between the semiconductor substrate 8 and the alternating stack {(132, 146), (232, 246)}.

In one embodiment, the interconnection via structure 776 contacts a top surface of one of the lower-level metal interconnect structures 780. In one embodiment, semiconductor structure comprises a source contact layer 114 located between the lower-level dielectric material layers 760 and the alternating stack {(132, 146), (232, 246)} and comprising an opening therethrough, wherein the interconnection via structure 776 vertically extends through the opening in the source contact layer 114 and is laterally spaced from the source contact layer 114. In one embodiment, each of the outer dielectric liner 172O, the outer material layer 173O, the dielectric fill material portion 174, the inner material layer 173I, and the inner dielectric liner 172I has a respective tubular configuration having a respective contiguous set of at least one inner sidewall and a respective contiguous set of at least one outer sidewall.

In one embodiment, the dielectric moat fill structure 176 is completely laterally surrounded by the alternating stack, and the vertically alternating sequence of insulating plates and dielectric material plates is completely laterally surrounded by the dielectric moat fill structure 176.

The various embodiments of the present disclosure may be employed to increase the rigidity of the dielectric moat fill structures 176 in a three-dimensional memory device, and to reduce deformation of the three-dimensional memory device during manufacture and during operation.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor structure, comprising:

an alternating stack of insulating layers and electrically conductive layers that alternate along a vertical direction;

a dielectric moat fill structure at least partially laterally surrounded by the alternating stack and having an outer sidewall that contacts each of the insulating layers within the alternating stack, wherein the dielectric moat fill structure comprises a nested structure including, from outside to inside, an outer dielectric liner having a first Young's modulus, an outer material layer having a second Young's modulus, a dielectric fill material portion, an inner material layer having the second Young's modulus, and an inner dielectric liner having the first Young's modulus, wherein the second Young's modulus is greater than the first Young's modulus;

a vertically alternating sequence of insulating plates and dielectric material plates at least partially laterally surrounded by the dielectric moat fill structure, wherein an inner sidewall of the dielectric moat fill structure contacts each of the insulating plates and each of the dielectric material plates within the vertically alternating sequence; and an interconnection via structure vertically extending through each of the insulating plates and each of the dielectric material plates within the vertically alternating sequence;

wherein;

each of the inner dielectric liner and the outer dielectric liner has a first lateral thickness throughout;

each of the inner material layer and the outer material layer comprises a respective uniform thickness region having a second lateral thickness and extending vertically; and each of the inner material layer and the outer material layer comprises a respective tapered region adjoined to a top end of the respective uniform thickness region and having an increasing thickness that increases from top to bottom.

2. The semiconductor structure of claim 1, wherein the dielectric fill material portion has a third Young's modulus which is smaller than the second Young's modulus.

3. A semiconductor structure, comprising:

an alternating stack of insulating layers and electrically conductive layers that alternate along a vertical direction;

a dielectric moat fill structure at least partially laterally surrounded by the alternating stack and having an outer sidewall that contacts each of the insulating layers within the alternating stack, wherein the dielectric moat fill structure comprises a nested structure including, from outside to inside, an outer dielectric liner having a first Young's modulus, an outer material layer having a second Young's modulus, a dielectric fill material portion, an inner material layer having the second Young's modulus, and an inner dielectric liner having the first Young's modulus, wherein the second Young's modulus is greater than the first Young's modulus;

a vertically alternating sequence of insulating plates and dielectric material plates at least partially laterally surrounded by the dielectric moat fill structure, wherein an inner sidewall of the dielectric moat fill structure contacts each of the insulating plates and each of the dielectric material plates within the vertically alternating sequence;

an interconnection via structure vertically extending through each of the insulating plates and each of the dielectric material plates within the vertically alternating sequence; and a contact-level dielectric layer that overlies the alternating stack and having a top surface that is located within a same horizontal plane as a top surface of the dielectric moat fill structure, wherein the dielectric fill material portion comprises a tapered flare region in contact with the contact-level dielectric layer and contacting an annular top surface of the inner dielectric liner and contacting an annular top surface of the outer dielectric liner.

4. A semiconductor structure, comprising:

an alternating stack of insulating layers and electrically conductive layers that alternate along a vertical direction;

a dielectric moat fill structure at least partially laterally surrounded by the alternating stack and having an outer sidewall that contacts each of the insulating layers within the alternating stack, wherein the dielectric moat fill structure comprises a nested structure including, from outside to inside, an outer dielectric liner having a first Young's modulus, an outer material layer having a second Young's modulus, a dielectric fill material portion, an inner material layer having the second Young's modulus, and an inner dielectric liner having the first Young's modulus, wherein the second Young's modulus is greater than the first Young's modulus;

a vertically alternating sequence of insulating plates and dielectric material plates at least partially laterally surrounded by the dielectric moat fill structure, wherein an inner sidewall of the dielectric moat fill structure contacts each of the insulating plates and each of the dielectric material plates within the vertically alternating sequence; and an interconnection via structure vertically extending through each of the insulating plates and each of the dielectric material plates within the vertically alternating sequence;

wherein:

a top portion of the dielectric fill material portion vertically extends above topmost surfaces of the inner dielectric liner, the inner material layer, the outer material layer, and the outer dielectric liner; and a bottom portion of the dielectric fill material portion vertically extends below bottommost surfaces of the inner dielectric liner, the inner material layer, the outer material layer, and the outer dielectric liner.

5. The semiconductor structure of claim 4, further comprising:

memory openings vertically extending through the alternating stack; and memory opening fill structures located within the memory openings, wherein each of the memory opening fill structures comprises a respective vertical semiconductor channel and a respective vertical stack of memory elements.

6. The semiconductor structure of claim 5, further comprising:

a source contact layer underlying the alternating stack and contacting the vertical semiconductor channels; and drain regions contacting tops of the vertical semiconductor channels.

7. The semiconductor structure of claim 5, further comprising:

a semiconductor substrate underlying the alternating stack;

peripheral semiconductor devices located on a top surface of the semiconductor substrate; and lower-level metal interconnect structures embedded in lower-level dielectric material layers, electrically connected to the peripheral semiconductor devices and overlying the semiconductor substrate, and located between the semiconductor substrate and the alternating stack.

8. The semiconductor structure of claim 7, wherein the interconnection via structure contacts a top surface of one of the lower-level metal interconnect structures.

9. The semiconductor structure of claim 8, further comprising a source contact layer located between the lower-level dielectric material layers and the alternating stack and comprising an opening therethrough, wherein the interconnection via structure vertically extends through the opening in the source contact layer and is laterally spaced from the source contact layer.

10. The semiconductor structure of claim 9, wherein:

the dielectric moat fill structure is completely laterally surrounded by the alternating stack; and the vertically alternating sequence of insulating plates and dielectric material plates is completely laterally surrounded by the dielectric moat fill structure.

11. A method of forming a semiconductor structure, comprising:

forming an in-process alternating stack of in-process insulating layers and sacrificial material layers comprising a dielectric material that alternate along a vertical direction over a substrate;

forming a moat trench through the in-process alternating stack, wherein portions of the in-process alternating stack that is at least partially laterally surrounded by the moat trench comprise a vertically alternating sequence of insulating plates and dielectric material plates including the dielectric material;

forming a dielectric moat fill structure within the moat trench, wherein the dielectric moat fill structure comprises a nested structure including, from outside to inside, an outer dielectric liner having a first Young's modulus, an outer material layer having a second Young's modulus, a dielectric fill material portion, an inner material layer having the second Young's modulus, and an inner dielectric liner having the first Young's modulus, wherein the second Young's modulus is greater than the first Young's modulus;

replacing portions of the sacrificial material located outside the dielectric moat fill structure with electrically conductive layers to form an alternating stack of insulating layers and electrically conductive layers outside the dielectric moat fill structure;

forming an interconnection via structure through each of the insulating plates and each of the dielectric material plates within the vertically alternating sequence;

forming a conformal dielectric liner on sidewalls of the moat trench;

forming a second liner over the conformal dielectric liner;

etching the second liner and the conformal dielectric liner by performing at least one etch process, wherein remaining portions of the second liner comprise the outer material layer and the inner material layer; and remaining portions of the conformal dielectric liner comprise the outer dielectric liner and the inner dielectric liner; and forming a contact-level dielectric layer over the in-process alternating stack, wherein:

the moat trench is formed through the contact-level dielectric layer; and the at least one etch process removes portions of the second liner and the conformal dielectric liner in an upper region of the moat trench and widens a portion of the moat trench in the upper region of the contact-level dielectric layer over the outer material layer, the inner material layer, the outer dielectric liner, and the inner dielectric liner.

12. The method of claim 11, wherein:

the inner dielectric liner and the outer dielectric liner consist essentially of a first dielectric material having the first Young's modulus; and the inner material layer and the outer material layer consist essentially of a second material having the second Young's modulus that is at least twice the first Young's modulus.

13. The method of claim 11, further comprising:

forming semiconductor devices on a top surface of the substrate;

forming lower-level metal interconnect structures embedded in lower-level dielectric material layers and electrically connected to the semiconductor devices over the substrate to form an in-process alternating stack over the lower-level dielectric material layers;

forming memory openings through the in-process alternating stack outside an area of the moat trench; and forming memory opening fill structures in the memory openings, wherein each of the memory opening fill structures comprises a respective vertical semiconductor channel and a respective vertical stack of memory elements.

* * * * *